(12) United States Patent
Yokoyama

(10) Patent No.: US 10,002,907 B2
(45) Date of Patent: *Jun. 19, 2018

(54) SEMICONDUCTOR DEVICE AND METHOD OF MANUFACTURING SAME

(71) Applicant: Sony Corporation, Tokyo (JP)

(72) Inventor: Takashi Yokoyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/591,845

(22) Filed: May 10, 2017

(65) Prior Publication Data

US 2017/0243920 A1    Aug. 24, 2017

Related U.S. Application Data

(63) Continuation of application No. 14/847,699, filed on Sep. 8, 2015, now Pat. No. 9,698,199, which is a (Continued)

(30) Foreign Application Priority Data

May 8, 2013  (JP) .................................. 2013-098525

(51) Int. Cl.
*H01L 27/24* (2006.01)
*H01L 43/02* (2006.01)
(Continued)

(52) U.S. Cl.
CPC .. *H01L 27/2436* (2013.01); *H01L 21/823431* (2013.01); *H01L 21/84* (2013.01);
(Continued)

(58) Field of Classification Search
None
See application file for complete search history.

(56) References Cited

U.S. PATENT DOCUMENTS 7,606,055 B2   10/2009  Liu
8,203,175 B2 *  6/2012  Kuroda ................... H01L 21/74
                                                  257/295
(Continued)

FOREIGN PATENT DOCUMENTS

JP          2010-171166          8/2010

OTHER PUBLICATIONS

Kim, Kinam. "From the Future Si Technology Perspective: Challenges and Opportunities." 2010 International Electron Devices Meeting, 2010, doi:10.1109/iedm.2010.5703274.*

(Continued)

*Primary Examiner* — Joseph Schoenholtz
(74) *Attorney, Agent, or Firm* — Dentons US LLP

(57) ABSTRACT

A semiconductor device including a transistor on a main surface side of a semiconductor substrate; and a resistance change element on a back-surface side of the semiconductor substrate, wherein the transistor includes a low-resistance section in the semiconductor substrate, the low-resistance section extending to the back surface of the semiconductor substrate, an insulating film is provided in contact with a back surface of the low-resistance section, the insulating film has an opening facing the low-resistance section, and the resistance change element is connected to the low-resistance section through the opening.

16 Claims, 69 Drawing Sheets

Related U.S. Application Data continuation of application No. 14/268,774, filed on May 2, 2014, now Pat. No. 9,171,887.

(51) Int. Cl.
  *H01L 45/00*      (2006.01)
  *H01L 27/22*      (2006.01)
  *H01L 27/12*      (2006.01)
  *H01L 21/8234*    (2006.01)
  *H01L 21/84*      (2006.01)

(52) U.S. Cl.
  CPC ............ *H01L 21/845* (2013.01); *H01L 27/12* (2013.01); *H01L 27/228* (2013.01); *H01L 43/02* (2013.01); *H01L 45/085* (2013.01); *H01L 45/1233* (2013.01); *H01L 45/146* (2013.01); *H01L 45/145* (2013.01)

(56) References Cited

U.S. PATENT DOCUMENTS

| | | | |
|---|---|---|---|
| 9,171,887 B2 * | 10/2015 | Yokoyama | H01L 21/823431 |
| 2007/0268742 A1 | 11/2007 | Liu | |
| 2008/0277642 A1 | 11/2008 | Zandt et al. | |
| 2010/0181547 A1 | 7/2010 | Kuroda | |
| 2012/0056146 A1 | 3/2012 | Liu et al. | |
| 2014/0332749 A1 * | 11/2014 | Yokoyama | H01L 21/823431 257/4 |
| 2015/0380463 A1 | 12/2015 | Yokoyama | |

OTHER PUBLICATIONS

Singh, D., et al. "Optimization of Underlap Length for DGMOSFET and FinFET." Procedia Computer Science, vol. 57, 2015, pp. 448-453., doi:10.1016/j.procs.2015.07.519.*

Zhou, Ping, et al., "A Durable and Energy Efficient Main Memory Using Phase Change Memory Technology," Proceedings of the 36th Annual International Symposium on Computer Architecture—ISCA '09 (2009).

Zhao, Bo, et al., "Common-source-line Array," ACM Transactions on Design Automation of Electronic System, ACM Trans. Des. Autom. Electron. Syst. TODAES, 18.4 (2013): 1-18.

* cited by examiner

ERASE STATE

WRITE DTATE

ERASING-VOLTAGE
APPLICATION TIME

ERASE STATE

SEMICONDUCTOR DEVICE AND METHOD OF MANUFACTURING SAME

CROSS REFERENCE TO RELATED APPLICATIONS

This application is a continuation of U.S. patent application Ser. No. 14/847,699 filed Sep. 8, 2015, which is a continuation of U.S. patent application Ser. No. 14/268,774 filed May 2, 2014, now U.S. Pat. No. 9,171,887 issued Oct. 27, 2015, the entireties of which are incorporated herein by reference to the extent permitted by law. This application contains subject matter related to and claims the benefit of Japanese Priority Patent Application JP2013-098525 filed May 8, 2013, the entire contents of which are incorporated herein by reference.

BACKGROUND

The present disclosure relates to a semiconductor device and a method of manufacturing the same.

A contact electrode connected to a source-drain region of a transistor is usually provided on a main surface side of a substrate on which the transistor is formed. However, in recent years, it has been attempted to dispose the contact electrode on a back-surface side of the substrate. For example, Japanese Unexamined Patent Application Publication No. 2010-171166 (JP2010-171166A, see FIGS. 6 and 7, etc.) has discussed as follows. According to this document, while a diffusion layer and a silicide layer of a main element are formed on a surface side of a silicon (Si) substrate, a back-surface contact electrode is disposed to extend from a back-surface side of the substrate. The back-surface contact electrode is connected to the silicide layer by passing through the diffusion layer.

SUMMARY

In JP2010-171166A, the back-surface contact electrode is formed to have a height corresponding to the sum of a thickness of the substrate and a thickness of the diffusion layer. Therefore, there is a limit to a reduction in resistance of the back-surface contact electrode, and there is still room for improvement in terms of a reduction in connection resistance.

It is desirable to provide a semiconductor device capable of reducing connection resistance, and a method of manufacturing the semiconductor device.

According to an embodiment of the present disclosure, there is provided a first semiconductor device including: a transistor on a main surface side of a semiconductor substrate; and a resistance change element on a back-surface side of the semiconductor substrate, wherein the transistor includes a low-resistance section in the semiconductor substrate, the low-resistance section extending to the back surface of the semiconductor substrate, an insulating film is provided in contact with a back surface of the low-resistance section, the insulating film has an opening facing the low-resistance section, and the resistance change element is connected to the low-resistance section through the opening.

Here, the "resistance change element" is a generic term for memory elements that store information by a change of a resistance state. Examples of the resistance change element may include magnetoresistive random access memory (MRAM), and resistive random access memory (ReRAM). Examples of the resistance change element may further include such a memory element that a memory layer, in which an ion source layer and a resistance change layer are laminated, is provided between two electrodes, and information is written utilizing a change in electrical properties (a resistance change) of the resistance change layer.

In the first semiconductor device according to the above-described embodiment of the present disclosure, the resistance change element is connected to the low-resistance section of the transistor, through the opening of the insulating film. Therefore, connection resistance between the resistance change element and the transistor is reduced.

According to an embodiment of the present disclosure, there is provided a second semiconductor device including a transistor; and a resistance change element provided on a back-surface side of the transistor, wherein the transistor includes a fin and a metal wiring, the fin being extended in a first direction, and the metal wiring covering a surface except a back surface of the fin and being extended in a second direction different from the first direction, an insulating film is provided in contact with a back surface of the metal wiring, the insulating film has an opening facing the metal wiring, and the resistance change element is connected to the metal wiring through the opening.

In the second semiconductor device according to the above-described embodiment of the present disclosure, the resistance change element is connected to the metal wiring of the transistor, through the opening of the insulating film. Therefore, connection resistance between the resistance change element and the transistor is reduced.

According to an embodiment of the present disclosure, there is provided a third semiconductor device including a transistor on a main surface side of a semiconductor substrate; and a conductive connection section on a back-surface side of the semiconductor substrate, wherein the transistor includes a low-resistance section in the semiconductor substrate, the low-resistance section extending to the back surface of the semiconductor substrate, an insulating film is provided in contact with a back surface of the low-resistance section, the insulating film has an opening facing the low-resistance section, and the conductive connection section is connected to the low-resistance section through the opening.

In the third semiconductor device according to the above-described embodiment of the present disclosure, the conductive connection section is connected to the low-resistance section of the transistor, through the opening of the insulating film. Therefore, connection resistance between the conductive connection section and the transistor is reduced.

According to an embodiment of the present disclosure, there is provided a fourth semiconductor device including a transistor; and a conductive connection section provided on a back-surface side of the transistor, wherein the transistor includes a fin extended in a first direction, and a metal wiring extended in a second direction different from the first direction, the metal wiring covering a surface except a back surface of the fin, an insulating film is provided in contact with a back surface of the metal wiring, the insulating film has an opening facing the metal wiring, and the conductive connection section is connected to the metal wiring through the opening.

In the fourth semiconductor device according to the above-described embodiment of the present disclosure, the conductive connection section is connected to the metal wiring of the transistor, through the opening of the insulating film. Therefore, connection resistance between the conductive connection section and the transistor is reduced.

According to an embodiment of the present disclosure, there is provided a first method of manufacturing a semiconductor device, the method including the following (A) to (E).
(A) Forming a transistor on a main surface side of a semiconductor substrate, and forming, in the semiconductor substrate, a low-resistance section of the transistor.
(B) Polishing the semiconductor substrate from a back-surface side, and stopping the polishing at the low-resistance section.
(C) Forming an insulating film to be in contact with a back surface of the low-resistance section.
(D) Providing an opening in the insulating film, to face the low-resistance section.
(E) Forming a resistance change element to be connected to the low-resistance section through the opening.

According to an embodiment of the present disclosure, there is provided a second method of manufacturing a semiconductor device, the method including the following (A) to (E).
(A) Forming a transistor on a main surface side of a semiconductor substrate, the transistor including a fin and a metal wiring, the fin being extended in a first direction, the metal wiring covering a surface except a back surface of the fin and being extended in a second direction different from the first direction.
(B) Polishing the semiconductor substrate from a back-surface side.
(C) Forming an insulating film to be in contact with a back surface of the metal wiring.
(D) Providing an opening in the insulating film, to face the metal wiring.
(E) Forming a resistance change element to be connected to the metal wiring through the opening.

According to the first semiconductor device of the above-described embodiment of the present disclosure, the resistance change element is connected to the low-resistance section of the transistor, through the opening of the insulating film. Therefore, connection resistance between the resistance change element and the transistor is allowed to be reduced.

According to the second semiconductor device of the above-described embodiment of the present disclosure, the resistance change element is connected to the metal wiring of the transistor, through the opening of the insulating film. Therefore, connection resistance between the resistance change element and the transistor is allowed to be reduced.

According to the third semiconductor device of the above-described embodiment of the present disclosure, the conductive connection section is connected to the low-resistance section of the transistor, through the opening of the insulating film. Therefore, connection resistance between the conductive connection section and the transistor is allowed to be reduced.

According to the fourth semiconductor device of the above-described embodiment of the present disclosure, the conductive connection section is connected to the metal wiring of the transistor, through the opening of the insulating film. Therefore, connection resistance between the conductive connection section and the transistor is allowed to be reduced.

According to the first method of manufacturing the semiconductor device of the above-described embodiment of the present disclosure, the transistor is formed on the main surface side of the semiconductor substrate, and the low-resistance section of the transistor is formed in the semiconductor substrate. The semiconductor substrate is then polished from the back-surface side, and the polishing is stopped at the low-resistance section. Subsequently, the insulating film is formed to be in contact with the back surface of the low-resistance section and then, the opening is provided in the insulating film, to face the low-resistance section. Afterwards, the resistance change element is formed to be connected to the low-resistance section through the opening. Therefore, connection resistance between the resistance change element and the transistor is allowed to be reduced.

According to the second method of manufacturing the semiconductor device of the above-described embodiment of the present disclosure, the transistor having the fin and the metal wire is formed on the back-surface side of the semiconductor substrate. The semiconductor substrate is then polished from the back-surface side. Subsequently, the insulating film is formed to be in contact with the metal wiring and then, the opening is provided in the insulating film, to face the metal wiring. Afterwards, the resistance change element is formed to be connected to the metal wiring through the opening. Therefore, connection resistance between the conductive connection section and the transistor is allowed to be reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

Figure 1:
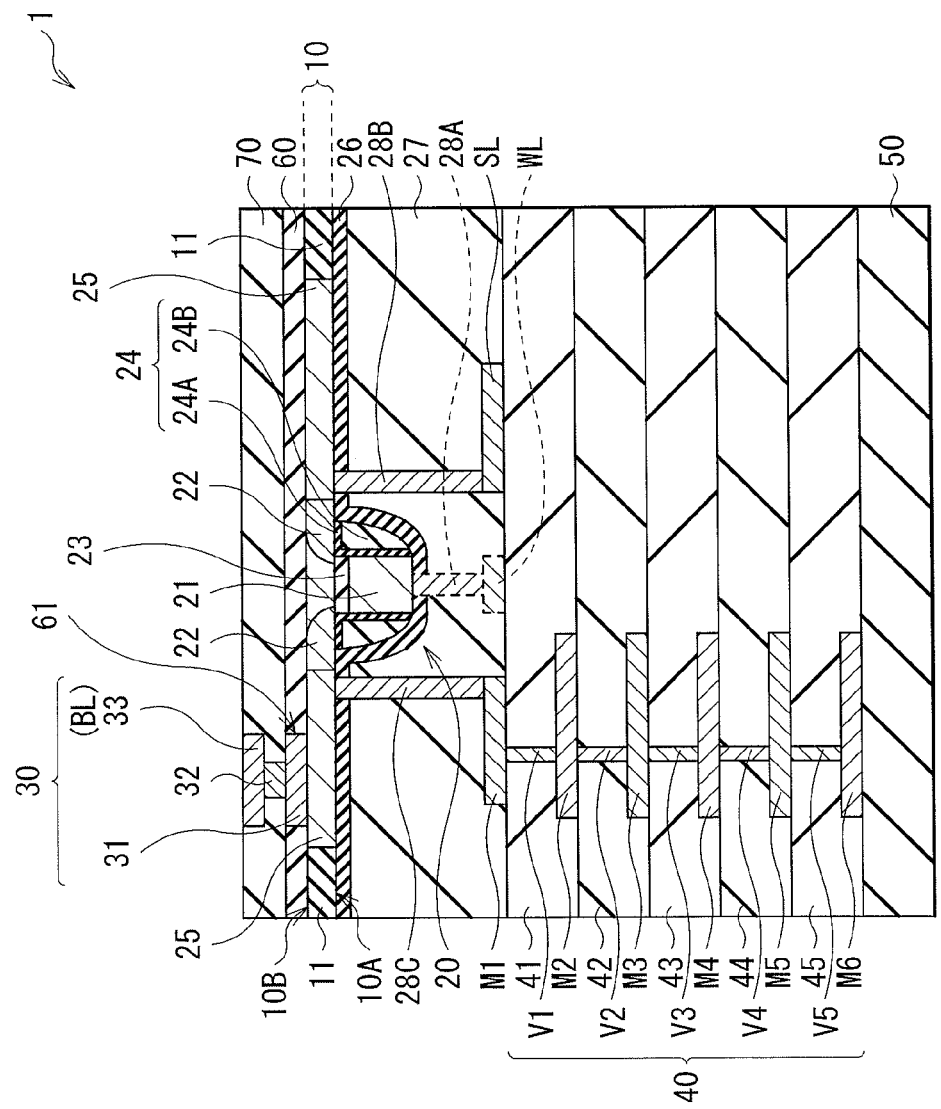
FIG. 1 is a cross-sectional diagram illustrating a configuration of a semiconductor device according to a first embodiment of the present disclosure.

Some embodiments of the present disclosure will be described below in detail, with reference to the drawings. It is to be noted that the description will be provided in the following order.

1. First embodiment (a semiconductor device: an example in which a planar-type transistor is provided on a main surface side of a semiconductor substrate, and a MTJ element is provided on a back-surface side as a resistance change element)

2. Second embodiment (a semiconductor device: an example in which a first electrode of a resistance change element is connected to a low-resistance section by a conductive connection section embedded in an opening of an insulating film)

3. Third embodiment (a semiconductor device: an example in which a memory section of a resistance change element is embedded in an opening of an insulating film, and connected to a low-resistance section)

4. Fourth embodiment (a semiconductor device: an example of having a base unit in which an MTJ element is connected to each of two transistors connected in series)

5. Modification 1 (a method of manufacturing a semiconductor device: an example of performing polishing divided into two stages)
6. Modification 2 (a method of manufacturing a semiconductor device: an example in which a SOI substrate is used, and an embedded oxide film is left)
7. Modification 3 (a method of manufacturing a semiconductor device: an example in which a SOI substrate is used, and an embedded oxide film is removed)
8. Fifth embodiment (a semiconductor device: an example in which a Fin FET is provided as a transistor)
9. Modification 4 (a method of manufacturing a semiconductor device: an example in which a bulk substrate is used, and a STI element separating layer is left)
10. Modification 5 (a method of manufacturing a semiconductor device: an example in which a bulk substrate is used, and an STI element separating layer is not left)
11. Sixth embodiment (a semiconductor device: an example in which a memory section of a resistance change element is embedded in a first opening of an insulating film, and connected to a low-resistance section
12. Seventh embodiment (a semiconductor device: an example in which a first electrode of a resistance change element is connected to a low-resistance section by a conductive connection section embedded in a first opening of an insulating film)
13. Eighth embodiment (a semiconductor device: an example of using a try-gate transistor)
14. Ninth embodiment (a semiconductor device: an example of using a nano-wire transistor)
15. Tenth embodiment (a semiconductor device: an example in which a depth of a fin is increased)
16. Eleventh embodiment (a semiconductor device: an example of using a p-type Fin FET)
17. Twelfth embodiment (a semiconductor device: an example of using a compound semiconductor Fin FET)
18. Thirteenth embodiment (a semiconductor device: an example of providing a multilayer including resistance change elements)
19. Fourteenth embodiment (a semiconductor device: another example of providing a multilayer including resistance change elements)
20. Fifteenth embodiment (a semiconductor device: an example in which a planar-type transistor is provided, a second electrode of a resistance change element is connected to a first end of a back-surface-side multilayer wiring section, and a second end of the back-surface-side multilayer wiring section is embedded in another opening of an insulating film and directly connect to another low-resistance section)
21. Sixteenth embodiment (a semiconductor device: an example in which a multigate transistor is provided, a second electrode of a resistance change element is connected to a first end of a back-surface-side multilayer wiring section, and a second end of the back-surface-side multilayer wiring section is embedded in another opening of an insulating film and directly connect to another low-resistance section)
22. Seventeenth embodiment (a semiconductor device: an example in which a planar-type transistor is provided on a main surface side of the semiconductor substrate, and a conductive connection section is provided on a back-surface side)
23. Eighteenth embodiment (a semiconductor device: an example in which a conductive connection section is provided on a back-surface side of a Fin FET)
24. Nineteenth embodiment (a semiconductor device: an example in which a resistance change element includes an ion source layer and a resistance change layer, as a memory section)

First Embodiment

FIG. 1 illustrates a cross-sectional configuration of a semiconductor device 1 according to a first embodiment of the present disclosure. The semiconductor device 1 may include, for example, a transistor 20 and a resistance change element 30. The transistor 20 is provided on a main surface (a surface) 10A side of a semiconductor substrate 10, and the resistance change element 30 is provided on a back surface 10B side of the semiconductor substrate 10.

The semiconductor substrate 10 may be a substrate made of single crystal silicon. The semiconductor substrate 10 is provided with a plurality of element separating layers 11 by shallow trench isolation (STI). The element separating layers 11 may each be, for example, an insulating film made of a silicon oxide film ($SiO_2$).

The transistor 20 is a select transistor of the resistance change element 30, and may be, for example, a planar-type transistor having a gate electrode 21 and a pair of diffusion layers 22 respectively becoming a source region and a drain region. The gate electrode 21 also serves as a word line WL of the resistance change element 30.

The gate electrode 21 is provided on the main surface 10A side of the semiconductor substrate 10. Between the gate electrode 21 and the semiconductor substrate 10, a gate insulating film 23 made of a silicon oxide film or the like is provided. On a side face of the gate electrode 21, a side wall 24 is provided. The side wall 24 may be, for example, made of a laminated film including a silicon oxide film 24A and a silicon nitride film 24B. The word line WL is connected to the gate electrode 21.

The pair of diffusion layers 22 are provided in a region surrounded by the element separating layers 11 next to each other, in the semiconductor substrate 10. A part of the diffusion layer 22 is provided with a silicide layer 25 made of metal silicide such as nickel silicide (NiSi) and cobalt silicide (CoSi). The silicide layer 25 reduces contact resistance between contact plugs 28A to 28C to be described later and the diffusion layer 22. The silicide layer 25 is provided in a full thickness direction of the semiconductor substrate 10, and extended from the main surface 10A to the back surface 10B.

Here, the silicide layer 25 corresponds to a specific but not limitative example of "low-resistance section" according to embodiments of the present disclosure.

A select line SL is connected to the diffusion layer 22 that becomes the drain region. A first metal layer M1 and a main-surface-side multilayer wiring section 40 are connected to the diffusion layer 22 that becomes the source region.

The word line WL is connected to the gate electrode 21 by the contact plug 28A. The select line SL and the first metal layer M1 are connected to the silicide layers 25 by the contact plugs 28B and 28C, respectively. The contact plugs 28A, 28B, and 28C pass through interlayer insulating films 26 and 27 covering the transistor 20.

The main-surface-side multilayer wiring section 40 is connected to the diffusion layer 22 that becomes the source region, through the first metal layer M1. The main-surface-side multilayer wiring section 40 may include, for example, an interlayer insulating film 41, a second metal layer M2, an interlayer insulating film 42, a third metal layer M3, an interlayer insulating film 43, a fourth metal layer M4, an interlayer insulating film 44, a fifth metal layer M5, an interlayer insulating film 45, and a sixth metal layer M6, in this order from a side close to the transistor 20. The first metal layer M1 and the second metal layer M2 are connected by a first via V1 passing through the interlayer insulating film 41. The second metal layer M2 and the third metal layer M3 are connected by a second via V2 passing through the interlayer insulating film 42. The third metal layer M3 and the fourth metal layer M4 are connected by a third via V3 passing through the interlayer insulating film 43. The fourth metal layer M4 and the fifth metal layer M5 are connected by a fourth via V4 passing through the interlayer insulating film 44. The fifth metal layer M5 and the sixth metal layer M6 are connected by a fifth via V5 passing through the interlayer insulating film 45. It is to be noted that the main-surface-side multilayer wiring section 40 has a configuration illustrated in FIG. 1 as an example, and is, of course, not limited thereto.

A supporting substrate 50 is connected to the main-surface-side multilayer wiring section 40. The supporting substrate 50 may be, for example, a substrate made of single crystal silicon. The material of the supporting substrate 50 is not limited in particular. The supporting substrate 50 may be a substrate made of any other material such as $SiO_2$ and glass, than the single crystal silicon.

Further, in the semiconductor device 1, an insulating film 60 is provided in contact with a back surface of the silicide layer 25. The insulating film 60 has an opening 61 facing the silicide layer 25, and the resistance change element 30 is connected to the silicide layer 25 through the opening 61. Therefore, in the semiconductor device 1, it is possible to reduce connection resistance.

The insulating film 60 may be configured using, for example, a High-K (high dielectric) film (any of Hf oxide; $Al_2O_3$; Ru oxide; Ta oxide; Si-containing oxide of Al, Ru, Ta, and HF; Si-containing nitride of Al, Ru, Ta, and HF; and Si-containing oxynitride of Al, Ru, Ta, and Hf) capable of being formed at a low temperature. Further, the insulating film 60 may be configured using any of Si oxide, Si nitride, and Si oxynitride.

The resistance change element 30 may include, for example, a first electrode 31, a memory section 32, and a second electrode 33 (a bit line BL) in this order from a side close to the back surface 10B of the semiconductor substrate 10. Preferably, the first electrode 31 may be embedded in the opening 61 and connected to the silicide layer 25. This is to allow a reduction in the connection resistance further, by bringing the first electrode 31 and the silicide layer 25 into direct contact with each other to establish connection therebetween. In this case, the insulating film 60 has the same thickness as that of the first electrode 31.

Around the memory section 32 and the second electrode 33, a back-surface interlayer film 70 is provided. A material of the back-surface interlayer film 70 may be, for example, $SiO_2$ or a Low-K (low dielectric) film, and is not limited in particular.

The resistance change element 30 may be, preferably, a spin transfer torque-magnetic tunnel junction (STT-MTJ) that stores information by reversing a direction of magnetization of a memory layer to be described later, by spin injection. The STT-MTJ allows high-speed writing and reading, and is regarded as a nonvolatile memory expected to replace a volatile memory.

The first electrode 31 and the second electrode 33 may each be configured using, for example, a metal layer made of metal such as Cu, Ti, W, and Ru. The first electrode 31 and the second electrode 33 may be preferably configured using mainly any of Cu, Al, and W, which is metal other than a material of a primary layer 32A or a cap layer 32E to be described later. Further, the first electrode 31 and the second electrode 33 may also be configured using any of Ti, TiN, Ta, TaN, W, Cu, and Al, as well as a laminated structure of these elements.

Figure 2:
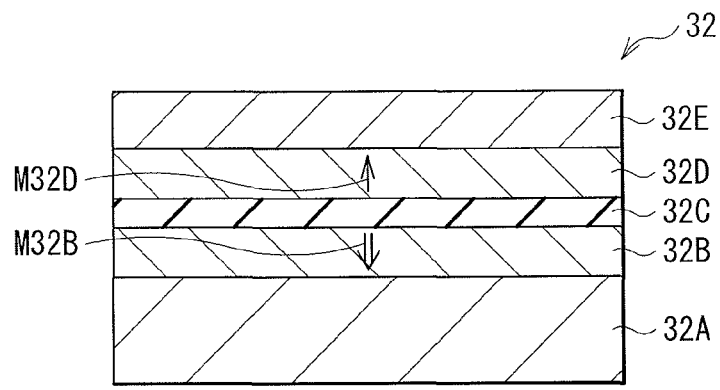
FIG. 2 is a cross-sectional diagram illustrating an example of a configuration of a memory section in a resistance change element illustrated in FIG. 1.

FIG. 2 illustrates an example of a configuration of the memory section 32. The memory section 32 may have, for example, a configuration in which the primary layer 32A, a magnetization fixed layer 32B, an insulating layer 32C, and a memory layer 32D, and the cap layer 32E are laminated in this order from a side close to a back surface of the semiconductor substrate 10. In other words, the resistance change element 30 has a bottom-pinned structure in which the magnetization fixed layer 32B, the insulating layer 32C, and the memory layer 32D are provided in this order from a bottom to a top in a lamination direction. Information is stored by changing a direction of magnetization M32D of the memory layer 32D having uniaxial anisotropy. By a relative angle (parallel or antiparallel) between the magnetization M32D of the memory layer 32D and magnetization M32B of the magnetization fixed layer 32B, "0" or "1" of the information is defined.

The primary layer 32A and the cap layer 32E are configured using a metal film made of metal such as Ta and Ru, or a laminated film of these elements.

The magnetization fixed layer 32B is a base of memory information (a magnetization direction) of the memory layer 32D. The magnetization fixed layer 32B is configured using a ferromagnetic substance having magnetic moment in which a direction of the magnetization M32B is fixed in a film-surface vertical direction. The magnetization fixed layer 32B may be configured using, for example, Co—Fe—B.

A change in the direction of the magnetization M32B of the magnetization fixed layer 32B by writing or reading may be undesirable, but may not be necessarily fixed in a specific direction. It is also possible to make the direction of the magnetization M32B move less easily than that of the memory layer 32D, by increasing a coercive force, a film thickness, or a magnetic damping constant than that of the memory layer 32D. When the direction of the magnetization M32B is fixed, an antiferromagnic substance such as PtMn and IrMn may be brought into contact with the magnetization fixed layer 32B, or the magnetization fixed layer 32B may be indirectly fixed by magnetically coupling a magnetic substance in contact with the antiferromagnetic substance, through a nonmagnetic substance such as Ru.

The insulating layer 32C is an intermediate layer that becomes a tunnel barrier layer (a tunnel insulating layer), and may be configured using, for example, aluminum oxide or magnesium oxide (MgO). Above all, the insulating layer 32C may be preferably configured using the magnesium oxide. This makes it possible to increase a magneto-resistive change rate (a MR ratio). Therefore, it is possible to reduce a current density used to reverse the direction of the magnetization M32D of the memory layer 32D, by improving efficiency of spin injection.

The memory layer 32D is configured using a ferromagnetic substance having magnetic moment in which the direction of the magnetization M32D is freely changed to the film-surface vertical direction. The memory layer 32D may be configured using, for example, Co—Fe—B.

Figure 3:
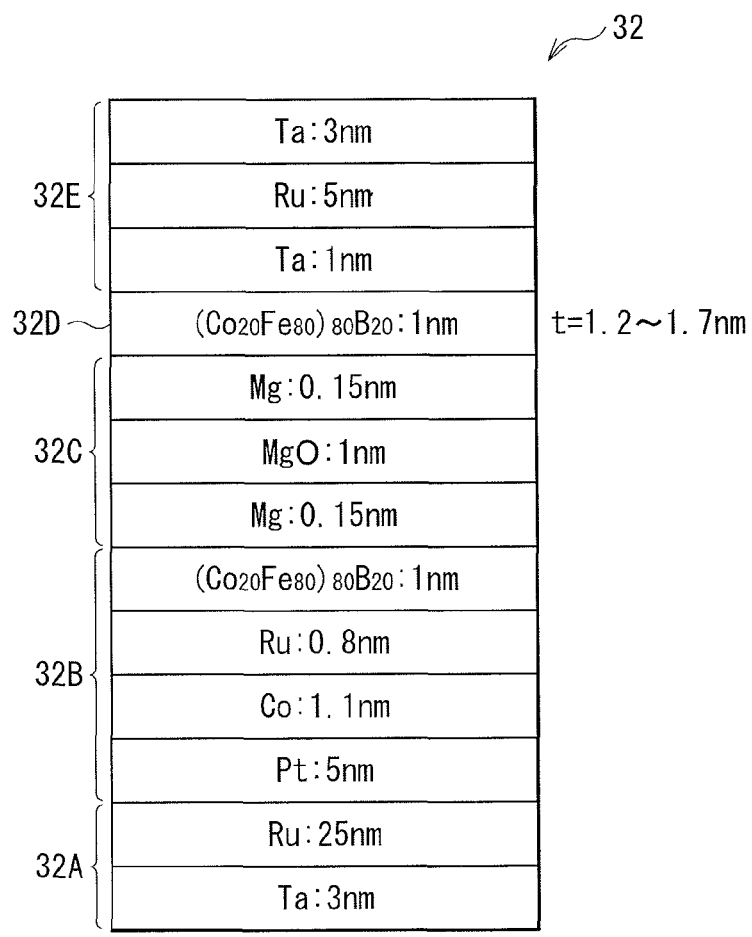
FIG. 3 is a cross-sectional diagram illustrating an example of a configuration of each layer of the memory section illustrated in FIG. 2.

FIG. 3 illustrates an example of a configuration of each layer of the memory section 32 in more detail. The primary layer 32A may have, for example, a configuration in which a Ta layer having a thickness of 3 nm and a Ru film having a thickness of 25 nm are laminated in this order from a side close to the first electrode 31. The magnetization fixed layer 32B may have, for example, a configuration in which a Pt layer having a thickness of 5 nm, a Co layer having a thickness of 1.1 nm, a Ru layer having a thickness of 0.8 nm, and a $(Co_{20}Fe_{80})_{80}B_{20}$ layer having a thickness of 1 nm are laminated in this order from a side close to the first electrode 31. The insulating layer 32C may have, for example, a configuration in which an Mg layer having a thickness of 0.15 nm, an MgO layer having a thickness of 1 nm, and an Mg layer having a thickness of 0.15 nm in this order from a side close to the first electrode 31. The memory layer 32D may have, for example, a thickness of 1.2 nm to 1.7 nm, and be configured using a $(Co_{20}Fe_{80})_{80}B_{20}$ layer. The cap layer 32E may have, for example, a configuration in which a Ta layer having a thickness of 1 nm, a Ru layer having a thickness 5 nm, and a Ta layer having a thickness of 3 nm in this order from a side close to the first electrode 31.

The semiconductor device 1 may be manufactured as follows, for example.

FIGS. 4 to 11 illustrate a method of manufacturing the semiconductor device 1, in process order. First, the semiconductor substrate 10 made of the above-described material is prepared, and a large scale integrated circuit (LSI) is formed on the main surface 10A side of the semiconductor substrate 10, by a typical manufacturing process. In a case of a logic LSI, a multilayered wiring layer of nine or more layers is usually formed. It is to be noted that FIGS. 4 to 11 mainly illustrate a logic LSI structure, but an existing element such as an existing dynamic random access memory (DRAM) may be incorporated.

Figure 4:
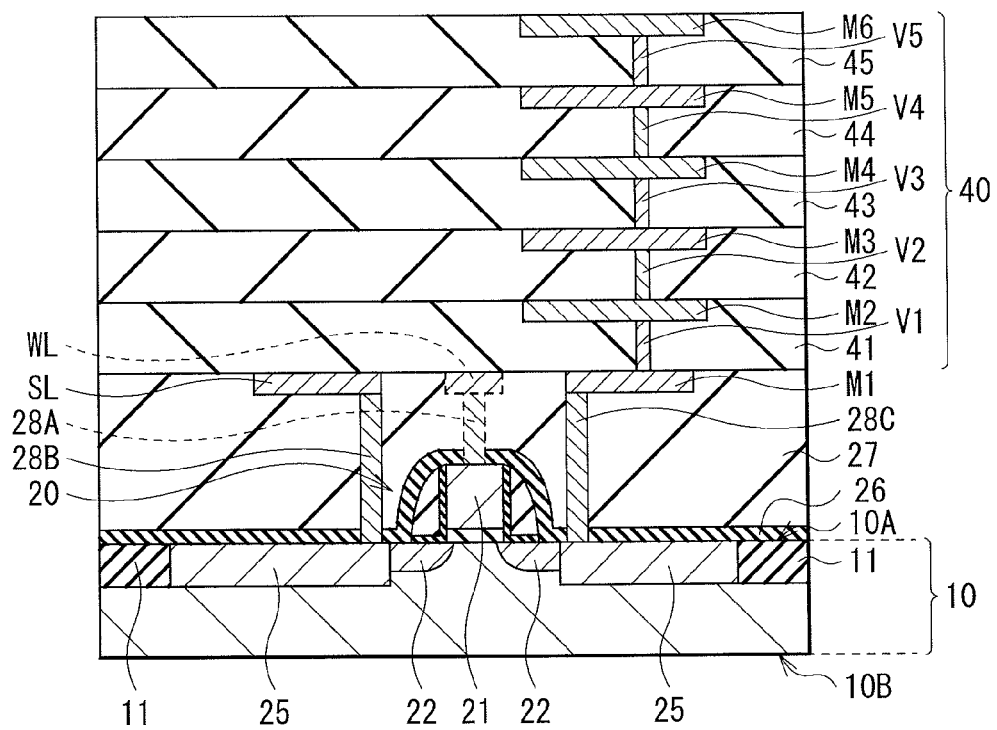
FIG. 4 is a cross-sectional diagram illustrating a process of a method of manufacturing the semiconductor device illustrated in FIG. 1.

To be more specific, as illustrated in FIG. 4, for example, the element separating layers 11 by STI may be formed on the main surface 10A side of the semiconductor substrate 10. In a region surrounded by the element separating layers 11 of the semiconductor substrate 10, the transistor 20 including the gate electrode 21 and the pair of diffusion layers 22 is fabricated. In a part of each of the diffusion layers 22, the silicide layer 25 is formed. The interlayer insulating films 26 and 27 are formed to cover the transistor 20. The word line WL is connected to the gate electrode 21, and the select line SL as well as the first metal layer M1 are each connected to the silicide layer 25. The main-surface-side multilayer wiring section 40 is formed on the interlayer insulating film 27, and the first metal layer M1 and the main-surface-side multilayer wiring section 40 are connected.

Figure 5:
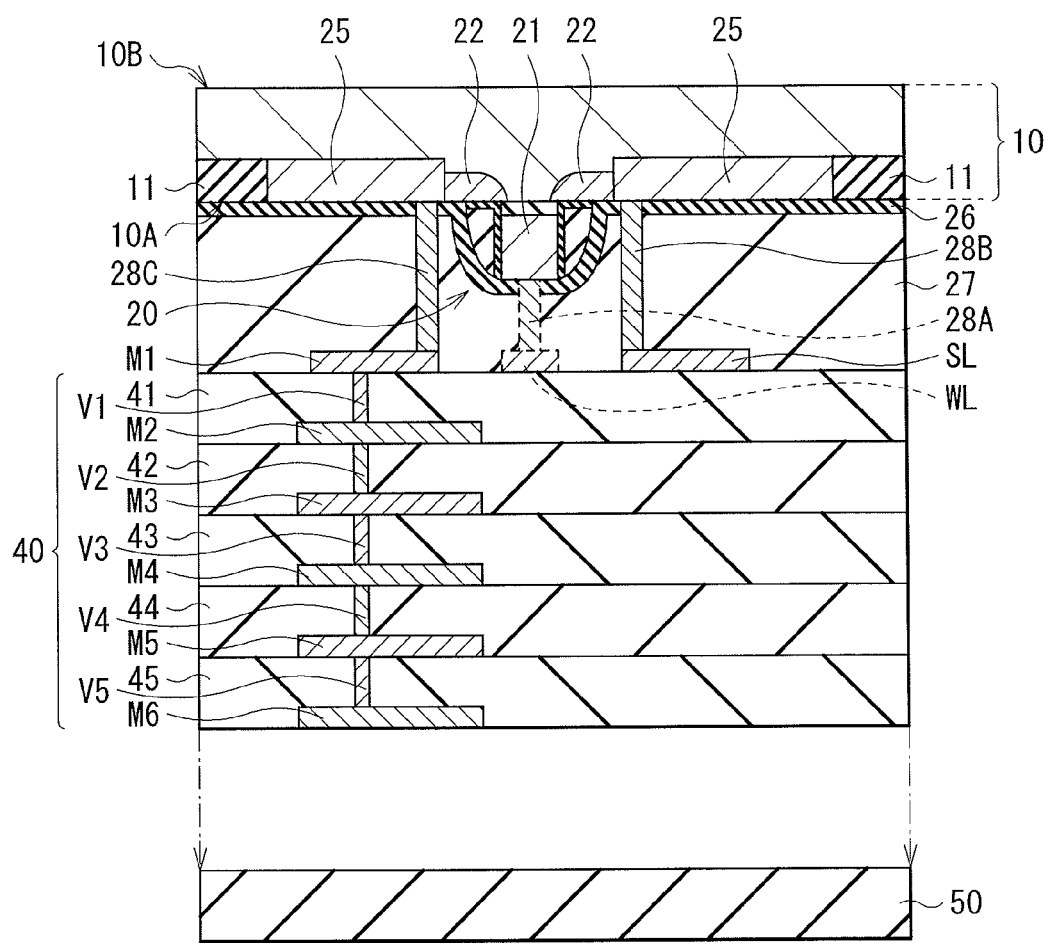
FIG. 5 is a cross-sectional diagram illustrating a process following the process in FIG. 4.

Next, as illustrated in FIG. 5, the semiconductor substrate 10 is reversed, and the supporting substrate 50 is adhered on the main surface 10A side of the semiconductor substrate 10 at a low temperature by using a plasma technique or the like. At this moment, the transistor 20 and the main-surface-side multilayer wiring section 40 are upside down.

Figure 6:
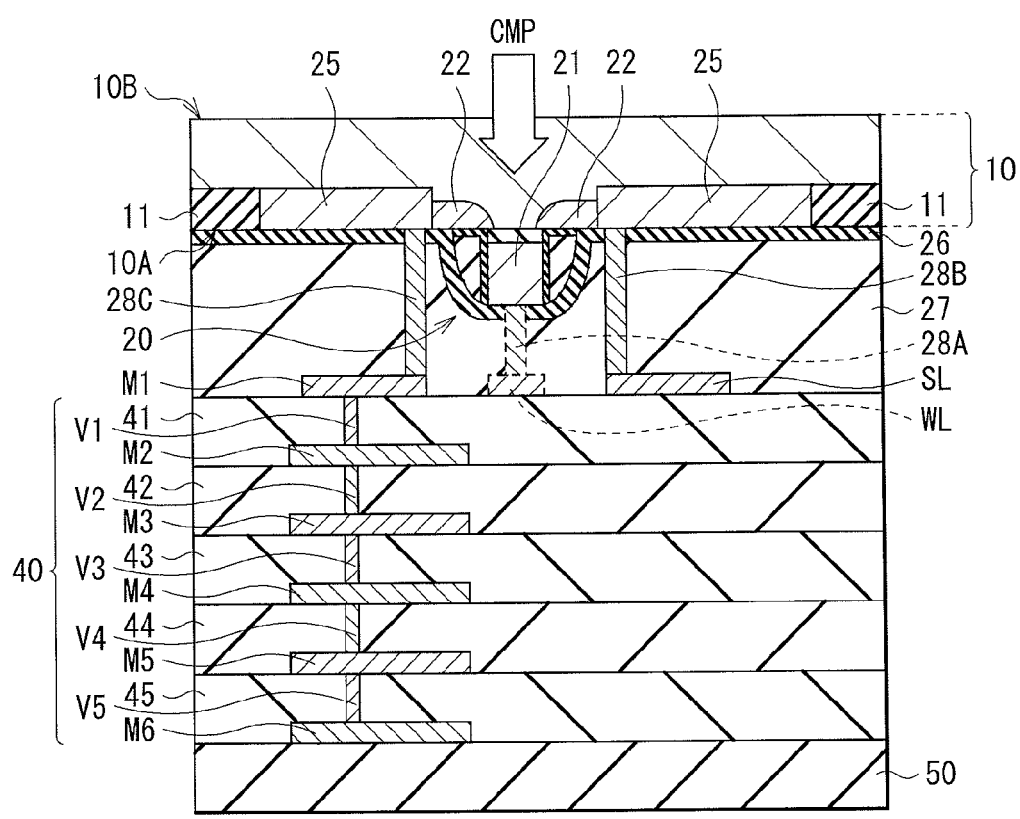
FIG. 6 is a cross-sectional diagram illustrating a process following the process in FIG. 5.
Figure 7:
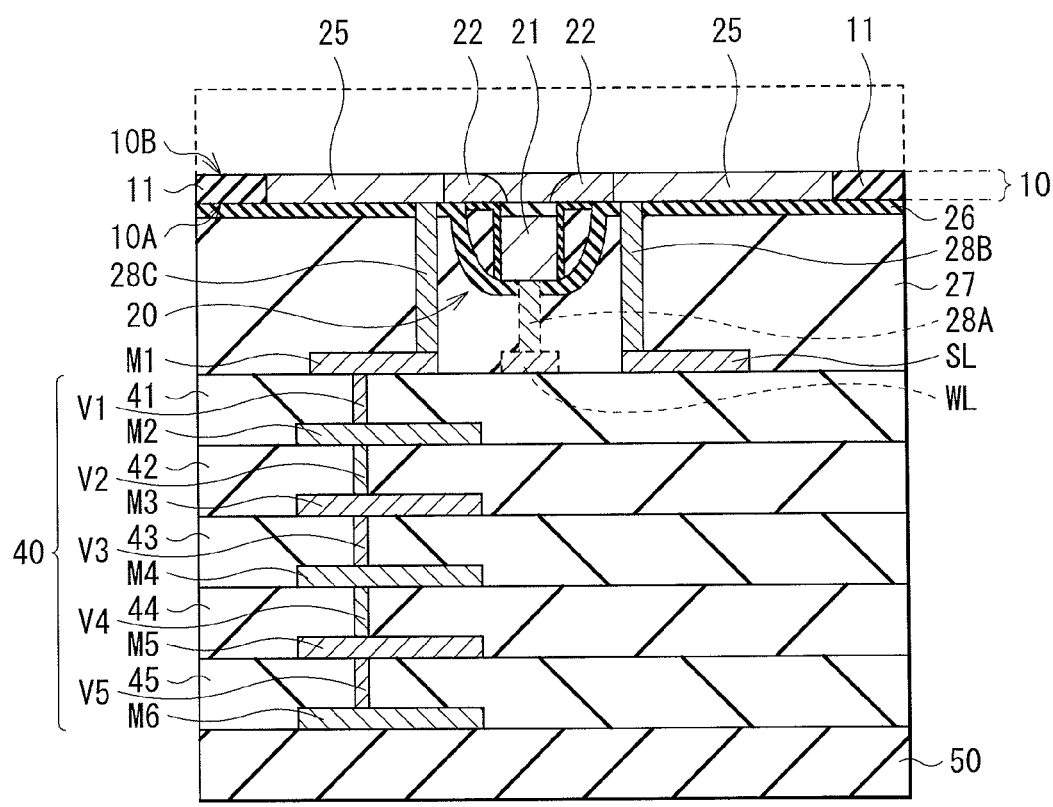
FIG. 7 is a cross-sectional diagram illustrating a process following the process in FIG. 6.

Subsequently, as illustrated in FIG. 6, the semiconductor substrate 10 may be polished from the back surface 10B side by, for example, chemical mechanical polishing (CMP). The polishing is stopped upon reaching the silicide layer 25, as illustrated in FIG. 7. The silicide layer 25 may have a thickness of, for example, about 2 nm to 20 nm. It is possible to stop the polishing at the element separating layer 11, by aligning the depth of the silicide layer 25 and the depth the element separating layer 11 with each other.

Figure 8:
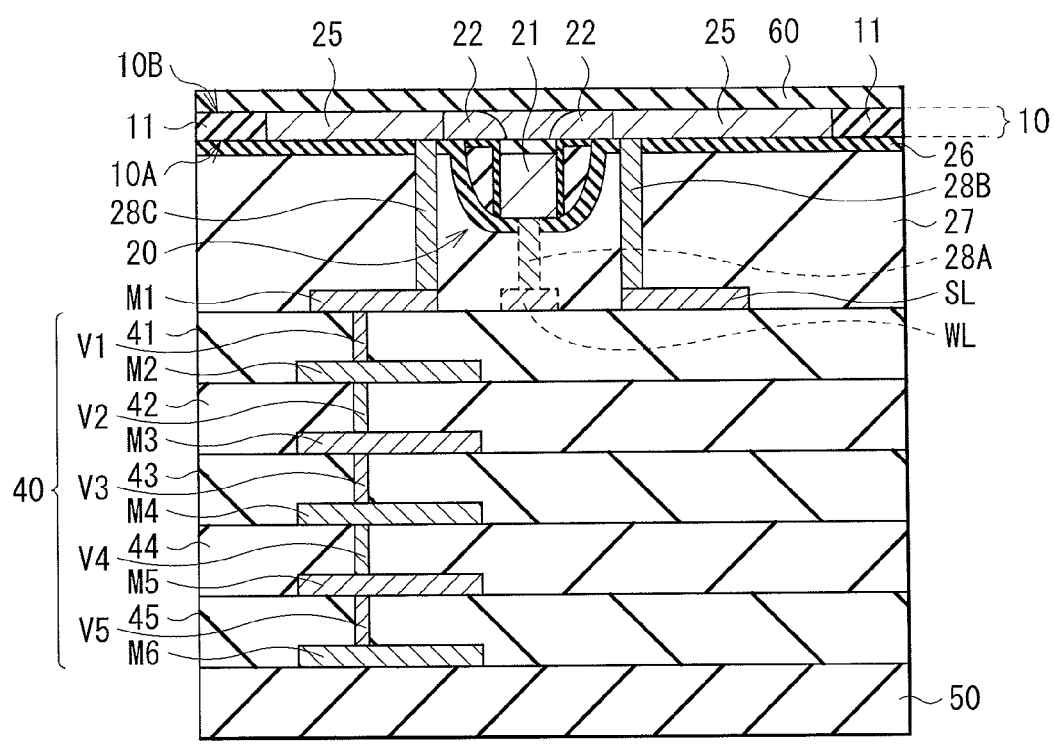
FIG. 8 is a cross-sectional diagram illustrating a process following the process in FIG. 7.

Subsequently, as illustrated in FIG. 8, the insulating film 60 made of a film such as the above-described High-K film may be formed by, for example, chemical vapor deposition (CVD), to be in contact with the back surface 10B of the semiconductor substrate 10 and the back surface of the silicide layer 25.

Figure 9:
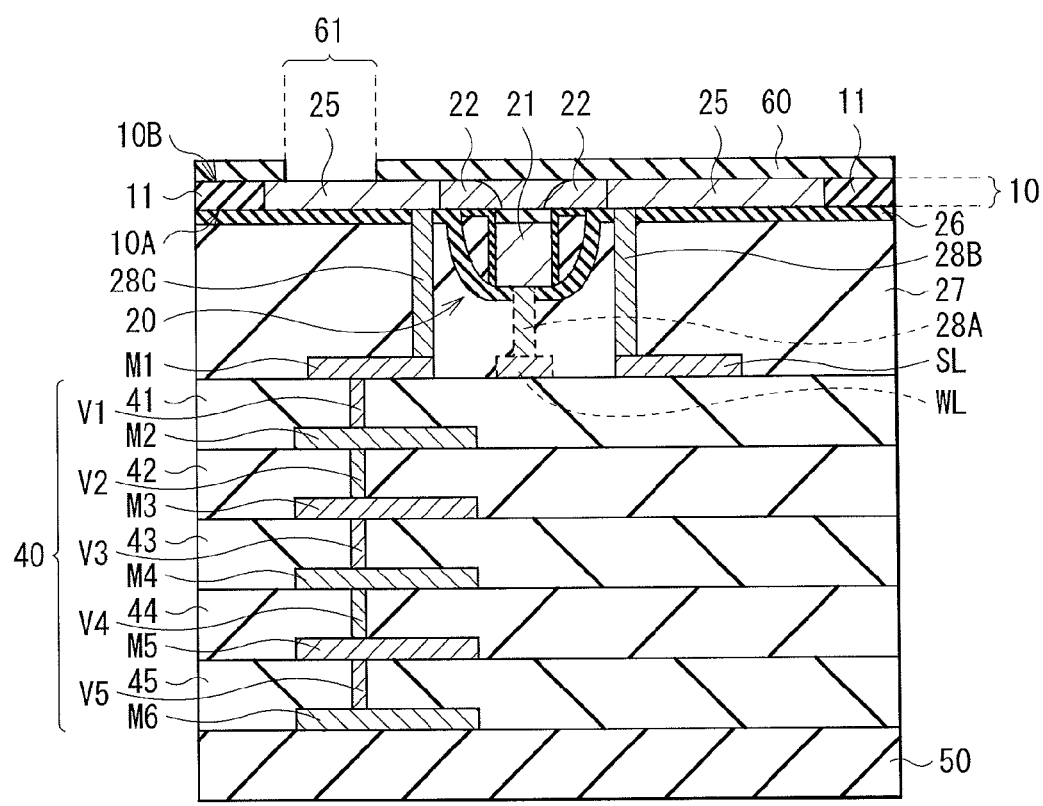
FIG. 9 is a cross-sectional diagram illustrating a process following the process in FIG. 8.

Next, as illustrated in FIG. 9, the opening 61 is provided in the insulating film 60, to face the silicide layer 25.

Figure 10:
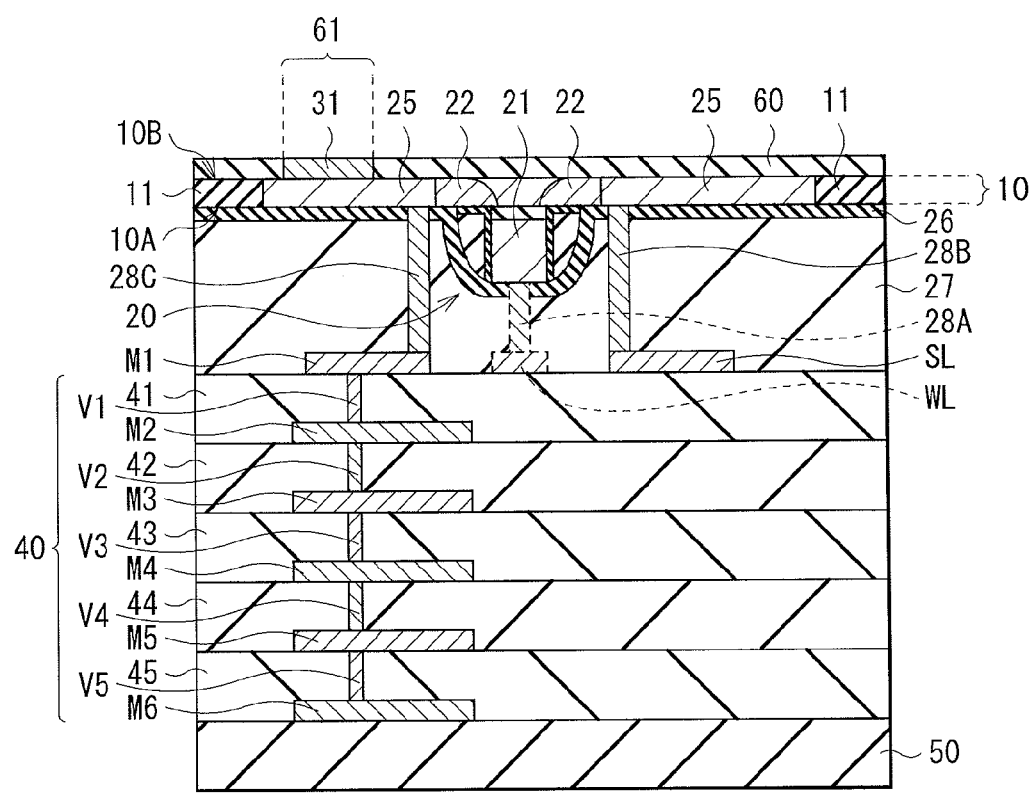
FIG. 10 is a cross-sectional diagram illustrating a process following the process in FIG. 9.
Figure 11:
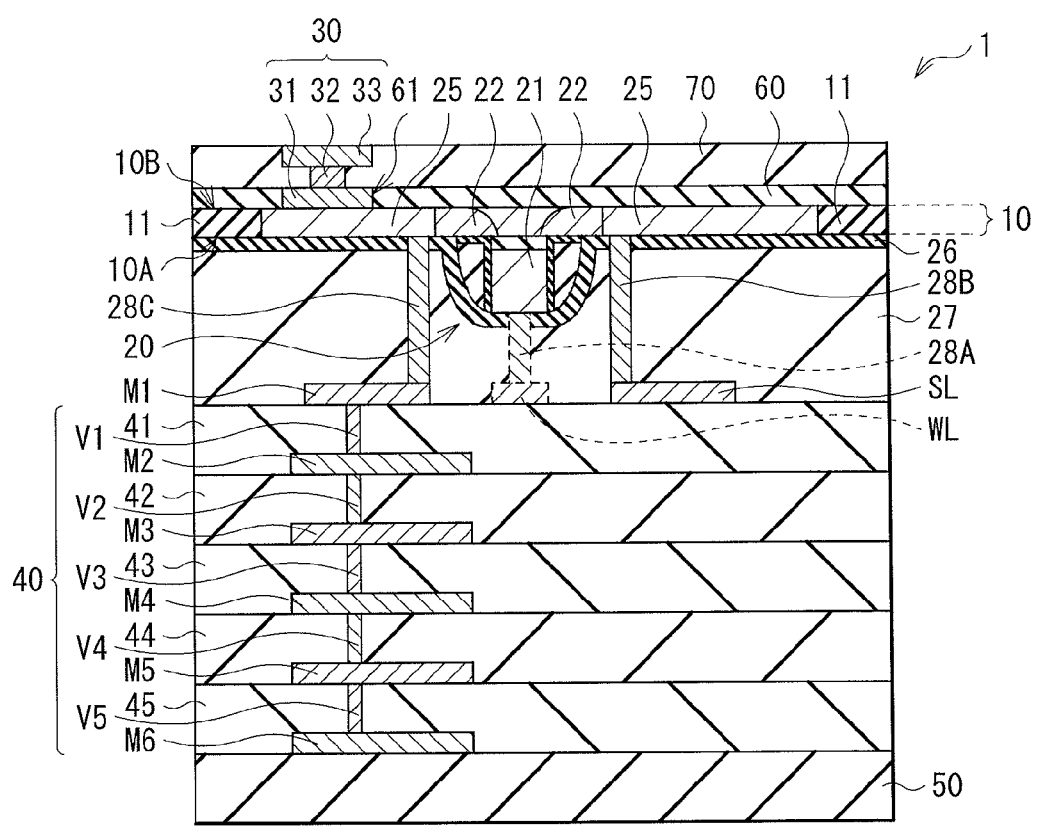
FIG. 11 is a cross-sectional diagram illustrating a process following the process in FIG. 10.

After the opening 61 is provided in the insulating film 60, the first electrode 31 made of the above-described material is embedded in the opening 61, as illustrated in FIG. 10. Subsequently, as illustrated in FIG. 11, the memory section 32 and the second electrode 33 are formed on the first electrode 31. The resistance change element 30 directly connected to the silicide layer 25 through the opening 61 is thus formed. Around the memory section 32 and the second electrode 33, the back-surface interlayer film 70 is formed. It is possible to form the memory section 32 by, for example, laminating each layer having the thickness and made of the material illustrated in FIG. 3 by spattering, and then performing patterning by dry etching. The semiconductor device 1 illustrated in FIG. 1 is thus completed.

In the semiconductor device 1, a current is applied in the film-surface vertical direction of the memory section 32, corresponding to HIGH or LOW of an electric potential between the select line SL and the bit line BL, thereby causing spin torque magnetization reversal. As a result, the direction of the magnetization M32D of the memory layer 32D is made parallel or antiparallel with the magnetization M32B of the magnetization fixed layer 32B, to perform writing of information by changing the resistance value of the memory section 32 between a large value and a small value.

On the other hand, the information stored in the memory section 32 is allowed to be read by providing a magnetic layer (not illustrated) that becomes a base of the information in the memory layer 32D with a thin insulating film interposed therebetween, and using a ferromagnetic tunneling current flowing through the insulating layer 32C. The reading may also be performed using a magnetoresistance effect.

Here, the resistance change element 30 is connected to the silicide layer 25 of the transistor 20, through the opening 61 of the insulating film 60. Therefore, connection resistance between the resistance change element 30 and the transistor 20 is reduced.

Figure 12:
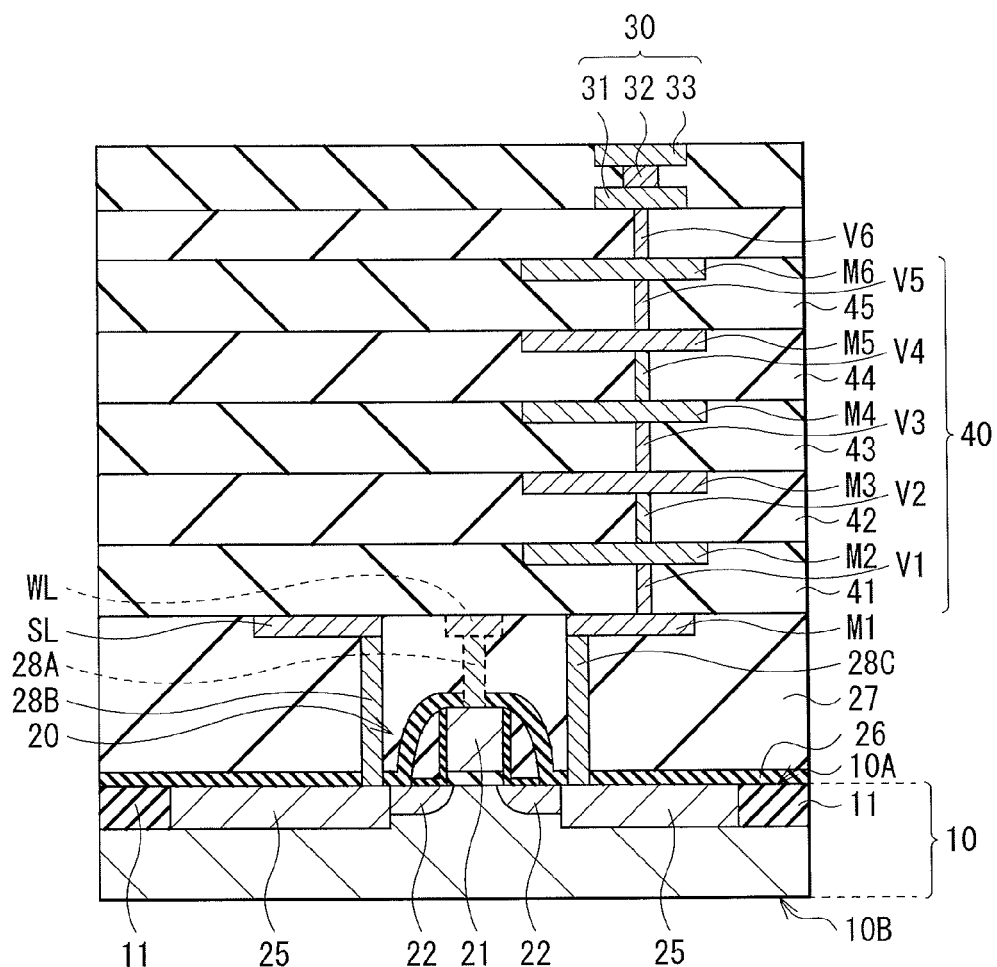
FIG. 12 is a cross-sectional diagram illustrating a semiconductor device of Reference Example 1.

On the other hand, in Reference Example 1 illustrated in FIG. 12, the resistance change element 30 is connected to a sixth wiring layer M6 of the main-surface-side multilayer wiring section 40 through a sixth via V6. A magnetic material used to configure a SST-MTJ element has low heat resistance, and does not easily resist a thermal budget of an ordinary LSI wiring process. Therefore, in this example, the resistance change element 30 is formed after completion of a wiring process of the main-surface-side multilayer wiring section 40. It is to be noted that FIG. 12 is a schematic diagram, and a dimension ratio between the resistance change element 30 and the main-surface-side multilayer wiring section 40 is different from an actual ratio.

However, wirings of a typical logic LSI are usually nine or more layers, and multiple contacts, vias, and wirings are connected between the diffusion layer 22 of the transistor 20 and the first electrode 31 of the resistance change element 30. Therefore, large parasitic resistance occurs between the transistor 20 and the resistance change element 30, which may reduce reading and writing speeds.

In the present embodiment, as described above, the resistance change element 30 is connected to the silicide layer 25 of the transistor 20, through the opening 61 of the insulating film 60. Therefore, it is possible to reduce the connection resistance between the resistance change element 30 and the transistor 20. Above all, the present embodiment is very suitable for a case in which a STT-MTJ made of a low heat-resistant magnetic material is used as the resistance change element 30.

Second Embodiment

Figure 13:
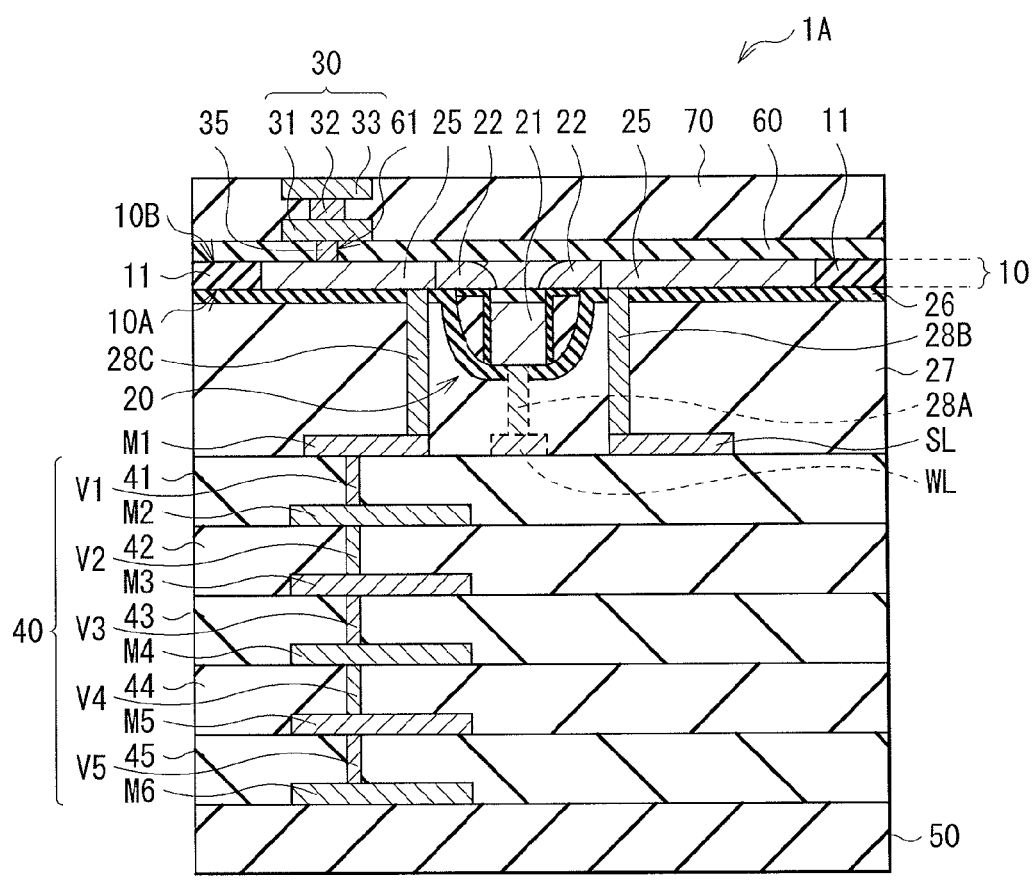
FIG. 13 is a cross-sectional diagram illustrating a configuration of a semiconductor device according to a second embodiment of the present disclosure.

FIG. 13 illustrates a cross-sectional configuration of a semiconductor device 1A according to a second embodiment of the present disclosure. The present embodiment is different from the first embodiment, in that the first electrode 31 of the resistance change element 30 is connected to the silicide layer 25 by a conductive connection section 35 embedded in the opening 61 of the insulating film 60. Except this point, the semiconductor device 1A of the present embodiment has a configuration and functions similar to those of the first embodiment, and may be manufactured in a manner similar to that of the first embodiment.

In the present embodiment, the insulating film 60 may have, for example, a thickness of about a few nanometers, and may preferably have a thickness of, specifically, 2 nm or more and 10 nm or less. The thickness of the insulating film 60 is considerably reduced to lower the resistance of the conductive connection section 35 itself. Therefore, it is possible to reduce the connection resistance, like the first embodiment.

The conductive connection section 35 may be configured using, for example, any of Ti, TiN, Ta, TaN, W, Cu, and Al, as well as a laminated structure of these elements.

In the present embodiment, the first electrode 31 of the resistance change element 30 is connected to the silicide layer 25 by the conductive connection section 35 embedded in the opening 61 of the insulating film 60. Therefore, it is possible to form the resistance change element 30, without influence of minute irregularities of the silicide layer 25.

However, in the first embodiment, the first electrode 31 is directly formed on the silicide layer 25. Therefore, roughness of the silicide layer 25 is canceled by the first electrode 31, which allows formation of the memory section 32 having stable performance.

Third Embodiment

Figure 14:
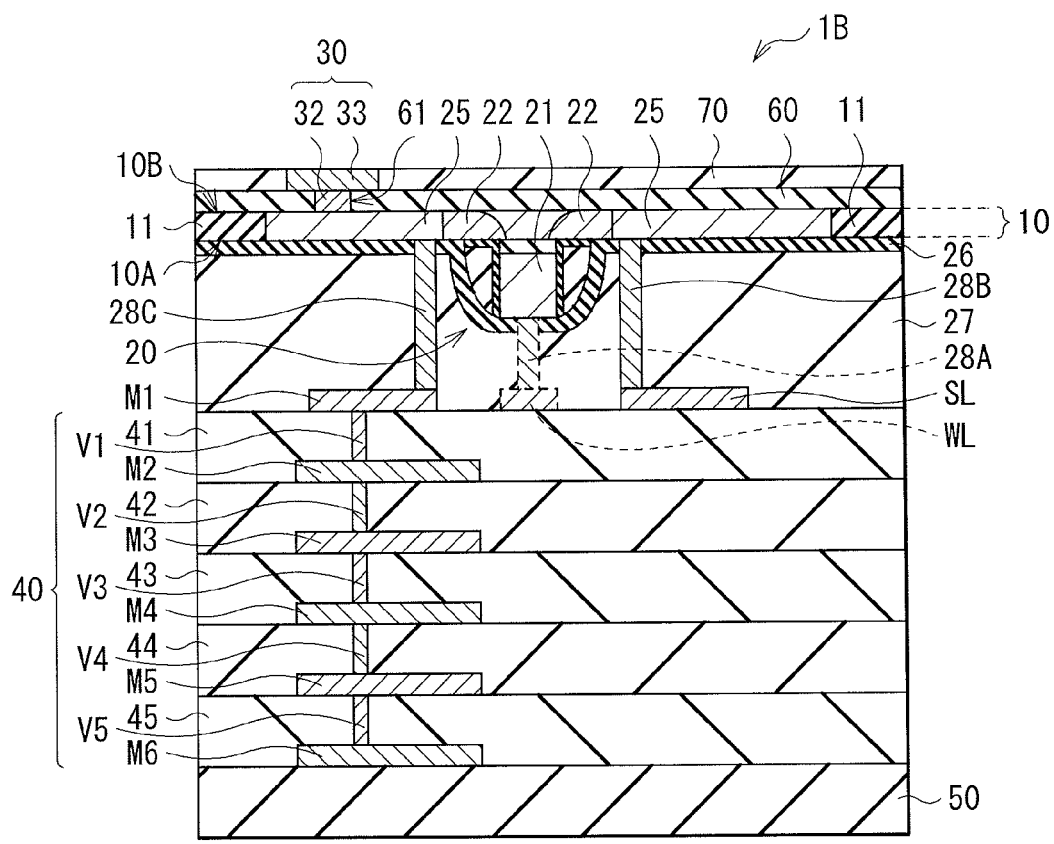
FIG. 14 is a cross-sectional diagram illustrating a configuration of a semiconductor device according to a third embodiment of the present disclosure.

FIG. 14 illustrates a cross-sectional configuration of a semiconductor device 1B according to a third embodiment of the present disclosure. The present embodiment is different from the first embodiment, in that the memory section 32 of the resistance change element 30 is embedded in the opening 61 of the insulating film 60 and connected to the silicide layer 25. In a configuration of the present embodiment, the first electrode 31 is omitted, and the primary layer 32A of the memory section 32 is directly provided on the silicide layer 25. Therefore, the number of processes is reduced, which allows a reduction in production cost. Except this point, the semiconductor device 1B of the present embodiment has a configuration and functions similar to those of the first embodiment, and may be manufactured in a manner similar to that of the first embodiment.

Fourth Embodiment

Figure 15:
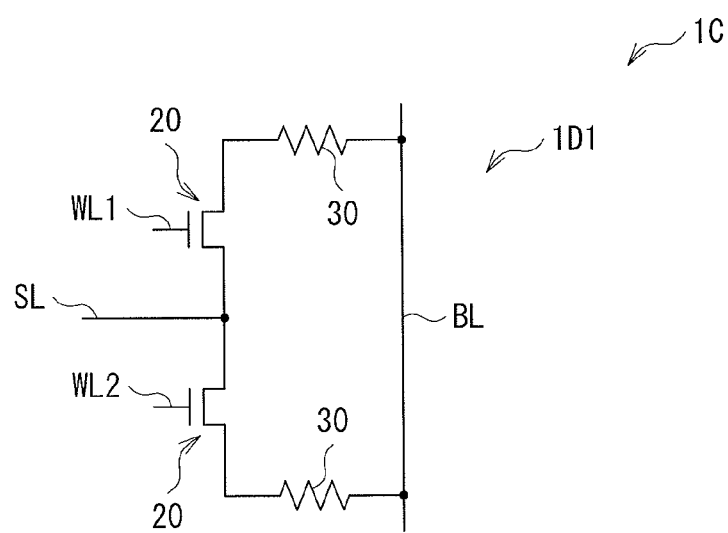
FIG. 15 is a circuit diagram illustrating a base unit of a semiconductor device according to a fourth embodiment of the present disclosure.

FIG. 15 illustrates a circuit configuration of a base unit of a semiconductor device 1C according to a fourth embodiment of the present disclosure. The semiconductor device 1C includes a base unit 1D1 including the two transistors 20 and the two resistance change elements 30. The two transistors 20 are connected in series, by sharing the diffusion layer 22 (see FIG. 1) that becomes the drain region. A first word line WL1 is connected to a gate of one of the transistors 20, the select line SL common to the two transistors 20 is connected to a drain thereof, and the first electrode 31 of the resistance change element 30 is connected to a source thereof. A second word line WL2 is connected to a gate of the other of the transistors 20, the select line SL common to the two transistors 20 is connected to a drain thereof, and the first electrode 31 of the resistance change element 30 is connected to a source thereof. The second electrode 33 of each of the two resistance change elements 30 is connected to the common bit line BL. It is to be noted that the bit line BL may be provided separately from the second electrode 33 of the resistance change element 30, or may also serve as the second electrode 33.

FIGS. 16 to 22 illustrate a method of manufacturing the base unit 1D1 of the semiconductor device 1C illustrated in FIG. 15, in process order. It is to be noted that, FIGS. 16 to 22 illustrate the same method as the method of manufacturing illustrated in FIGS. 4 to 11 in the first embodiment, but correspond to plan views thereof.

Figure 16:
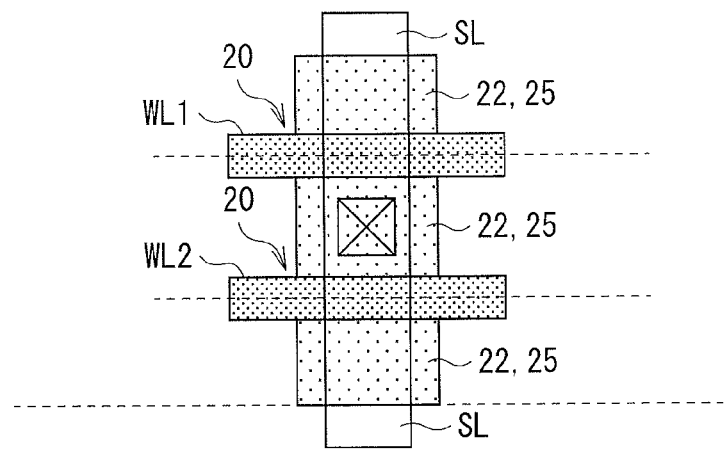
FIG. 16 is a plan view illustrating a process of a method of manufacturing the semiconductor device illustrated in FIG. 15.

First, as illustrated in FIG. 16, the two transistors 20 are formed on the main surface 10A side of the semiconductor substrate 10 (see FIG. 1), to share the diffusion layer 22 that becomes the drains. Further, the diffusion layer 22 that becomes the source is provided at each of the two transistors 20. In a part of each of the diffusion layers 22, the silicide layer 25 is formed. The three diffusion layers 22 may be arranged, for example, in a vertical direction in FIG. 16. It is to be noted that, in FIGS. 16 to 22, a blank region except the diffusion layers 22 represents the element separating layers 11 by STI. The two transistors 20 are then covered by the interlayer insulating films 26 and 27 (see FIG. 1) not illustrated in FIG. 16.

Next, as illustrated in FIG. 16, the first word line WL1 is connected to the gate electrode 21 of the one of the transistors 20, and the second word line WL2 is connected to the gate electrode 21 of the other of the transistors 20. In this process, for example, the first word line WL1 and the second word line WL2 may be extended in a lateral direction in FIG. 16.

Further, as illustrated in FIG. 16, the select line SL is connected to the diffusion layer 22 that becomes the drain region, through the contact plug 28B. In this process, for example, the select line SL may be provided at a position overlapping the three diffusion layers 22 in a lamination direction (a direction orthogonal to a sheet surface of FIG. 16), and extended in the same direction as an array direction (a vertical direction of FIG. 16) of the three diffusion layers 22. Subsequently, the first wiring layer M1 and the main-surface-side multilayer wiring section 40 (see FIG. 1) not illustrated in FIG. 16 are connected to the diffusion layer 22 that becomes the source region, through the contact plug 28C.

Figure 17:
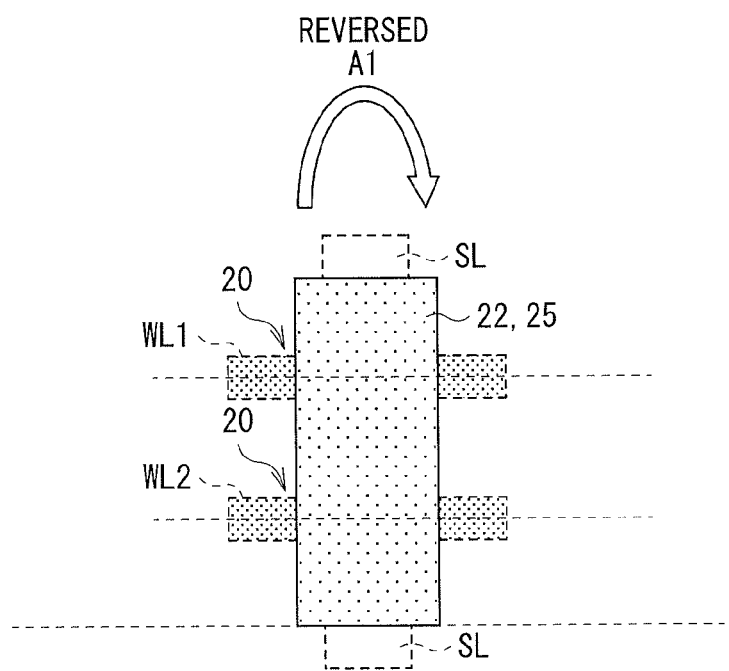
FIG. 17 is a plan view illustrating a process following the process in FIG. 16.

Subsequently, as illustrated in FIG. 17, the semiconductor substrate 10 is reversed as indicated by an arrow A1, and polished from the back surface 10B side of the semiconductor substrate 10. The polishing is stopped at the silicide layer 25.

Figure 18:
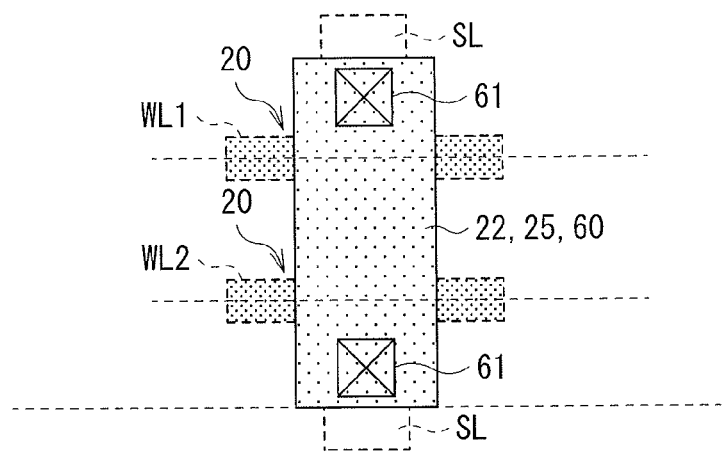
FIG. 18 is a plan view illustrating a process following the process in FIG. 17.

Next, as illustrated in FIG. 18, the insulating film 60 (see FIG. 1) is formed to be in contact with the back surface 10B of the semiconductor substrate 10 and the back surface of the silicide layer 25, and the opening 61 is provided in the insulating film 60, to face the silicide layer 25. In this process, the opening 61 is provided at a position overlapping the select line SL in the lamination direction (a direction orthogonal to a sheet surface of FIG. 18).

Figure 19:
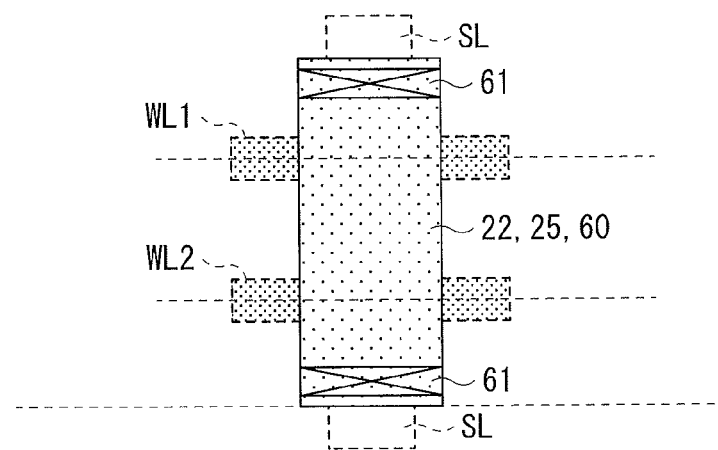
FIG. 19 is a plan view illustrating a modification of a back-surface junction section illustrated in FIG. 18.

As illustrated in FIG. 19, the opening 61 may be preferably shaped like a slit (a long hole) parallel with the first word line WL1 and the second word line WL2. This reduces a width of the opening 61, thereby making it possible to suppress a short circuit between the first word line WL1 or the second word line WL2 and the first electrode 31 of the resistance change element 30, through the silicide layer 25.

Figure 20:
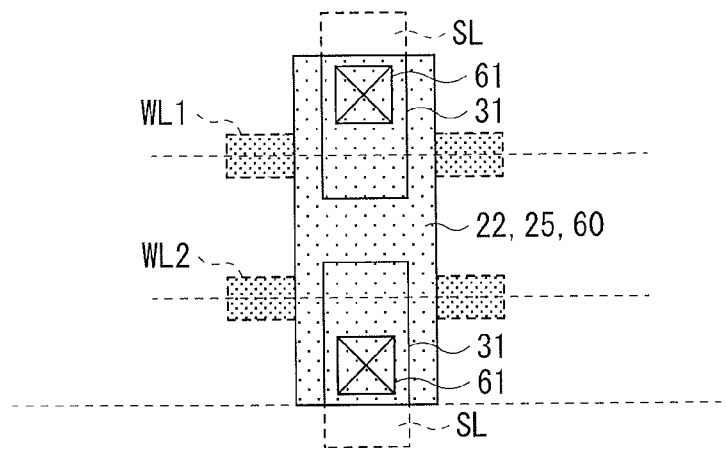
FIG. 20 is a plan view illustrating a process following the process in FIG. 18.

Subsequently, as illustrated in FIG. 20, the first electrode 31 of the resistance change element 30 is formed in the opening 61. In this process, the first electrode 31 is provided at a position overlapping the select line SL in the lamination direction (a direction orthogonal to a sheet surface of FIG. 20), and a width of the first electrode 31 is made equal to a width of the select line SL.

Figure 21:
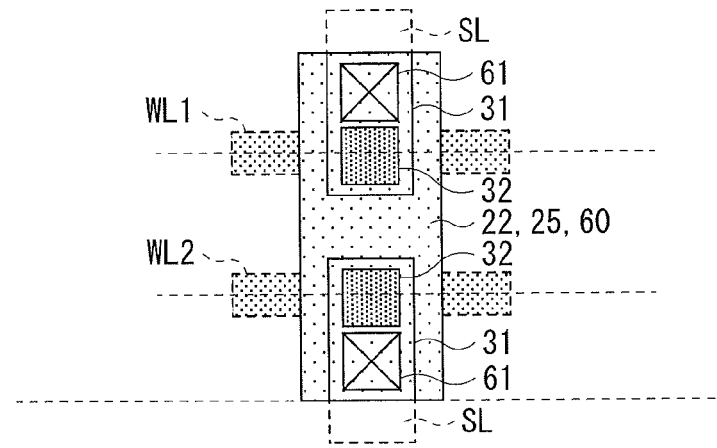
FIG. 21 is a plan view illustrating a process following the process in FIG. 20.

Next, as illustrated in FIG. 21, the memory section 32 is formed on the first electrode 31. In this process, the memory section 32 is provided at a position overlapping the select line SL in the lamination direction (a direction orthogonal to a sheet surface of FIG. 21), and a width of the memory section 32 is made equal to the width of the select line SL.

Figure 22:
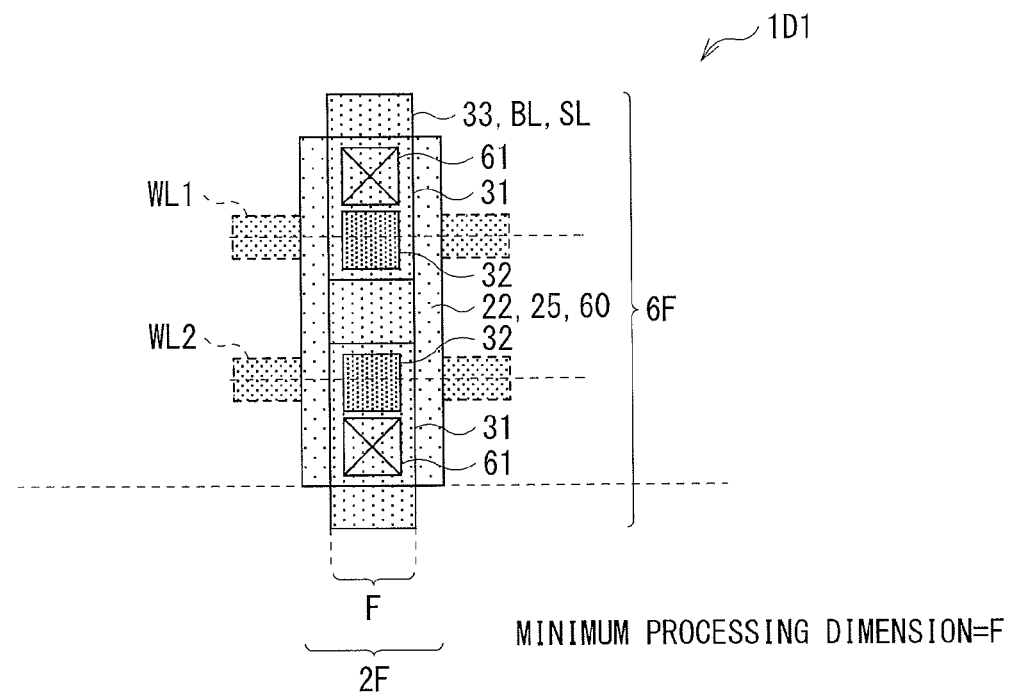
FIG. 22 is a plan view illustrating a process following the process in FIG. 21.

Afterwards, as illustrated in FIG. 22, the bit line BL also serving as the second electrode 33 is formed on the memory section 32. In this process, the bit line BL is provided at a position overlapping the select line SL in the lamination direction (a direction orthogonal to a sheet surface of FIG. 22), and a width of the bit line BL is made equal to the width of the select line SL.

The base unit 1D1 including the two transistors 20 and the two resistance change elements 30 illustrated in FIG. 15 is thus completed. Here, assume that a minimum processing dimension is F. Further, in FIGS. 16 to 22, the diffusion layer 22 is illustrated to have a width larger than that of each of the select line SL and the bit line BL for easy understanding, but the diffusion layer 22 actually has the same width as those of the select line SL and the bit line BL. Therefore, a lateral width of the base unit 1D1 is 2 F that equals to the sum of a width 1 F of the bit line BL and a total width 1 F of left and right parts of the element separating layers 11 around the diffusion layer 22. A vertical length of the base unit 1D1 is 6 F that equals to the sum of a length 1 F of the first word line WL1, a length 1 F of the second word line WL2, a total length 3 F of the three diffusion layers 22, and a total length 1 F of upper and lower parts of the element separating layers 11 around the diffusion layer 22. Therefore, an area of the base unit 1D1 is 12 $F^2$, and a cell area of each of the resistance change elements 30 is 6 $F^2$.

FIGS. 23 to 28 illustrate, in process order, a case in which a base unit 1D2 having a circuit configuration similar to that of FIG. 15 is manufactured, in Reference Example 1 illustrated in FIG. 12.

Figure 23:
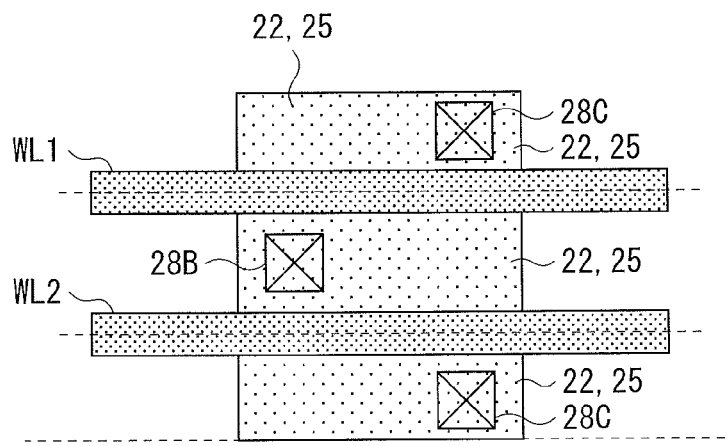
FIG. 23 is a plan view illustrating a process of a method of manufacturing the semiconductor device of Reference Example 1.

First, as illustrated in FIG. 23, the two transistors 20 are formed on the main surface 10A side of the semiconductor substrate 10 (see FIG. 1), to share the diffusion layer 22 that becomes the drains. Further, the diffusion layer 22 that becomes the source is provided at each of the two transistors 20. In a part of each of the diffusion layers 22, the silicide layer 25 is formed. Here, the three diffusion layers 22 may be arranged, for example, in a line in a vertical direction in FIG. 23. It is to be noted that in FIGS. 23 to 28, a blank region except the diffusion layers 22 represents the element separating layers 11 by STI. The two transistors 20 are then covered by the interlayer insulating films 26 and 27 (see FIG. 1) not illustrated in FIG. 23.

Next, as illustrated in FIG. 23, the first word line WL1 is connected to the gate electrode 21 of the one of the transistors 20, and the second word line WL2 is connected to the gate electrode 21 of the other of the transistors 20. In this process, for example, the first word line WL1 and the second word line WL2 may be extended in a lateral direction in FIG. 23. Further, as illustrated in FIG. 23, the contact plugs 28A to 28C are formed in the diffusion layer 22.

Figure 24:
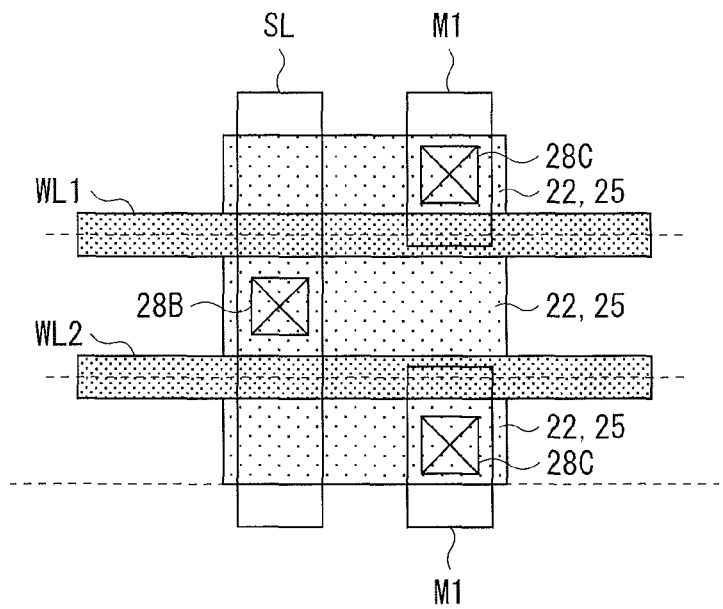
FIG. 24 is a cross-sectional diagram illustrating a process following the process in FIG. 23.

Subsequently, as illustrated in FIG. 24, the select line SL is connected to the diffusion layer 22 that becomes the drain region, through the contact plug 28B. Further, the first wiring layer M1 is connected to the diffusion layer 22 that becomes the source region, through the contact plug 28C. In other words, in the process illustrated in FIG. 24, two kinds of wirings (the select line SL and the first wiring layer M1) are provided in the same layer.

Subsequently, the first via V1 to the sixth metal layer M6 of the main-surface-side multilayer wiring section 40 (see FIG. 1), which are not illustrated in FIG. 23, are formed on the first wiring layer M1.

Figure 25:
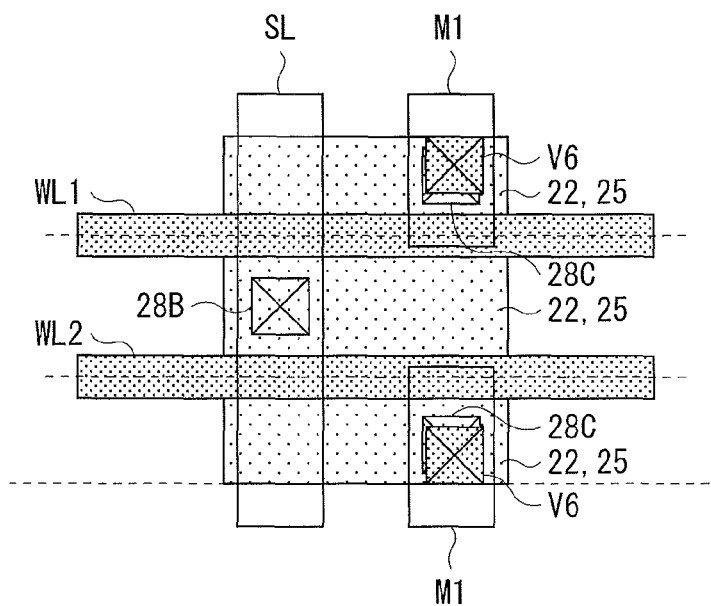
FIG. 25 is a cross-sectional diagram illustrating a process following the process in FIG. 24.

Subsequently, as illustrated in FIG. 25, the sixth via V6 illustrated in FIG. 12 is formed on the main-surface-side multilayer wiring section 40 (not illustrated in FIG. 25, see FIG. 12). It is to be noted that FIG. 12 illustrates the case in which the main-surface-side multilayer wiring section 40 and the resistance change element 30 are connected only by the sixth via V6. However, a multilayer wiring including a few layers may be interposed between the main-surface-side multilayer wiring section 40 and the resistance change element 30.

Figure 26:
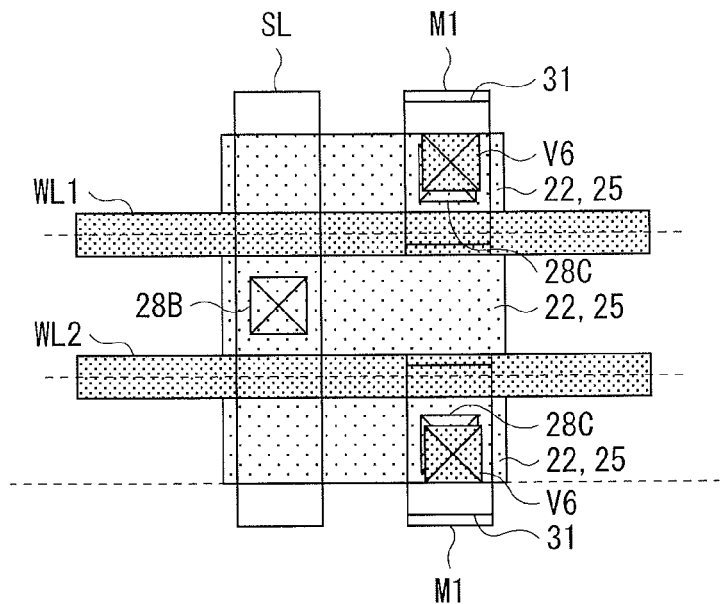
FIG. 26 is a plan view illustrating a process following the process in FIG. 25.

Subsequently, as illustrated in FIG. 26, the first electrode 31 of the resistance change element 30 is connected to the sixth via V6.

Figure 27:
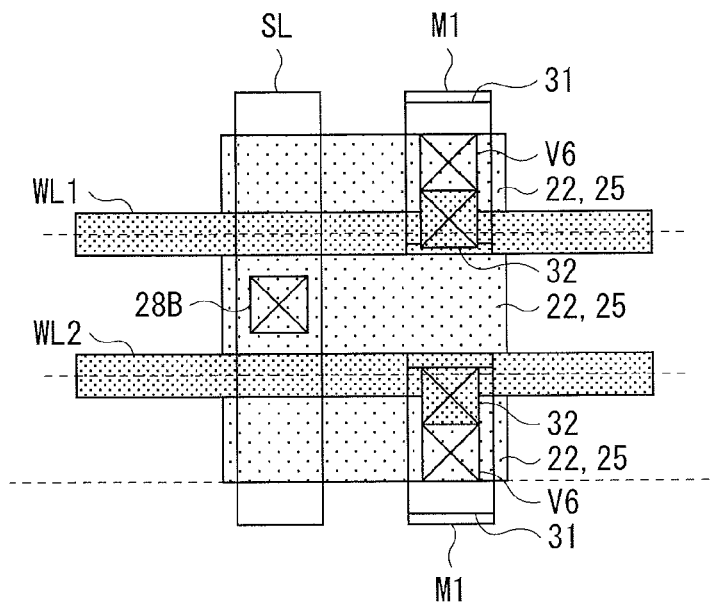
FIG. 27 is a plan view illustrating a process following the process in FIG. 26.

After the first electrode 31 is formed, the memory section 32 is formed on the first electrode 31, as illustrated in FIG. 27.

Figure 28:
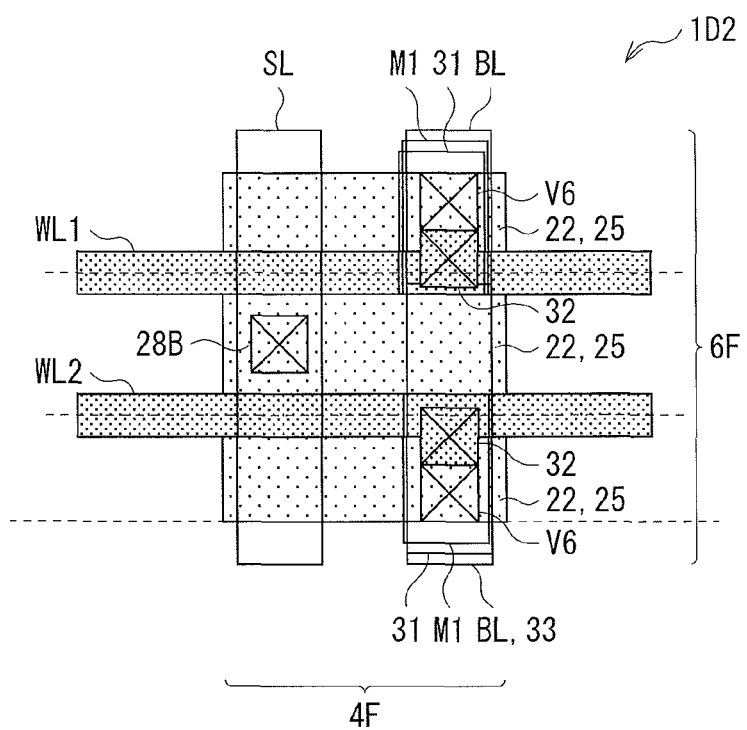
FIG. 28 is a plan view illustrating a process following the process in FIG. 27.

After the memory section 32 is formed, the bit line BL also serving as the second electrode 33 is formed on the memory section 32, as illustrated in FIG. 28.

The base unit 1D2 of Reference Example 1, including the two transistors 20 and the two resistance change elements 30 illustrated in FIG. 15, is thus completed. A lateral width of the base unit 1D2 is 4 F that equals to the sum of a width 1 F of the select line SL, a width 1 F of the bit line BL, a width 1 F of the diffusion layer 22 between the select line SL and the bit line BL, and a total width 1 F of left and right parts of the element separating layers 11 around the diffusion layer 22. A vertical width of the base unit 1D2 is 6 F, which is the same as that in FIG. 22. Therefore, an area of the base unit 1D2 of Reference Example 1 is 24 $F^2$, and a cell area of each of the resistance change elements 30 is 12 $F^2$.

Figure 29:
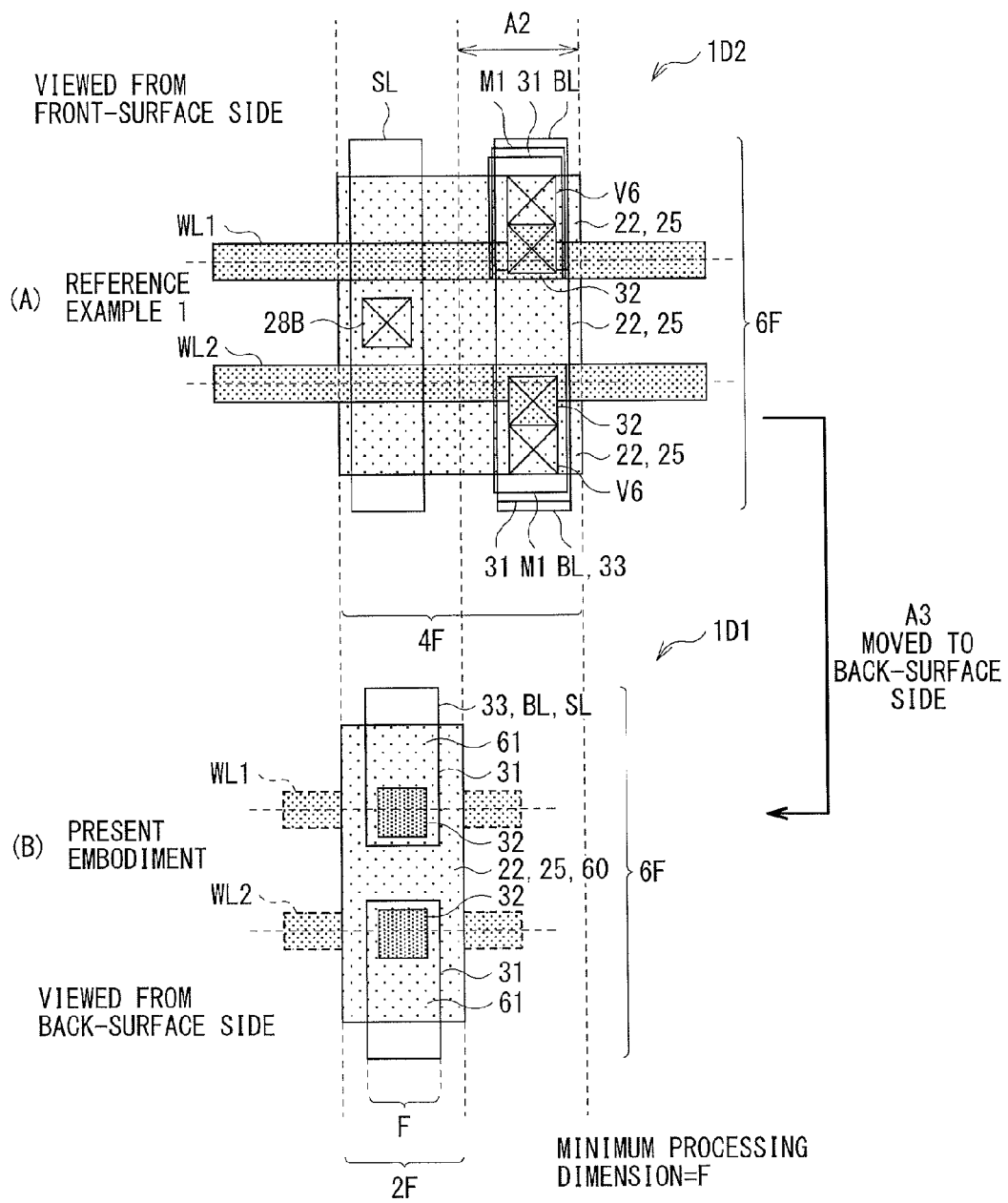
FIG. 29 is a diagram including a plan view illustrating the base unit of the semiconductor device of the fourth embodiment illustrated in FIG. 22, and a plan view illustrating a base unit of the semiconductor device of Reference Example 1 illustrated in FIG. 28, arranged for comparison.

FIG. 29 illustrates the base unit 1D1 of the present embodiment illustrated in FIG. 22 and the base unit 1D2 of Reference Example 1 illustrated in FIG. 28, which are arranged for comparison. In the base unit 1D1 of the present embodiment, a part corresponding to a left-half region including the select line SL of the base unit 1D2 of Reference Example 1 is formed on the main surface 10A side of the semiconductor substrate 10. In addition, a part corresponding to a right-half region A2 including the bit line BL of the base unit 1D2 of Reference Example 1 is moved to the back surface 10B side of the semiconductor substrate 10, as indicated by an arrow A3. Therefore, in the present embodiment, the select line SL and the bit line BL are superposed on each other, with the semiconductor substrate 10 interposed therebetween. By thus providing the resistance change element 30 as the back surface, an area of each of the resistance change elements 30 of the present embodiment is a half of that of Reference Example 1.

In addition, in Reference Example 1, the resistance change element 30 is formed on the main-surface-side multilayer wiring section 40 in view of heat resistance, when a logic circuit or the like is mounted. The main-surface-side multilayer wiring section 40 includes wirings of seven to twelve layers. Therefore, in Reference Example 1, the area of the base unit 1D2 tends to become large, under the influence of a wiring pitch of the main-surface-side multilayer wiring section 40.

In contrast, in the present embodiment, it is possible to form the resistance change element 30 on the back surface 10B side of the semiconductor substrate 10, after the main-surface-side multilayer wiring section 40 is formed on the surface 10A side of the semiconductor substrate 10. Therefore, it is possible to form each layer of the resistance change element 30 with a minimum wiring pitch corresponding to the minimum processing dimension F, without influence of the wiring pitch of the main-surface-side multilayer wiring section 40. Therefore, it is possible to reduce the cell area of the resistance change element 30 reliably.

Figure 30:
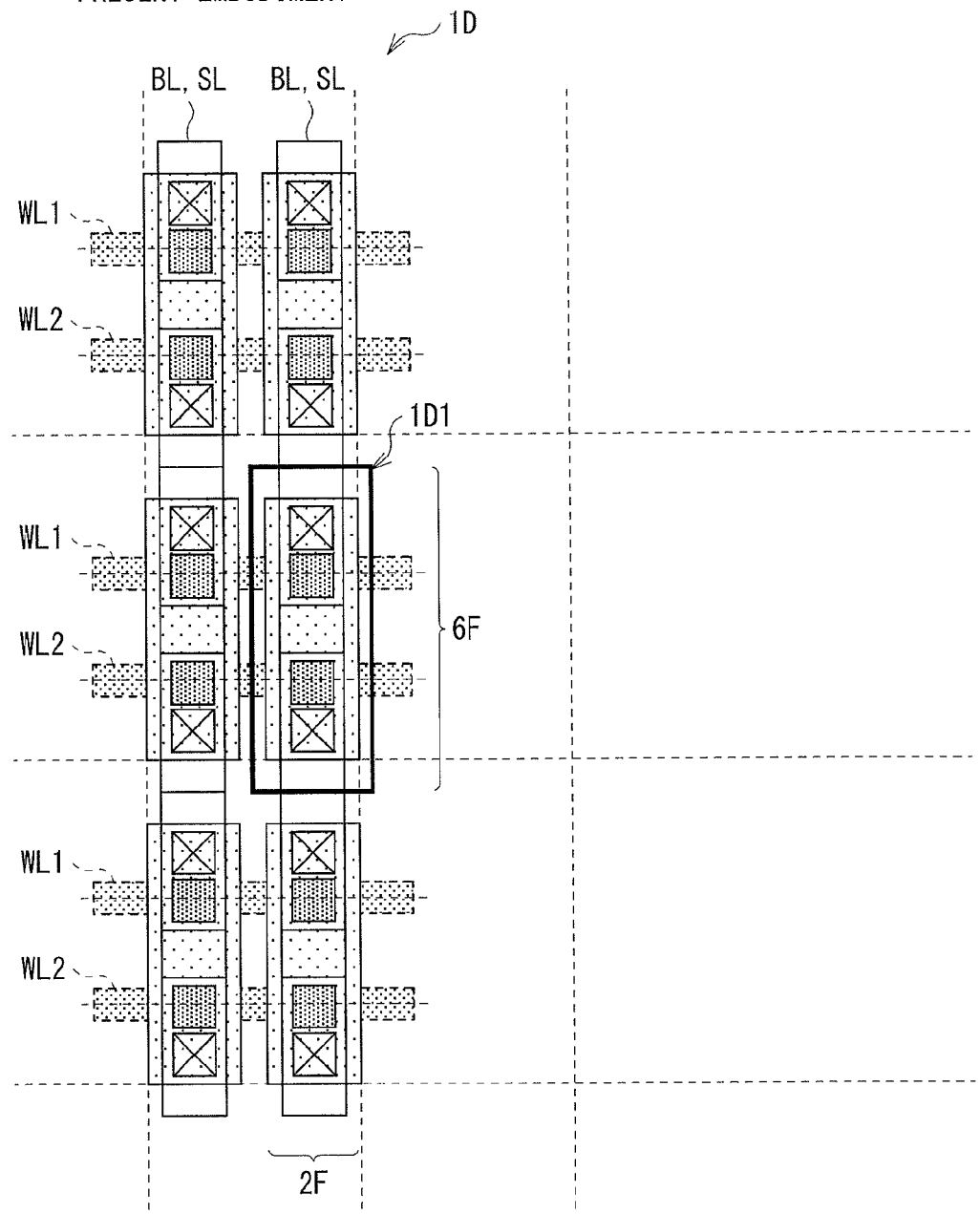
FIG. 30 is a plan view illustrating an array in which the base units of the semiconductor device of the fourth embodiment illustrated in FIG. 22 are arranged in rows and columns.
Figure 31:
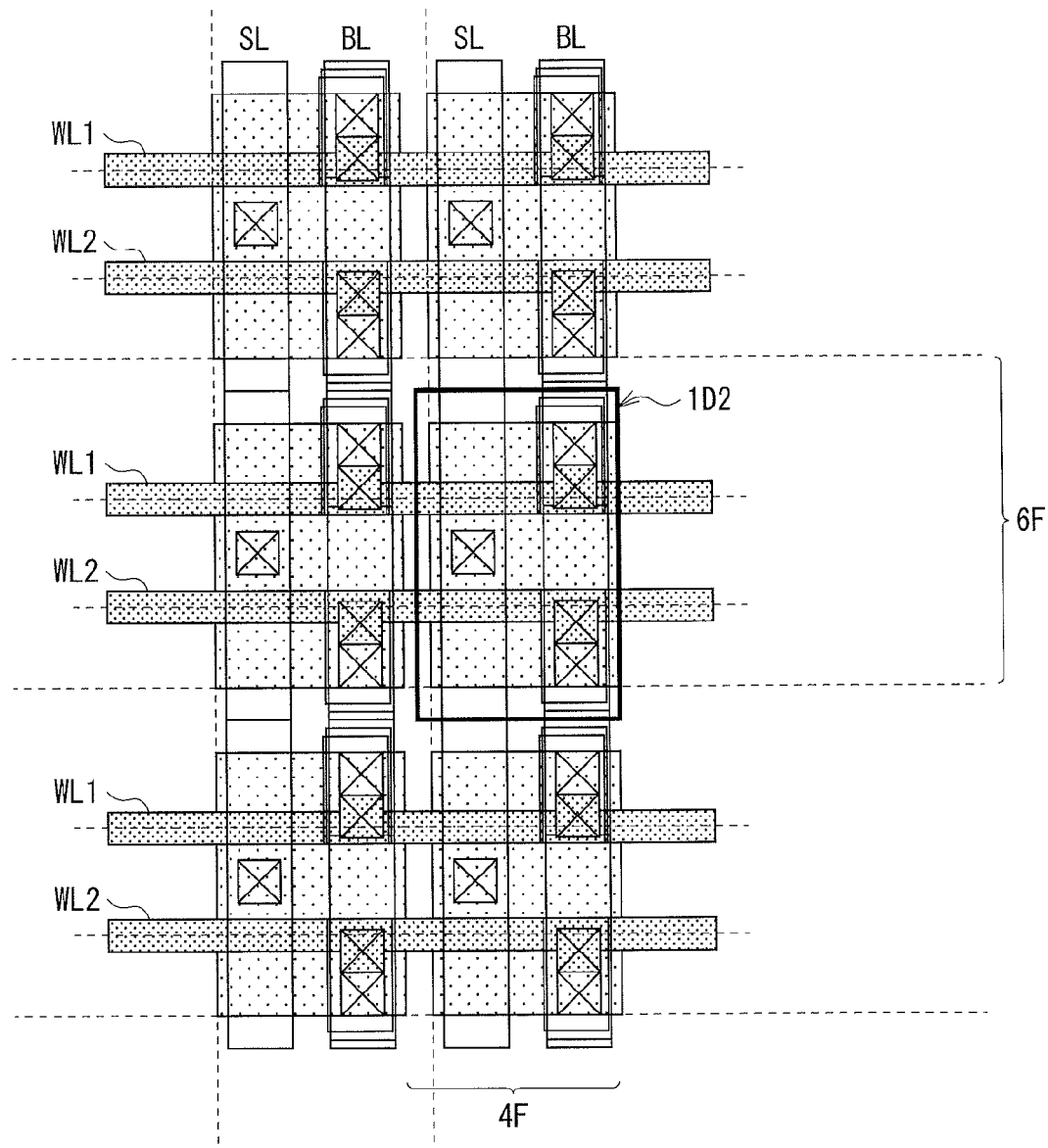
FIG. 31 is a plan view illustrating an array in which the base units of the semiconductor device of Reference Example 1 illustrated in FIG. 28 are arranged in rows and columns.

FIG. 30 illustrates a configuration of an example of an array configured by vertically arranging the three base units 1D1 and laterally arranging the two base units 1D1 of the present embodiment illustrated in FIG. 22. In FIG. 30, this example is viewed from the back surface 10B side of the semiconductor substrate 10. FIG. 31 illustrates a configuration of an example of an array configured by vertically arranging the three base units 1D2 and laterally arranging the two base units 1D2 of Reference Example 1 illustrated in FIG. 28. In FIG. 31, this example is viewed from the surface 10A side of the semiconductor substrate 10. As illustrated in FIGS. 30 and 31, it is possible to halve an area of the array, by halving the area of the base unit 1D1 in the present embodiment.

Modification 1

FIGS. 32 to 37 illustrate a method of manufacturing a semiconductor device according to Modification 1 of the present disclosure, in process order. The present modification is different from the method of manufacturing in the first embodiment, in that the polishing is performed in two stages, in the process of polishing the semiconductor substrate 10 from the back surface 10B side. It is to be noted that any of the semiconductor devices 1, 1A, 1B, and 1C of the above-described first to fourth embodiments may be manufactured by this method of manufacturing. Here, a case of forming the semiconductor device 1 of the first embodiment will be described as an example. In addition, processes overlapping those of the above-described first embodiment will be described with reference to FIGS. 4 to 11.

Figure 32:
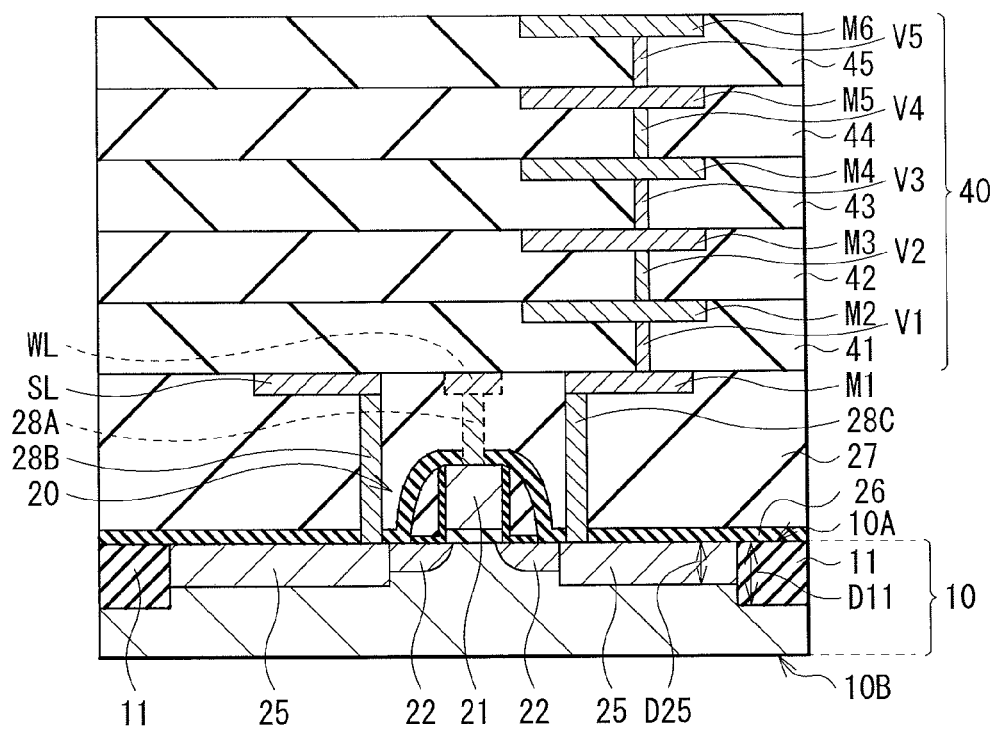
FIG. 32 is a cross-sectional diagram illustrating a process of a method of manufacturing a semiconductor device according to Modification 1 of the present disclosure.

First, as illustrated in FIG. 32, in a manner similar to that of the first embodiment, the transistor 20, the word line WL, the select line SL, the first metal layer M1, and the main-surface-side multilayer wiring section 40 are formed on the main surface 10A side of the semiconductor substrate 10 by the process illustrated in FIG. 4. In this process, the element separating layer 11 is formed to have a depth D11 larger than a depth D25 of the silicide layer 25.

Figure 33:
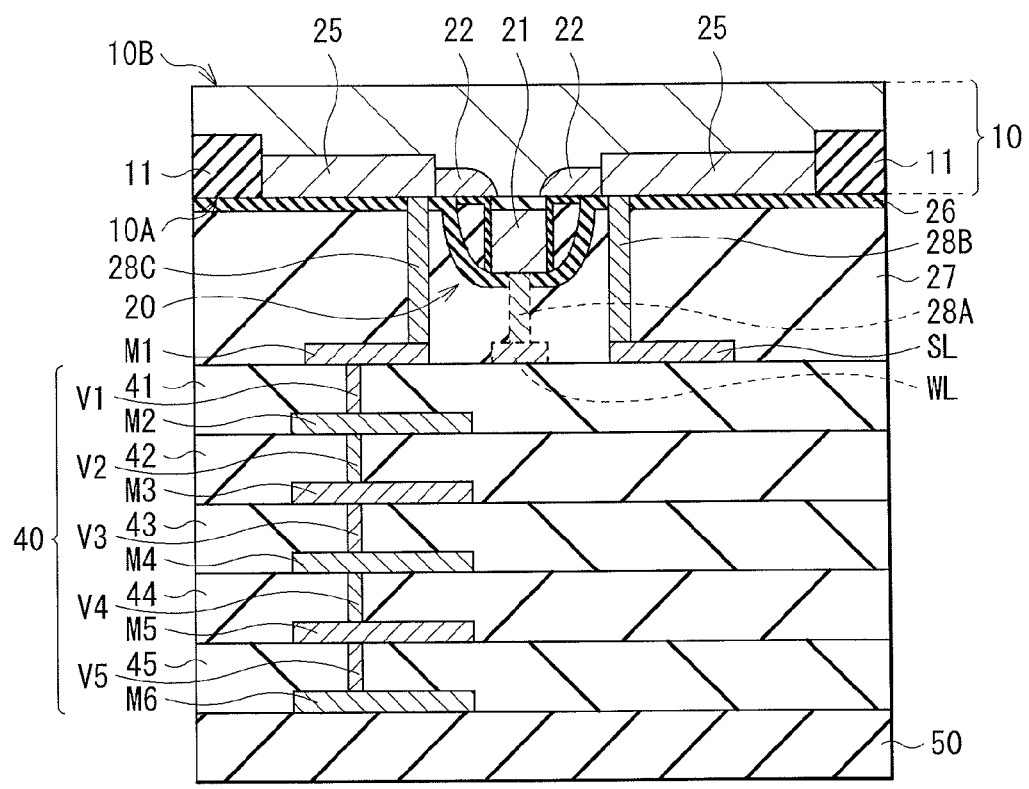
FIG. 33 is a cross-sectional diagram illustrating a process following the process in FIG. 32.

Next, as illustrated in FIG. 33, in a manner similar to that of the first embodiment, the semiconductor substrate 10 is reversed and the supporting substrate 50 is adhered on the main surface 10A side of the semiconductor substrate 10 by the process illustrated in FIG. 5. At this moment, the transistor 20 and the main-surface-side multilayer wiring section 40 are upside down.

Figure 34:
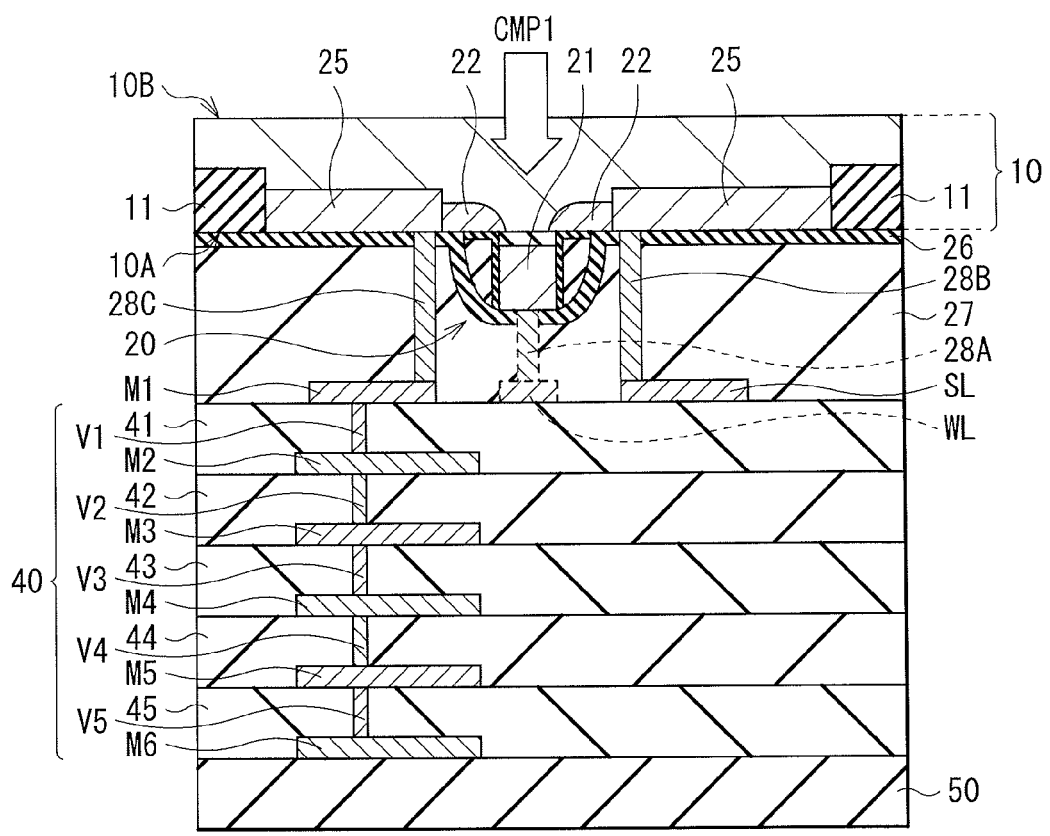
FIG. 34 is a cross-sectional diagram illustrating a process following the process in FIG. 33.
Figure 35:
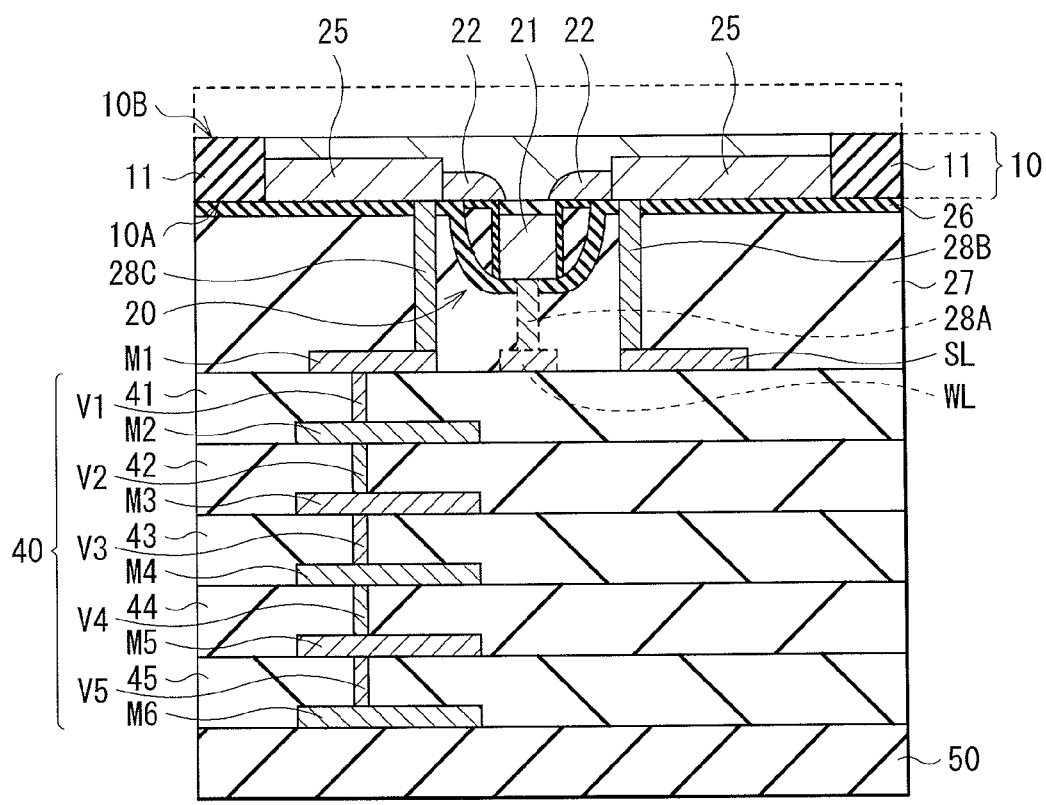
FIG. 35 is a cross-sectional diagram illustrating a process following the process in FIG. 34.

Subsequently, as illustrated in FIG. 34, the semiconductor substrate 10 may be polished from the back surface 10B side by, for example, CMP1. As illustrated in FIG. 35, this polishing in a first stage is then stopped, upon reaching the element separating layers 11.

Figure 36:
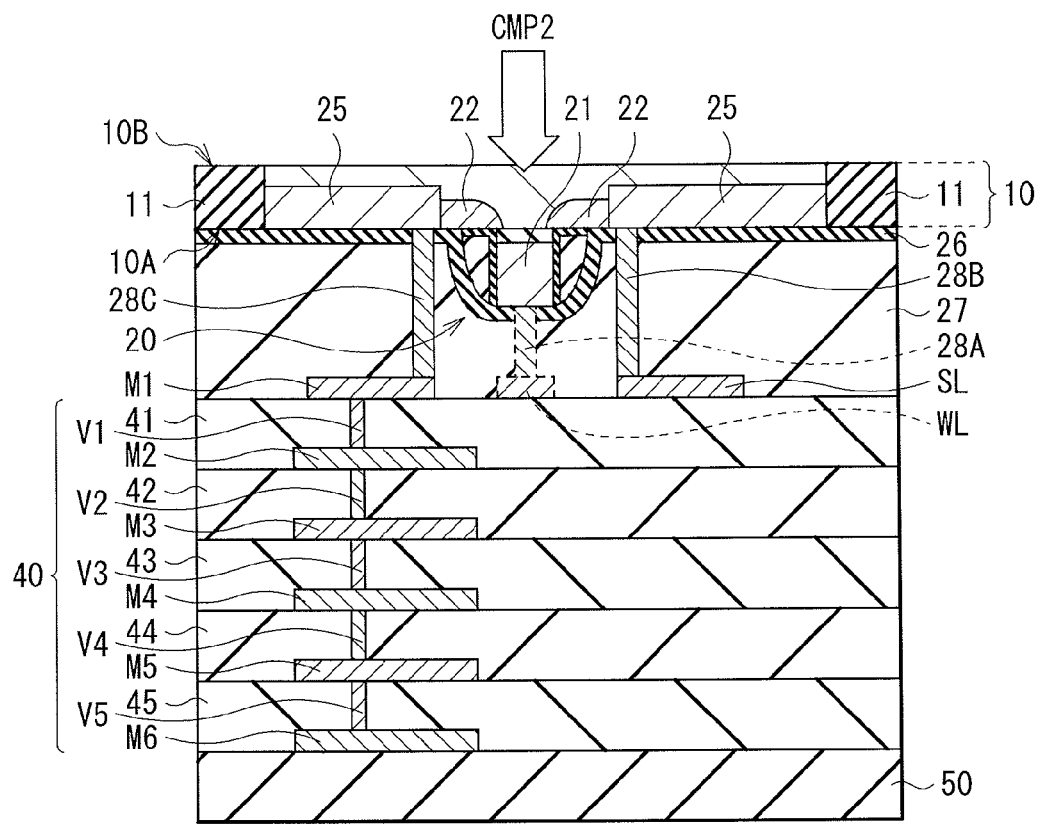
FIG. 36 is a cross-sectional diagram illustrating a process following the process in FIG. 35.
Figure 37:
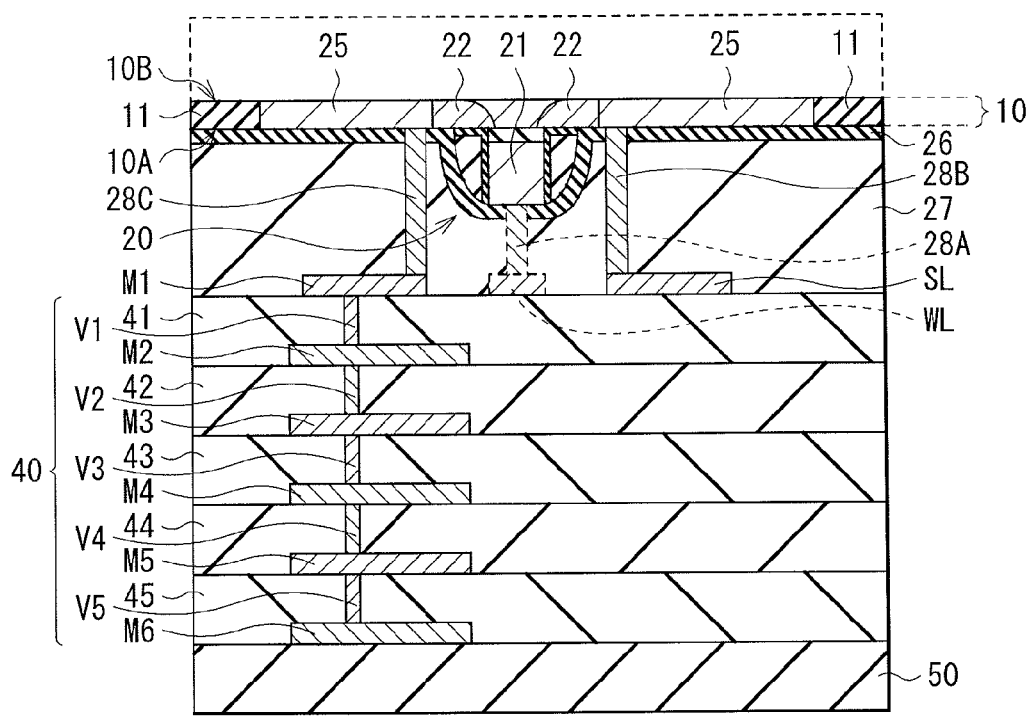
FIG. 37 is a cross-sectional diagram illustrating a process following the process in FIG. 36.

Next, as illustrated in FIG. 36, polishing in a second stage may be performed by, for example, CMP2. As illustrated in FIG. 37, the polishing in the second stage is then stopped, upon reaching the silicide layer 25.

It is possible to stop the polishing in the first stage reliably at the element separating layers 11, by using the element separating layer 11 as a stopper. Therefore, a possibility of damaging the silicide layer 25 and/or a gate section of the transistor 20 is reduced. In addition, it is possible to obtain a flat surface with little unevenness in film thickness, which allows achievement of a high quality interface in the next process that is the process of forming the insulating film 60.

Subsequently, in a manner similar to that of the first embodiment, the insulating film 60 made of a film such as the above-described High-K film may be formed by, for example, CVD, to be in contact with the back surface 10B of the semiconductor substrate 10 and the back surface of the silicide layer 25, by the process illustrated in FIG. 8.

Next, in a manner similar to that of the first embodiment, the opening 61 is provided in the insulating film 60, to face the silicide layer 25, by the process illustrated in FIG. 9.

After the opening 61 is provided in the insulating film 60, the first electrode 31 made of the above-described material is embedded in the opening 61, and the memory section 32 and the second electrode 33 are formed on the first electrode 31, by the processes illustrated in FIGS. 10 and 11, in a manner similar to that of the first embodiment. The resistance change element 30 directly connected to the silicide layer 25 through the opening 61 is thus formed. Around the memory section 32 and the second electrode 33, the back-surface interlayer film 70 is formed. The semiconductor device 1 illustrated in FIG. 1 is thus completed.

In this way, in the present modification, the polishing is performed in the two stages, in the process of polishing the semiconductor substrate 10 from the back surface 10B side. Therefore, it is possible to reduce a possibility of damaging the first silicide layer 25 and/or the gate section of the transistor 20. In addition, it is possible to obtain a flat surface with little unevenness in film thickness, which allows achievement of a high quality interface in the next process that is the process of forming the insulating film 60.

Modification 2

FIGS. 38 to 43 illustrate a method of manufacturing a semiconductor device according to Modification 2 of the present disclosure, in process order. The present modification is different from the method of manufacturing in the first embodiment, in that the transistor 20 is formed using an SOI substrate. It is to be noted that any of the semiconductor devices 1, 1A, 1B, and 1C of the above-described first to fourth embodiments may be manufactured by this method of manufacturing. Here, a case of forming the semiconductor device 1 of the first embodiment will be described as an example. In addition, processes overlapping those of the above-described first embodiment will be described with reference to FIGS. 4 to 11.

Figure 38:
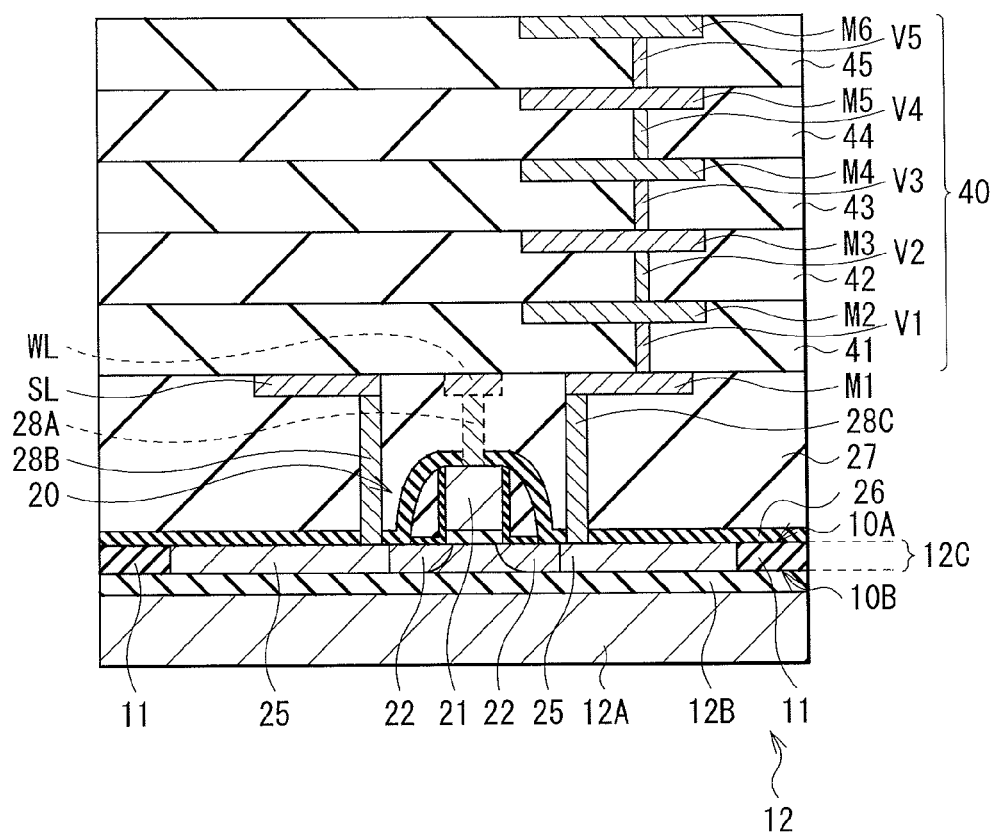
FIG. 38 is a cross-sectional diagram illustrating a process of a method of manufacturing a semiconductor device according to Modification 2 of the present disclosure.

First, as illustrated in FIG. 38, an SOI substrate 12 is prepared. The SOI substrate 12 includes a carrier substrate 12A, and an embedded oxide film 12B as well as a semiconductor substrate 12C that are provided on one surface side of the carrier substrate 12A. The element separating layers 11 by STI are formed in the semiconductor substrate 12C. In a region surrounded by the element separating layers 11 of the semiconductor substrate 12C, the transistor 20 including the gate electrode 21 and the pair of diffusion layers 22 is formed. In a part of each of the diffusion layers 22, the silicide layer 25 is formed. Subsequently, in a manner similar to that of the first embodiment, the word line WL, the select line SL, the first metal layer M1, and the main-surface-side multilayer wiring section 40 are formed by the process illustrated in FIG. 4.

Figure 39:
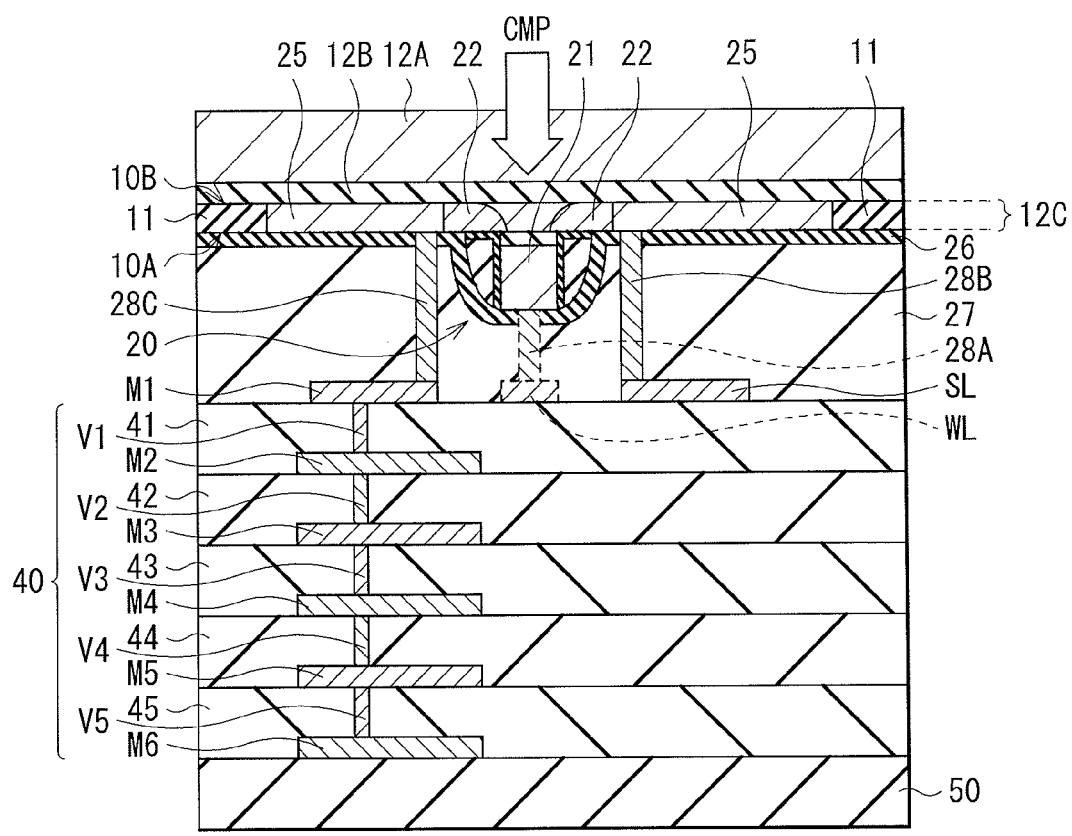
FIG. 39 is a cross-sectional diagram illustrating a process following the process in FIG. 38.

Next, as illustrated in FIG. 39, in a manner similar to that of the first embodiment, the semiconductor substrate 10 is reversed and the supporting substrate 50 is adhered on the main surface 10A side of the semiconductor substrate 12C by the process illustrated in FIG. 5. At this moment, the transistor 20 and the main-surface-side multilayer wiring section 40 are upside down.

Figure 40:
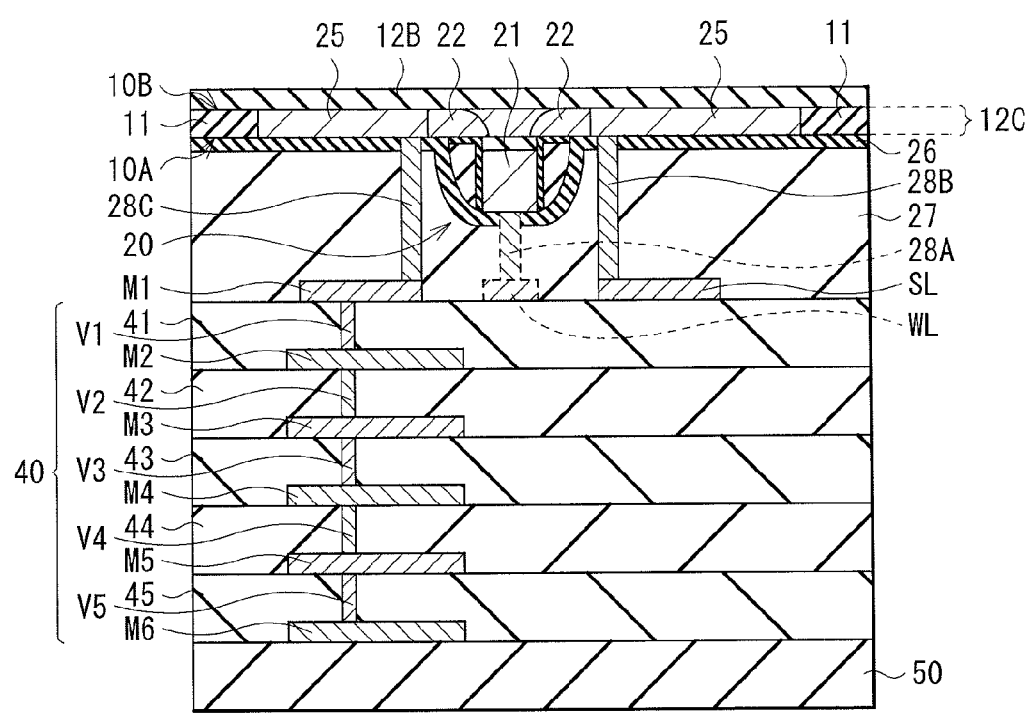
FIG. 40 is a cross-sectional diagram illustrating a process following the process in FIG. 39.

Subsequently, as illustrated in FIG. 39, the semiconductor substrate 12C may be polished from the back surface 10B side by, for example, CMP. As illustrated in FIG. 40, this polishing is then stopped, upon reaching the embedded oxide film 12B.

Figure 41:
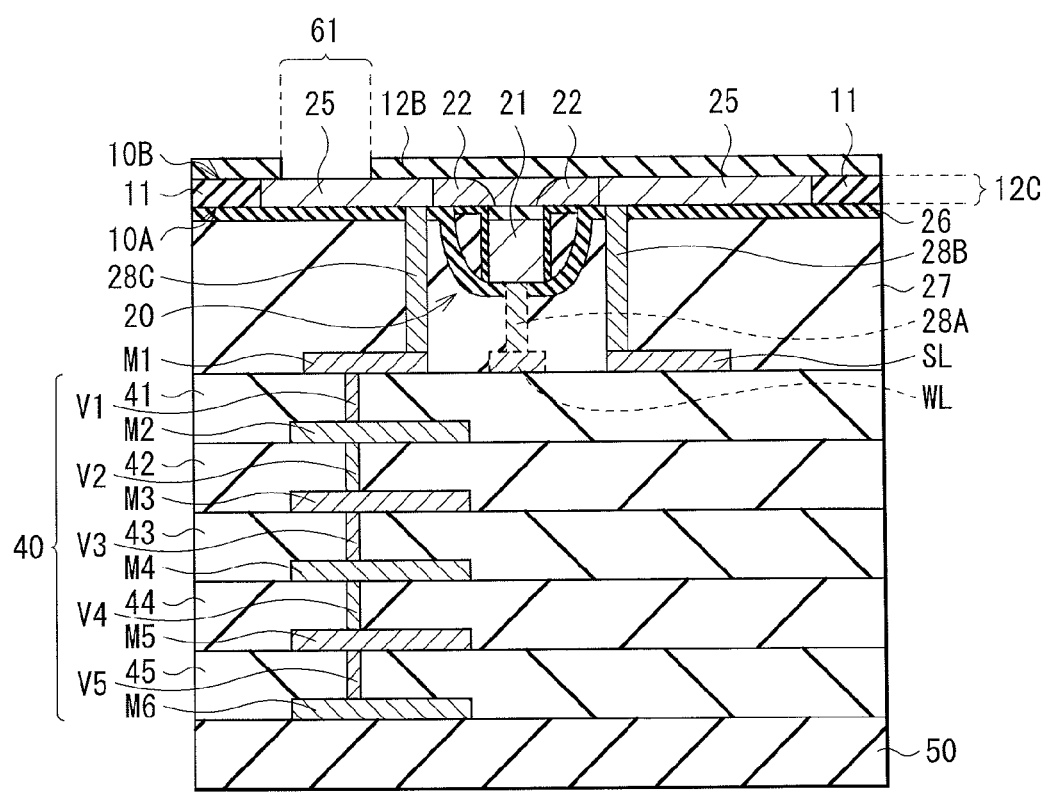
FIG. 41 is a cross-sectional diagram illustrating a process following the process in FIG. 40.

Next, as illustrated in FIG. 41, the opening 61 is provided in the embedded oxide film 12B, to face the silicide layer 25, by the process illustrated in FIG. 9

Figure 42:
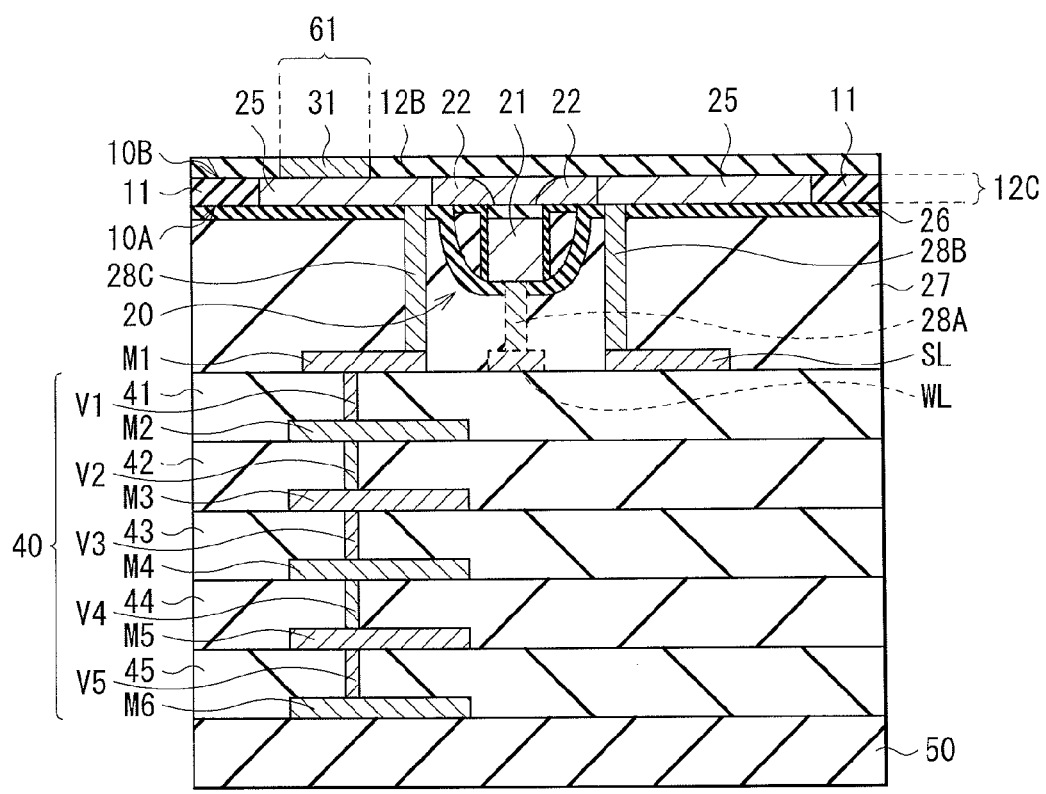
FIG. 42 is a cross-sectional diagram illustrating a process following the process in FIG. 41.
Figure 43:
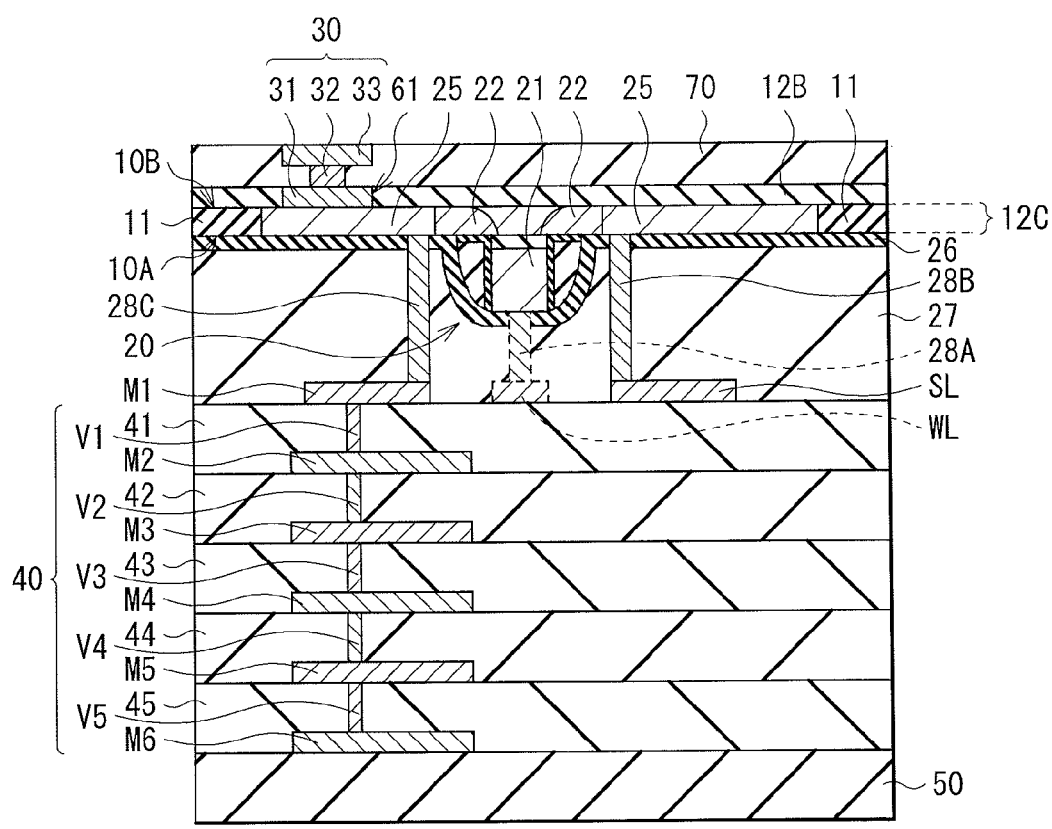
FIG. 43 is a cross-sectional diagram illustrating a process following the process in FIG. 42.

After the opening 61 is provided in the embedded oxide film 12B, in a manner similar to that of the first embodiment, the first electrode 31 made of the above-described material is embedded in the opening 61, and the memory section 32 and the second electrode 33 are formed on the first electrode 31, by the processes illustrated in FIGS. 10 and 11, as illustrated in FIGS. 42 and 43. The resistance change element 30 directly connected to the silicide layer 25 through the opening 61 is thus formed. Around the memory section 32 and the second electrode 33, the back-surface interlayer film 70 is formed. The semiconductor device 1 illustrated in FIG. 1 is thus completed.

In this way, in the present modification, the transistor 20 is formed using the SOI substrate 12. Therefore, it is easy to secure a margin, as compared with a case of using the semiconductor substrate 10 of a bulk type.

It is to be noted that the method of manufacturing of the Modification 1 is also applicable to the present modification.

Modification 3

Figure 44:
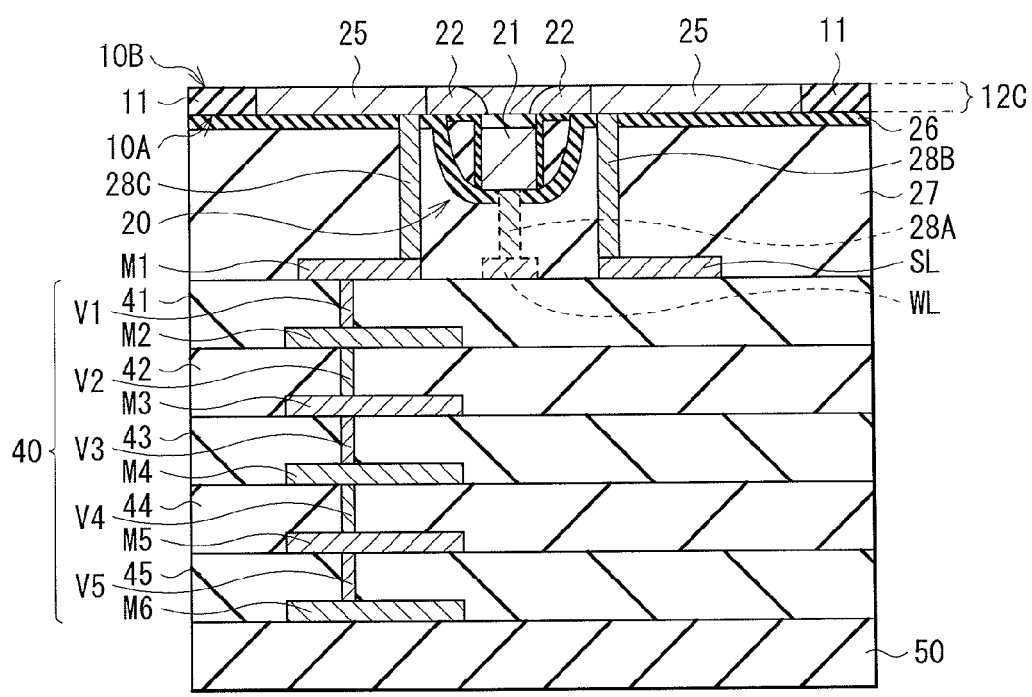
FIG. 44 is a cross-sectional diagram illustrating a process in a method of manufacturing a semiconductor device according to Modification 3 of the present disclosure.

FIG. 44 illustrates a process of the method of manufacturing a semiconductor device according to Modification 3 of the present disclosure. The present modification is different from the method of manufacturing of Modification 2, in that the embedded oxide film 12B is removed, and the insulating film 60 is newly formed. It is to be noted that any of the semiconductor devices 1, 1A, 1B, and 1C of the above-described first to fourth embodiments may be manufactured by this method of manufacturing. Here, a case of forming the semiconductor device 1 of the first embodiment will be described as an example. In addition, processes overlapping those of the above-described Modification 2 will be described with reference to FIGS. 38 to 43, and processes overlapping those of the above-described first embodiment will be described with reference to FIGS. 4 to 11.

First, in a manner similar to that of Modification 2, the transistor 20 is formed on the semiconductor substrate 12C of the SOI substrate 12, by the process illustrated in FIG. 38. Subsequently, in a manner similar to that of the first embodiment, the word line WL, the select line SL, the first metal layer M1, and the main-surface-side multilayer wiring section 40 are formed by the process illustrated in FIG. 4.

Next, in a manner similar to that of Modification 2, the semiconductor substrate 10 is reversed and the supporting substrate 50 is adhered on the main surface 10A side of the semiconductor substrate 10 by the process illustrated in FIG. 39. At this moment, the transistor 20 and the main-surface-side multilayer wiring section 40 are upside down.

Subsequently, in a manner similar to that of Modification 2, through the processes illustrated in FIGS. 39 and 40, the semiconductor substrate 10 may be polished from the back surface 10B side by, for example, CMP, and the polishing is stopped upon reaching the silicide layer 25.

Subsequently, as illustrated in FIG. 44, the embedded oxide film 12B may be removed by, for example, wet etching.

After the embedded oxide film 12B is removed, in a manner similar to that of the first embodiment, the insulating film 60 made of a film such as the above-described High-K film is formed to be in contact with the back surface 10B of the semiconductor substrate 10 and the back surface of the silicide layer 25, by the process illustrated in FIG. 8.

Subsequently, in a manner similar to that of the first embodiment, the opening 61 is provided in the insulating film 60, to face the silicide layer 25, by the process illustrated in FIG. 9.

After the opening 61 is provided in the insulating film 60, in a manner similar to that of the first embodiment, the first electrode 31 made of the above-described material is embedded in the opening 61 by the process illustrated in FIG. 10. Subsequently, the memory section 32 and the second electrode 33 are formed on the first electrode 31 by the process illustrated in FIG. 11. The resistance change element 30 directly connected to the silicide layer 25 through the opening 61 is thus formed. Around the memory section 32 and the second electrode 33, the back-surface interlayer film 70 is formed. The semiconductor device 1 illustrated in FIG. 1 is thus completed.

In this way, in the present modification, the insulating film 60 is formed after removing the embedded oxide film 12B. Therefore, the thickness of the insulating film 60 is reduced, which makes it possible to reduce the connection resistance further.

It is to be noted that the method of manufacturing of the Modification 1 is also applicable to the present modification.

Fifth Embodiment

Figure 45:
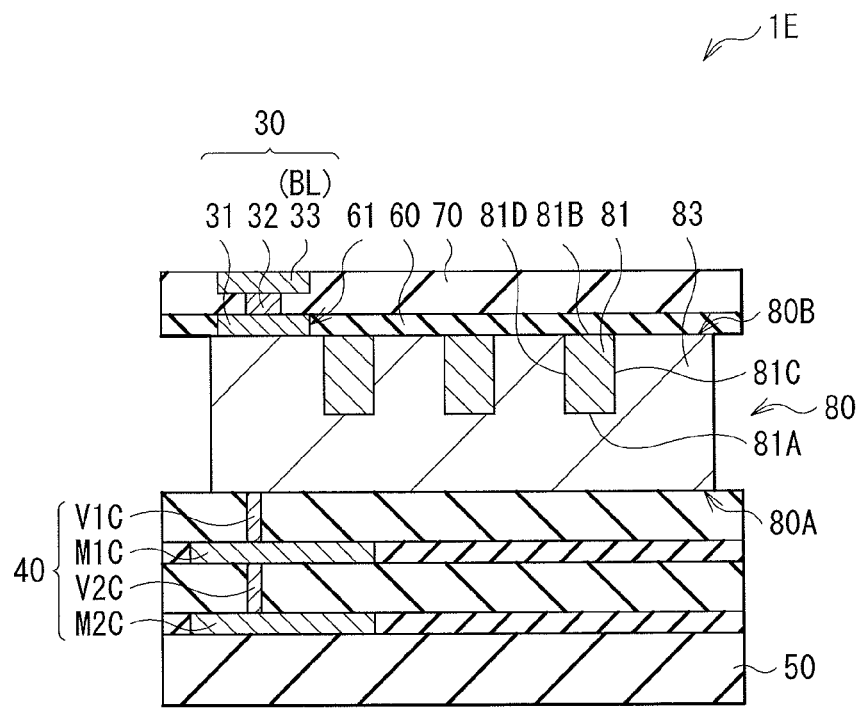
FIG. 45 is a cross-sectional diagram illustrating a configuration of a semiconductor device according to a fifth embodiment of the present disclosure, which is a diagram of a cross section taken along a source wiring of a transistor.
Figure 46:
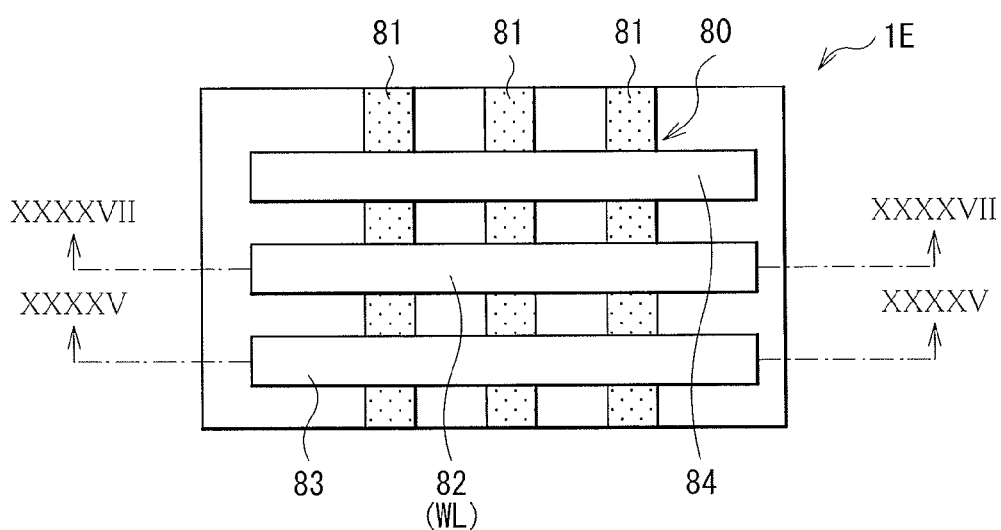
FIG. 46 is a plan view of the semiconductor device illustrated in FIG. 45.
Figure 47:
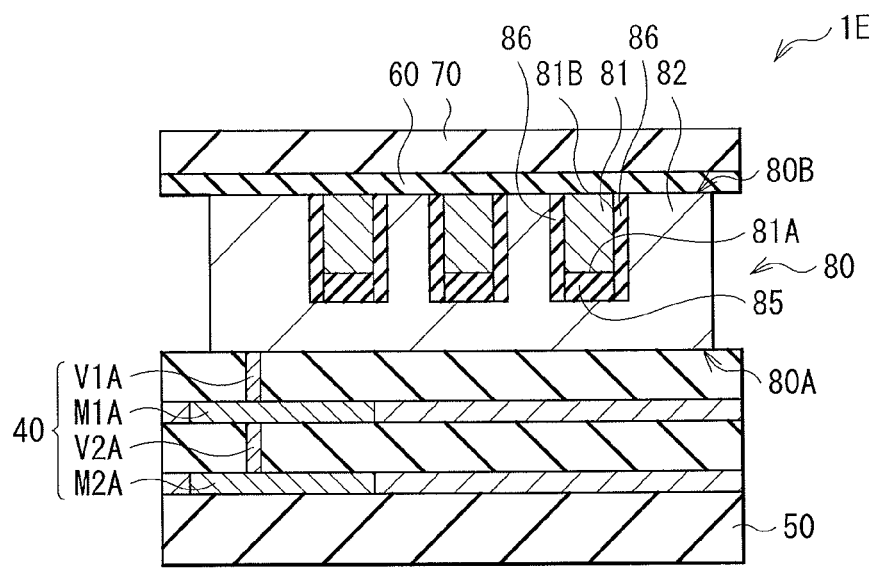
FIG. 47 is a cross-sectional diagram of another cross section of the semiconductor device illustrated in FIG. 45, which is a diagram of a cross section taken along a gate wiring of the transistor.

FIG. 45 illustrates a cross-sectional configuration of a semiconductor device 1E according to a fifth embodiment of the present disclosure. FIG. 46 illustrates a plane configuration of the semiconductor device 1E, and FIG. 45 corresponds to a cross section taken along a XXXXV-XXXXV line of FIG. 46. Further, FIG. 47 illustrates a cross section taken along a XXXXVII-XXXXVII line of FIG. 46. The semiconductor device 1E includes a transistor 80, and the resistance change element 30 provided on a back surface 80B side of the transistor 80. The supporting substrate 50 is connected to a main surface side 80A of the transistor 80. It is to be noted that components corresponding to those of the semiconductor device 1 of the first embodiment are provided with the same reference numerals as those thereof.

The transistor 80 is a select transistor of the resistance change element 30. The transistor 80 may be, for example, a fin field-effect transistor (Fin FET) including a fin 81 made of Si, a gate wiring 82, a source wiring 83, and a drain wiring 84. Use of the Fin FET makes it possible to suppress short-channel properties, as compared with a planar transistor on a bulk substrate. The gate wiring 82 also serves as the word line WL of the resistance change element 30.

Here, the source wiring 83 corresponds to a specific but not limitative example of "metal wiring" according to an embodiment of the present disclosure.

The fin 81 is extended in a first direction (a vertical direction of FIG. 46), and has a rectangular cross section. A plurality of the fins 81 are provided in parallel with each other.

The gate wiring 82, the source wiring 83, and the drain wiring 84 cover surfaces (a surface 81A and two side faces 81C and 81D) except a back surface 81B of each of the fins 81, and are extended in a second direction (a lateral direction of FIG. 46) different from the first direction. Between the gate wiring 82 and the surface 81A of each of the fins 81, an insulating film 85 is provided. Between the gate wiring 82 and the side faces 81C and 81D of the fin 81, a gate insulating film 86 is provided. The gate wiring 82, the source wiring 83, and the drain wiring 84 are each configured using an element such as W, Ti, Cu, and Al.

On the main surface 80A side of the gate wiring 82, the main-surface-side multilayer wiring section 40 to which wirings M1A and M2A are connected by vias V1A and V2A is provided. On the main surface 80A side of the drain wiring 84, the main-surface-side multilayer wiring section 40 to which wirings are connected to through vias is provided, although this is not illustrated. The source wiring 83 is provided with the main-surface-side multilayer wiring section 40 to which wirings M1C and M2C are connected by vias V1C and V2C.

Further, in the semiconductor device 1E, the insulating film 60 is provided in contact with the back surface 81B of each of the fins 81 and a back surface of each of the gate wiring 82, the source wiring 83, and the drain wiring 84. The insulating film 60 has the opening 61 facing the source wiring 83, and the resistance change element 30 is connected to the source wiring 83 through the opening 61. This allows a reduction in the connection resistance in the semiconductor device 1E.

The insulating film 60 is configured in a manner similar to that of the first embodiment.

The resistance change element 30 may include, for example, the first electrode 31, the memory section 32, and the second electrode 33 in this order from a side close to a back surface 83B of the source wiring 83. Preferably, the first electrode 31 may be embedded in the opening 61, and connected to the source wiring 83. This is because it is possible to reduce the connection resistance further, by bringing the first electrode 31 and the source wiring 83 into direct contact with each other to be connected.

Around the memory section 32 and the second electrode 33, the back-surface interlayer film 70 is provided in a manner similar to that of the first embodiment.

The resistance change element 30 may be configured, for example, using a STT-MTJ, in a manner similar to that of the first embodiment. The memory section 32 may have, for example, a configuration similar to that described with reference to FIGS. 2 and 3 in the first embodiment.

The semiconductor device 1E may be manufactured as follows, for example.

FIGS. 48 to 55 illustrate a method of manufacturing the semiconductor device 1E, in process order. It is to be noted that FIGS. 48 to 55 each illustrate a cross section (a cross section taken along the source wiring 83) similar to that in FIG. 45.

Figure 48:
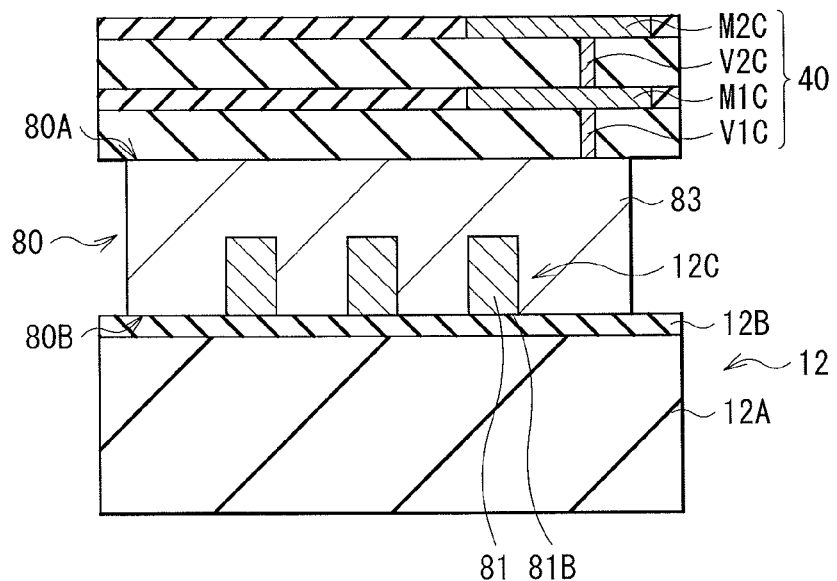
FIG. 48 is a cross-sectional diagram illustrating a process of a method of manufacturing the semiconductor device illustrated in FIG. 45.

First, as illustrated in FIG. 48, the SOI substrate 12 is prepared. The SOI substrate 12 includes the carrier substrate 12A, and the embedded oxide film 12B as well as the semiconductor substrate 12C that are provided on the one surface side of the carrier substrate 12A. Each of the fins 81 extended in the first direction is formed by patterning the semiconductor substrate 12C. Next, on each of the fins 81 and the embedded oxide film 12B, a not-illustrated metallic material film is formed. The gate wiring 82, the source wiring 83, and the drain wiring 84 covering the surfaces of each of the fins 81 except the back surface 81B and being extended in the second direction are formed by patterning this metallic material film. The transistor 80 is thus formed.

Next, as illustrated in FIG. 48, the main-surface-side multilayer wiring section 40 to which the wirings M1C and M2C are connected by the vias V1C and V2C is formed on the main surface 80A side of the source wiring 83. Further, the main-surface-side multilayer wiring section 40 to which the wirings M1A and M2A are connected by the vias V1A and V2A is formed on the main surface 80A side of the gate wiring 82, although this is not illustrated in FIG. 48. On the main surface 80A side of the drain wiring 84, the main-surface-side multilayer wiring section 40 to which the wirings are connected by the vias is formed, although this is not illustrated in FIG. 48.

Figure 49:
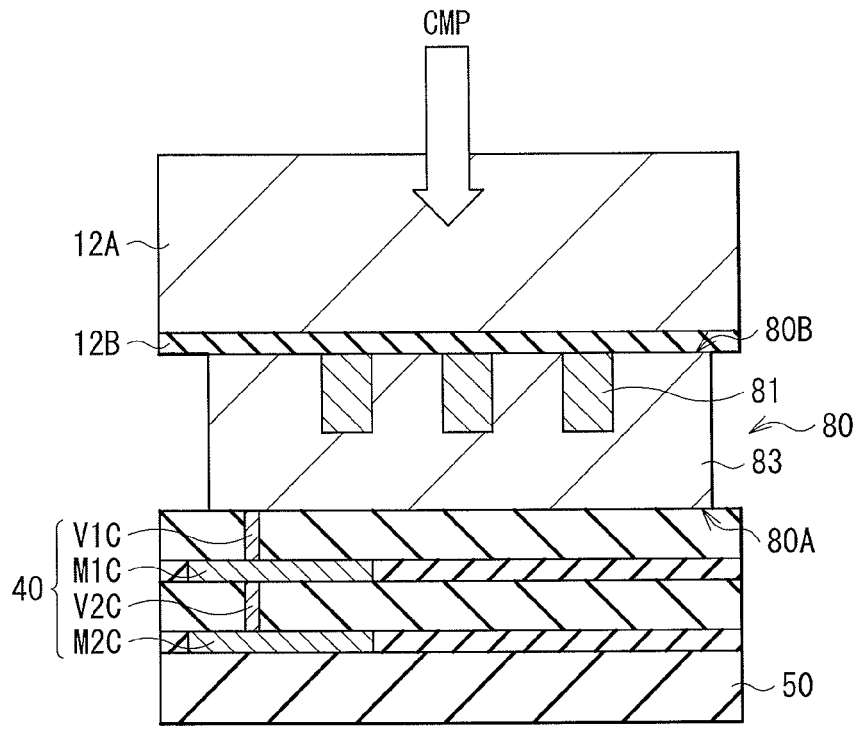
FIG. 49 is a cross-sectional diagram illustrating a process following the process in FIG. 48.

Subsequently, as illustrated in FIG. 49, the transistor 80 is reversed, and the supporting substrate 50 is adhered on the main surface 80A side of the transistor 80, in a manner similar to that of the first embodiment. At this moment, the transistor 80 and the wirings on the main surface 80A side are upside down.

Figure 50:
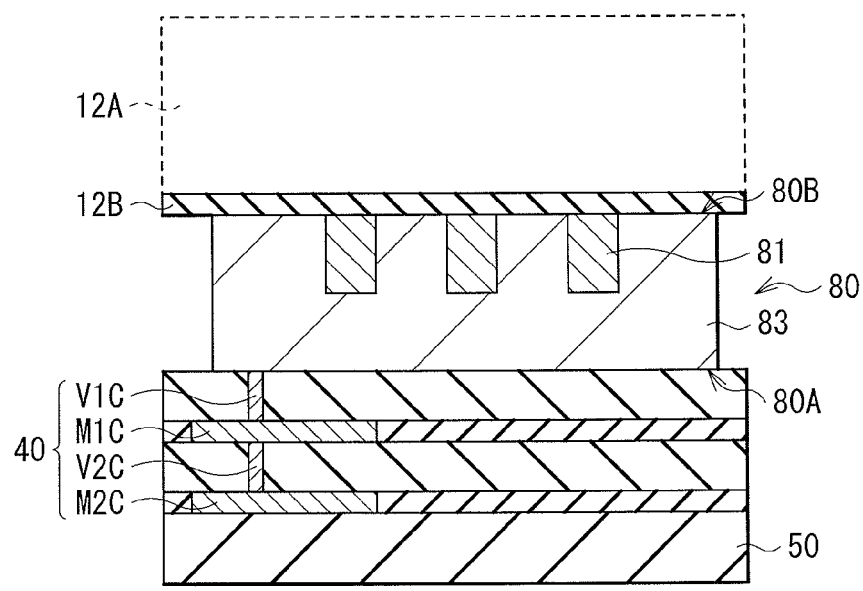
FIG. 50 is a cross-sectional diagram illustrating a process following the process in FIG. 49.
Figure 51:
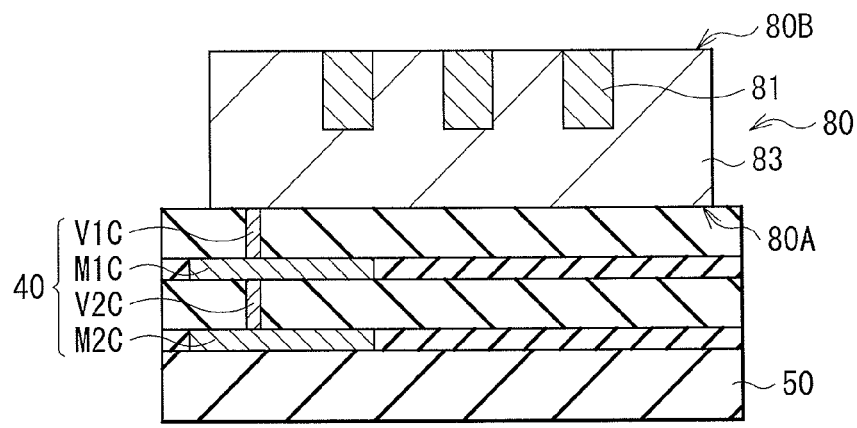
FIG. 51 is a cross-sectional diagram illustrating a process following the process in FIG. 50.

Next, as illustrated in FIG. 49, the carrier substrate 12A may be polished from the back-surface side by, for example, CMP. The polishing is then stopped, upon reaching the embedded oxide film 12B, as illustrated in FIG. 50. Afterwards, as illustrated in FIG. 51, the embedded oxide film 12B may be removed by, for example, wet etching.

Figure 52:
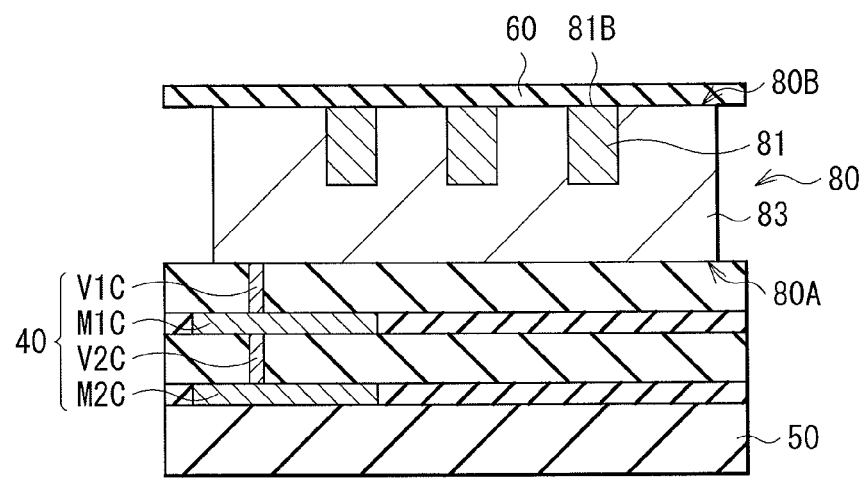
FIG. 52 is a cross-sectional diagram illustrating a process following the process in FIG. 51.

After the embedded oxide film 12B is removed, the insulating film 60 is formed to be in contact with the back surface 81B of each of the fins 81 and the back surface of each of the gate wiring 82, the source wiring 83, and the drain wiring 84, as illustrated in FIG. 52. Thus forming the insulating film 60 after removing the embedded oxide film 12B reduces the thickness of the insulating film 60, thereby allowing a further reduction in the connection resistance.

Figure 53:
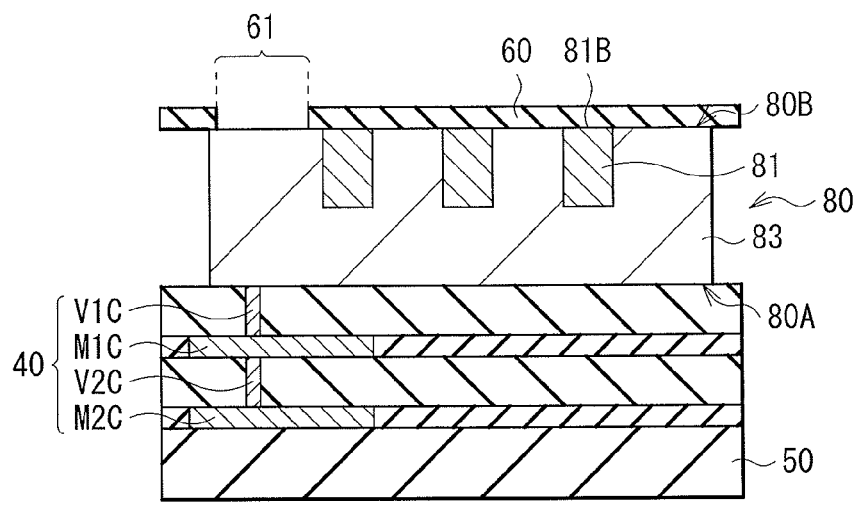
FIG. 53 is a cross-sectional diagram illustrating a process following the process in FIG. 52.

Subsequently, as illustrated in FIG. 53, the opening 61 is provided in the insulating film 60, to face the source wiring 83.

Figure 54:
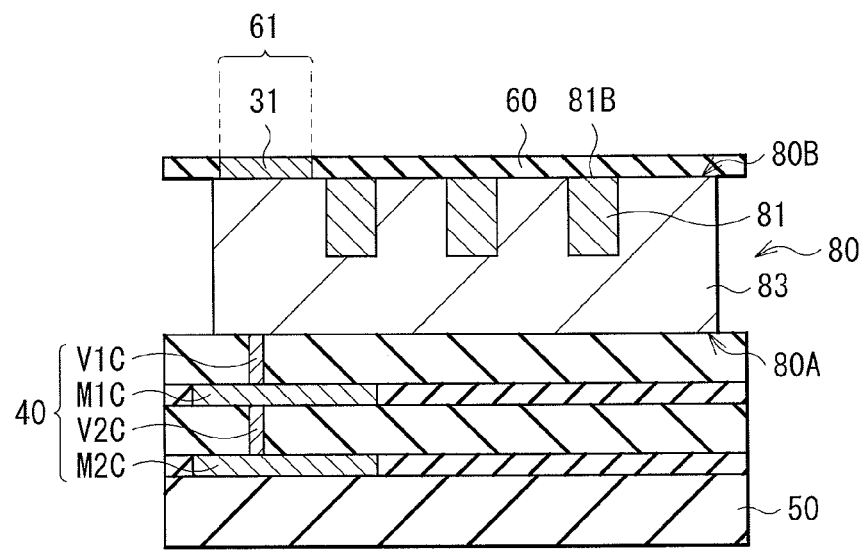
FIG. 54 is a cross-sectional diagram illustrating a process following the process in FIG. 53.
Figure 55:
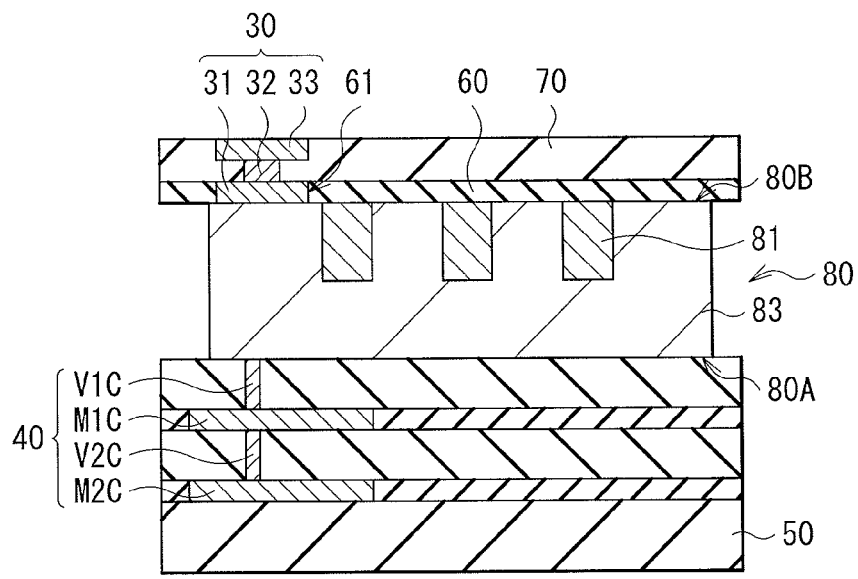
FIG. 55 is a cross-sectional diagram illustrating a process following the process in FIG. 54.

After the opening 61 is provided in the insulating film 60, the first electrode 31 is embedded in the opening 61, as illustrated in FIG. 54. Subsequently, as illustrated in FIG. 55, the memory section 32 and the second electrode 33 are formed on the first electrode 31, in a manner similar to that of the first embodiment. The resistance change element 30 connected to the source wiring 83 through the opening 61 is thus formed. Around the memory section 32 and the second electrode 33, the back-surface interlayer film 70 is formed. The semiconductor device 1E illustrated in FIGS. 45 to 47 is thus completed.

In the semiconductor device 1E, in a manner similar to that of the first embodiment, a current is applied in the film-surface vertical direction of the memory section 32, corresponding to HIGH or LOW of an electric potential between the select line SL and the bit line BL, thereby causing spin torque magnetization reversal. As a result, the direction of the magnetization M32D of the memory layer 32D is made parallel or antiparallel with the magnetization M32B of the magnetization fixed layer 32B, to perform writing of information by changing the resistance value of the memory section 32 between a large value and a small value.

Here, the resistance change element 30 is connected to the source wiring 83 of the transistor 80 through the opening 61 of the insulating film 60. Therefore, the connection resistance between the resistance change element 30 and the transistor 80 is reduced by direct metal bonding between the first electrode 31 and the source wiring 83.

In this way, in the present embodiment, the resistance change element 30 is connected to the source wiring 83 of the transistor 80, through the opening 61 of the insulating film 60. Therefore, it is possible to reduce the connection resistance between the resistance change element 30 and the transistor 80 further, by the metal bonding without interposition of a silicide layer. This allows the resistance change element 30 to operate at a high speed. Above all, the present embodiment is very suitable for a case in which a STT-MTJ made of a low heat-resistant magnetic material is used as the resistance change element 30.

In addition, the insulating film 60 is formed after the embedded oxide film 12B is removed. Therefore, the thickness of the insulating film 60 is reduced, which makes it possible to reduce the connection resistance further.

In the future, a shift from Si materials to InGaAs-based materials for NFETs and to Ge-based materials for PFETs is expected to occur, due to further advancement of technology node. Even when this shift occurs, a configuration similar to that described above is allowed if each of a gate, a source, and a drain is a Fin FET or a Tri-gate FET to be described later having a metal trench structure.

In the present embodiment, a Fin FET having a high current drive ability is allowed to be used as the transistor 80. Therefore, applying the transistor 80 to the select transistor of the resistance change element 30 allows high-speed reading and writing.

Modification 4

FIGS. 56 to 64 illustrate a method of manufacturing a semiconductor device according to Modification 4 of the present disclosure, in process order. The present modification is different from the method of manufacturing of the fifth embodiment, in that the transistor 80 is fabricated using the semiconductor substrate 10 of a bulk type. Therefore, processes overlapping those of the fifth embodiment will be described with reference to FIGS. 48 to 55. It is to be noted that FIGS. 56 to 64 each illustrates a cross section (a cross section in the source wiring 83) similar to that in FIG. 45.

Figure 56:
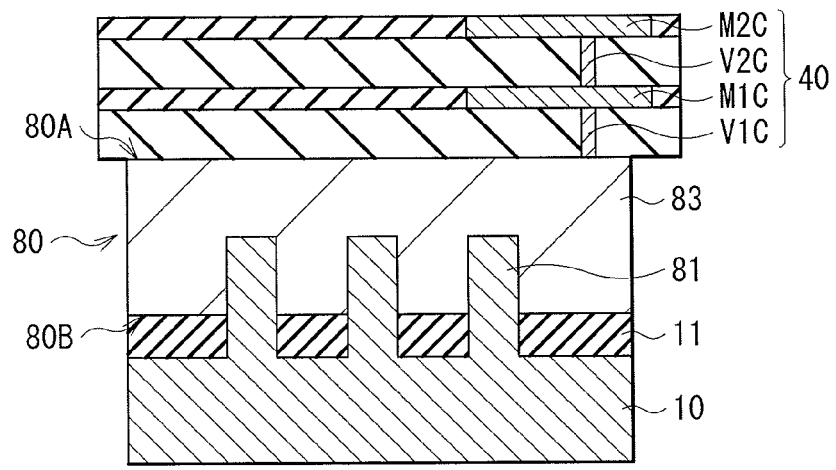
FIG. 56 is a cross-sectional diagram illustrating a process of a method of manufacturing a semiconductor device according to Modification 4 of the present disclosure.

First, as illustrated in FIG. 56, the semiconductor substrate 10 is prepared, and the fins 81 extended in the first direction are formed on the main surface 10A side of the semiconductor substrate 10. Between the fins 81, the element separating layer 11 is formed. In this process, assuming that back-surface polishing is to be performed, the depth of the fins 81 is made shallow and the height of the element separating layers 11 is made high, beforehand. Next, a not-illustrated metallic material film is formed on each of the fins 81 and the element separating layers 11. The gate wiring 82, the source wiring 83, and the drain wiring 84 covering the surfaces of each of the fins 81 except the back surface 81B and being extended in the second direction are formed by patterning this metallic material film. The transistor 80 is thus formed.

Next, as illustrated in FIG. 56, the main-surface-side multilayer wiring section 40 to which the wirings M1C and M2C are connected by the vias V1C and V2C is formed on the main surface 80A side of the source wiring 83. Further, the main-surface-side multilayer wiring section 40 to which the wirings M1A and M2A are connected by the vias V1A and V2A is formed on the main surface 80A side of the gate wiring 82, although this is not illustrated in FIG. 56. On the main surface 80A side of the drain wiring 84, the main-surface-side multilayer wiring section 40 to which wirings are connected by vias is formed, although this is not illustrated in FIG. 56.

Figure 57:
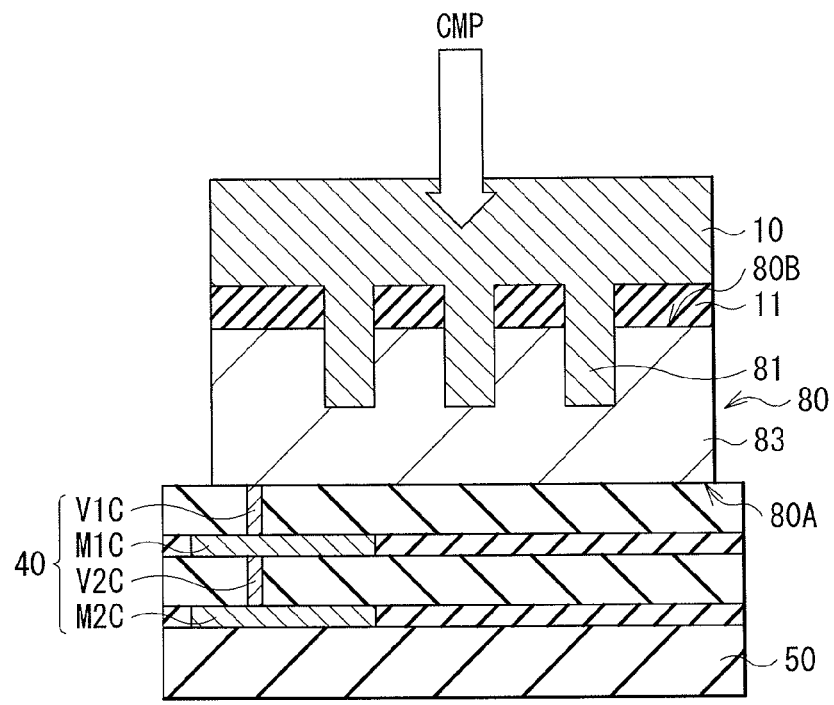
FIG. 57 is a cross-sectional diagram illustrating a process following the process in FIG. 56.

Subsequently, as illustrated in FIG. 57, the transistor 80 is reversed, and the supporting substrate 50 is adhered on the main surface 80A side of the transistor 80, in a manner similar to that of the first embodiment. At this moment, the transistor 80 and the wirings on the main surface 80A side are upside down.

Figure 58:
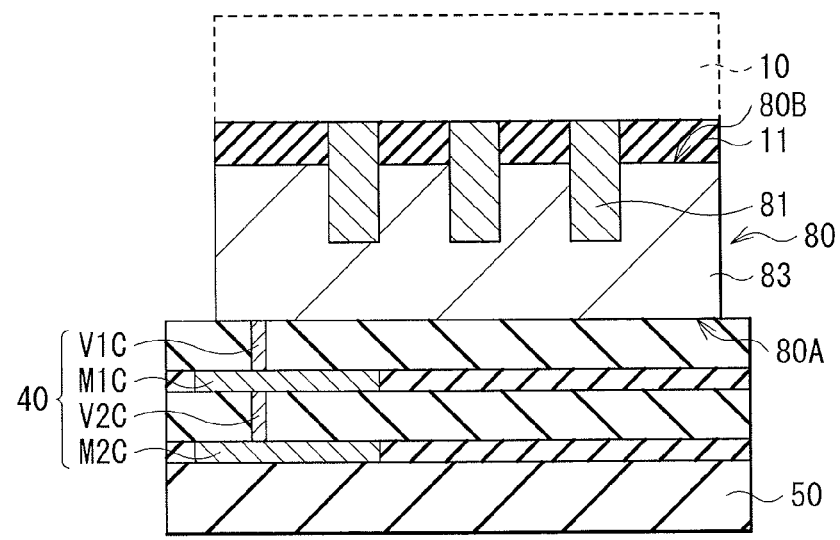
FIG. 58 is a cross-sectional diagram illustrating a process following the process in FIG. 57.

Subsequently, as illustrated in FIG. 57, the semiconductor substrate 10 may be polished from the back surface 10B side by, for example, CMP. As illustrated in FIG. 58, this polishing in a first stage is then stopped, upon reaching the element separating layers 11.

Figure 59:
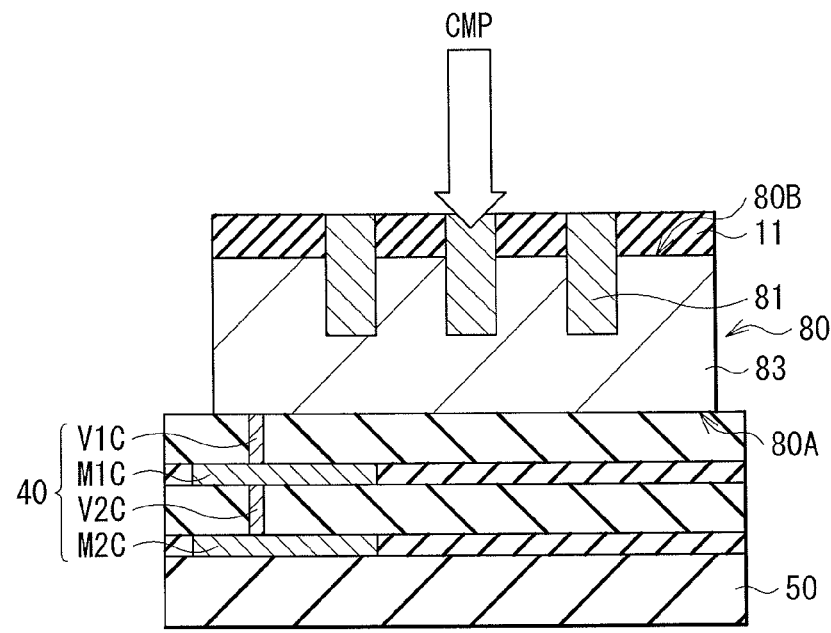
FIG. 59 is a cross-sectional diagram illustrating a process following the process in FIG. 58.
Figure 60:
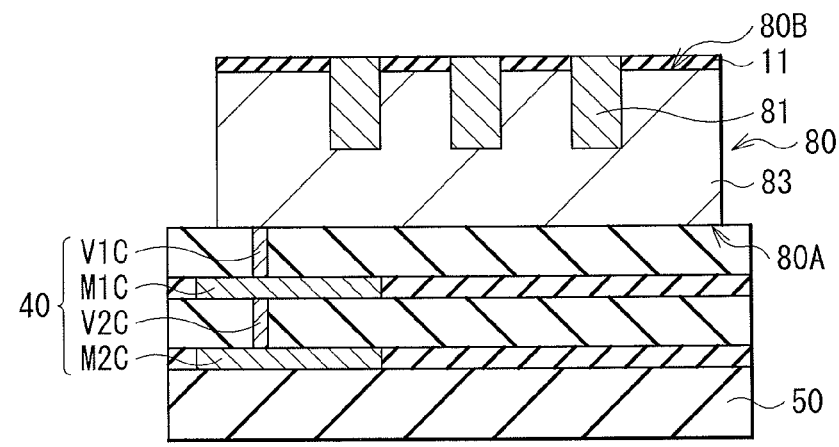
FIG. 60 is a cross-sectional diagram illustrating a process following the process in FIG. 59.

Next, as illustrated in FIG. 59, polishing in a second stage may be performed by, for example, CMP. As illustrated in FIG. 60, the polishing in the second stage is then stopped, by leaving a part in a thickness direction of the element separating layers 11.

Figure 61:
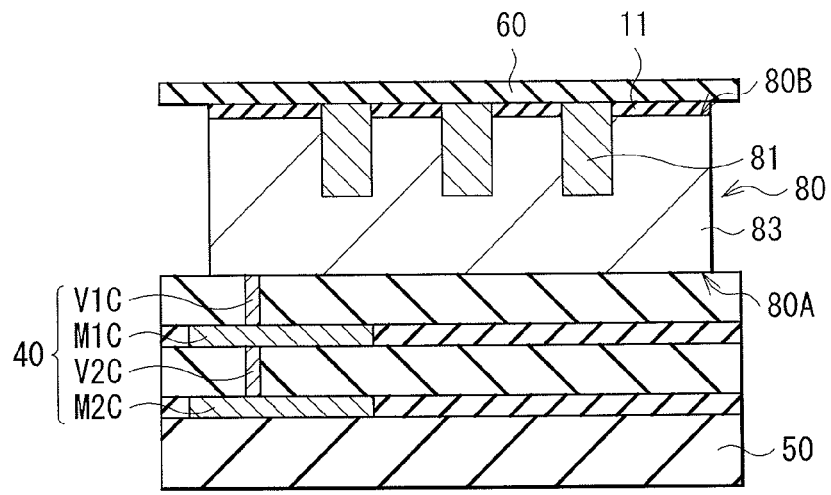
FIG. 61 is a cross-sectional diagram illustrating a process following the process in FIG. 60.

After the polishing in the second stage is stopped, the insulating film 60 is formed to be in contact with the back surface 81B of each of the fins 81 and the back surface of each of the element separating layers 11, as illustrated in FIG. 61.

Figure 62:
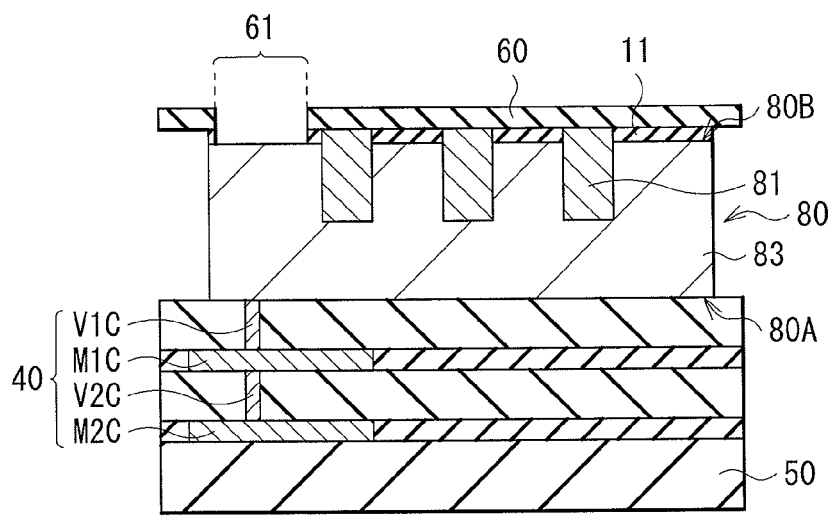
FIG. 62 is a cross-sectional diagram illustrating a process following the process in FIG. 61.

Subsequently, as illustrated in FIG. 62, the opening 61 is provided in the insulating film 60 and the element separating layer 11, to face the source wiring 83.

Figure 63:
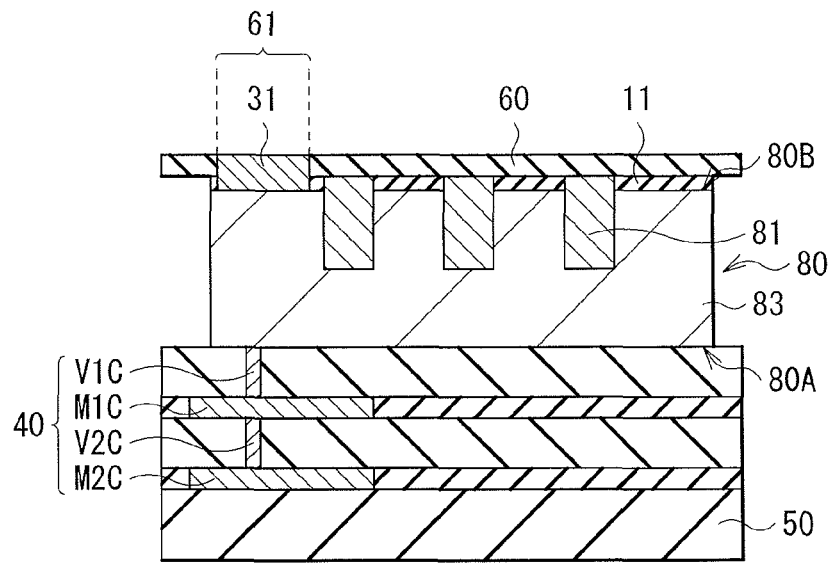
FIG. 63 is a cross-sectional diagram illustrating a process following the process in FIG. 62.
Figure 64:
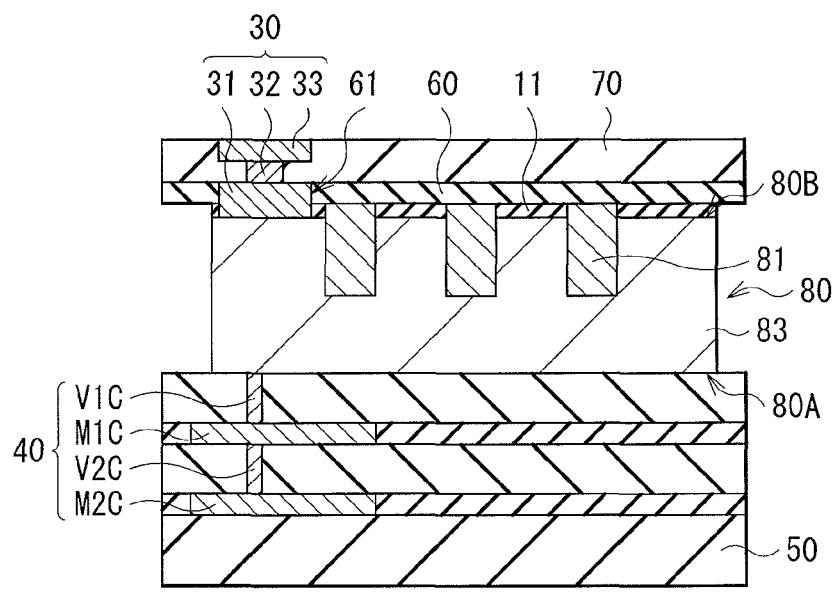
FIG. 64 is a cross-sectional diagram illustrating a process following the process in FIG. 63.

After the opening 61 is provided in the insulating film 60 and the element separating layer 11, the first electrode 31 is embedded in the opening 61, as illustrated in FIG. 63. Subsequently, as illustrated in FIG. 64, the memory section 32 and the second electrode 33 are formed on the first electrode 31, in a manner similar to that of the first embodiment. The resistance change element 30 connected to the source wiring 83 through the opening 61 is thus formed. Around the memory section 32 and the second electrode 33, the back-surface interlayer film 70 is formed. The semiconductor device 1E illustrated in FIGS. 45 to 47 is thus completed.

Modification 5

FIGS. 65 to 69 illustrate a method of manufacturing a semiconductor device according to Modification 5 of the present disclosure, in process order. The method of manufacturing the present modification is different from that of the above-described Modification 4, in that a whole part in the thickness direction of the element separating layers 11 is removed by the polishing in the second stage. Therefore, processes overlapping those of Modification 4 will be described with reference to FIGS. 56 to 64. It is to be noted that FIGS. 65 to 69 each illustrate a cross section similar to that in FIG. 45.

First, in a manner similar to that of Modification 4, the semiconductor substrate 10 is prepared, and the transistor 80 having the fins 81, the gate wiring 82, the source wiring 83, and the drain wiring 84 is formed on the main surface 10A side of the semiconductor substrate 10, by the process illustrated in FIG. 56.

Subsequently, in a manner similar to that of Modification 4, the main-surface-side multilayer wiring section 40 to which the wirings M1C and M2C are connected by the vias V1C and V2C is formed on the main surface 80A side of the source wiring 83, by the process illustrated in FIG. 56. Further, the main-surface-side multilayer wiring section 40 to which the wirings M1A and M2A are connected by the vias V1A and V2A is formed on the main surface 80A side of the gate wiring 82, although this is not illustrated in FIG. 56. On the main surface 80A side of the drain wiring 84, the main-surface-side multilayer wiring section 40 to which the wirings are connected by the vias is formed, although this is not illustrated in FIG. 56.

Subsequently, in a manner similar to that of Modification 4, the transistor 80 is reversed, and the supporting substrate 50 is adhered on the main surface 80A side of the transistor 80, by the process illustrated in FIG. 57. At this moment, the transistor 80 and the wirings on the main surface 80A side are upside down.

Subsequently, in a manner similar to that of Modification 4, the semiconductor substrate 10 may be polished from the back surface 10B side by, for example, CMP, and this polishing in a first stage is then stopped upon reaching the element separating layers 11, in the processes illustrated in FIGS. 57 and 58.

Figure 65:
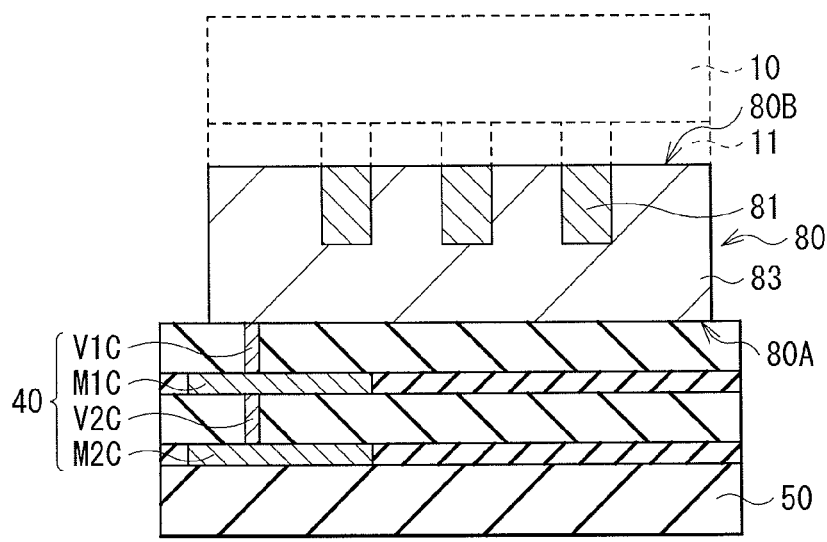
FIG. 65 is a cross-sectional diagram illustrating a process of a method of manufacturing a semiconductor device according to Modification 5 of the present disclosure.

Next, as illustrated in FIG. 65, polishing in a second stage may be performed by, for example, CMP, and the polishing in the second stage is then stopped after removing leaving the whole part in the thickness direction of the element separating layers 11.

Figure 66:
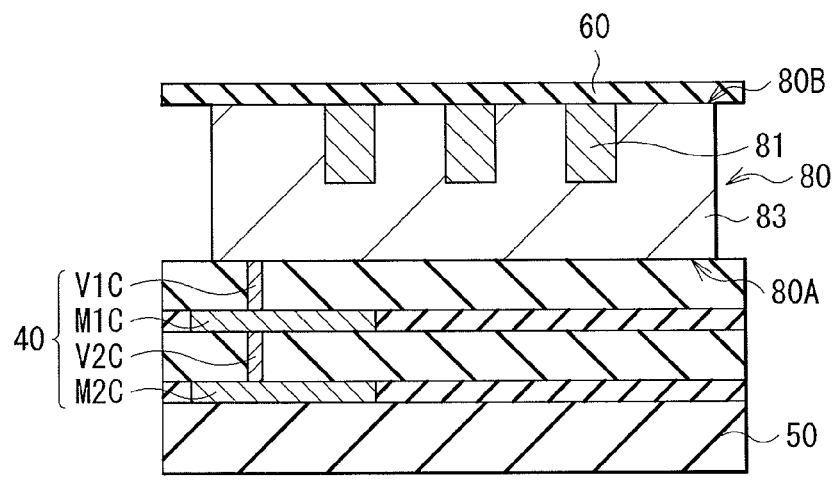
FIG. 66 is a cross-sectional diagram illustrating a process following the process in FIG. 65.

After the polishing in the second stage is stopped, the insulating film 60 is formed to be in contact with the back surface 81B of each of the fins 81 and the back surface of each of the gate wiring 82, the source wiring 83, and the drain wiring 84, as illustrated in FIG. 66.

Figure 67:
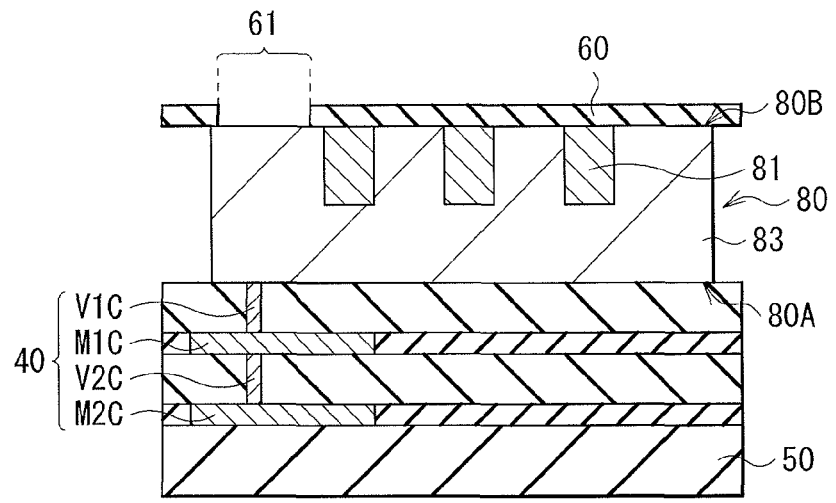
FIG. 67 is a cross-sectional diagram illustrating a process following the process in FIG. 66.

Next, as illustrated in FIG. 67, the opening 61 is provided in the insulating film 60, to face the source wiring 83.

Figure 68:
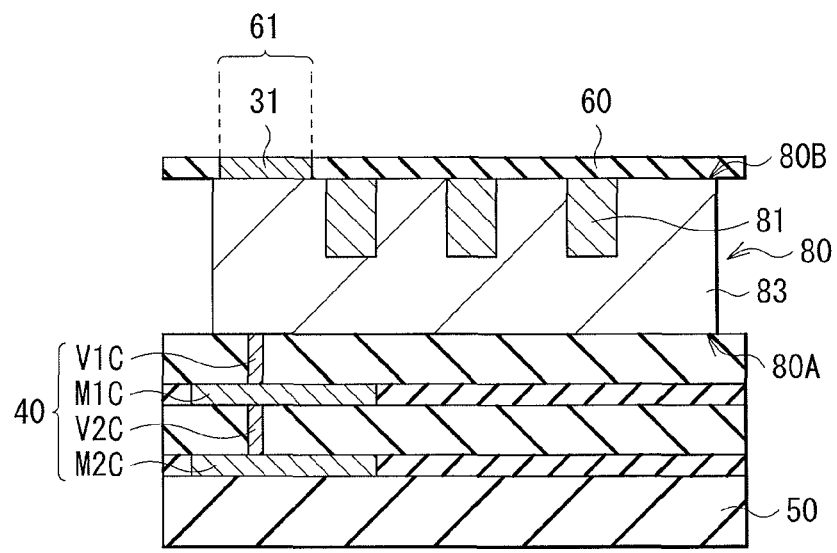
FIG. 68 is a cross-sectional diagram illustrating a process following the process in FIG. 67.
Figure 69:
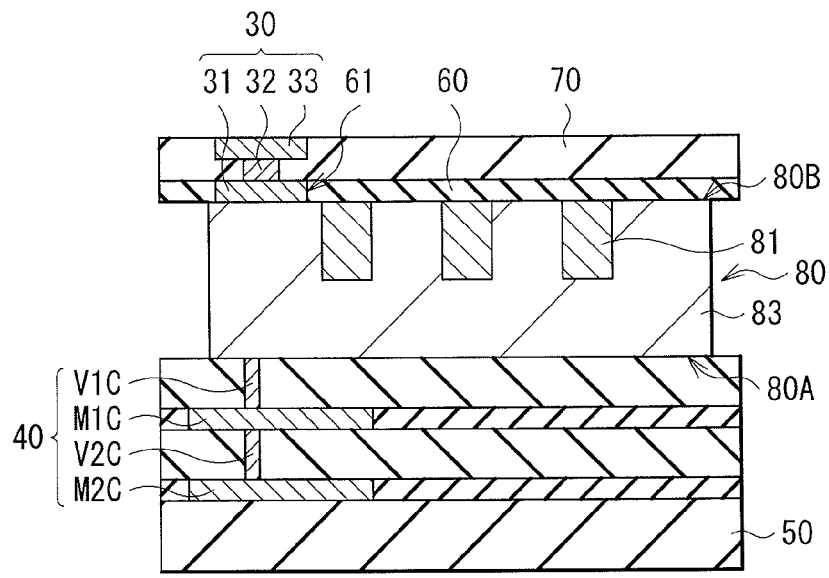
FIG. 69 is a cross-sectional diagram illustrating a process following the process in FIG. 68.

After the opening 61 is provided in the insulating film 60, the first electrode 31 is embedded in the opening 61, as illustrated in FIG. 68. Subsequently, as illustrated in FIG. 69, the memory section 32 and the second electrode 33 are formed on the first electrode 31, in a manner similar to that of the first embodiment. The resistance change element 30 connected to the source wiring 83 through the opening 61 is thus formed. Around the memory section 32 and the second electrode 33, the back-surface interlayer film 70 is formed. The semiconductor device 1E illustrated in FIGS. 45 to 47 is thus completed.

Sixth Embodiment

Figure 70:
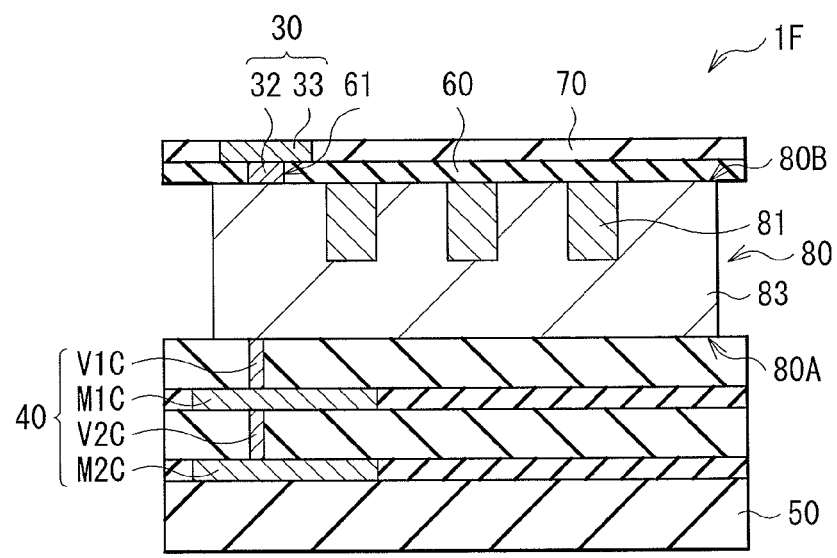
FIG. 70 is a cross-sectional diagram illustrating a configuration of a semiconductor device according to a sixth embodiment of the present disclosure.

FIG. 70 illustrates a cross-sectional configuration of a semiconductor device 1F according to a sixth embodiment of the present disclosure. The present embodiment is different from the fifth embodiment, in that the memory section 32 of the resistance change element 30 is embedded in the opening 61 of the insulating film 60 and connected to the source wiring 83. In the present embodiment, the first electrode 31 is omitted, and the primary layer 32A of the memory section 32 is directly provided on the source wiring 83. Therefore, the number of processes is reduced, which makes it possible to reduce production cost. Except this point, the semiconductor device 1F of the present embodiment has a configuration and functions similar to those of the fifth embodiment, and may be manufactured in a manner similar to that of the fifth embodiment.

Seventh Embodiment

Figure 71:
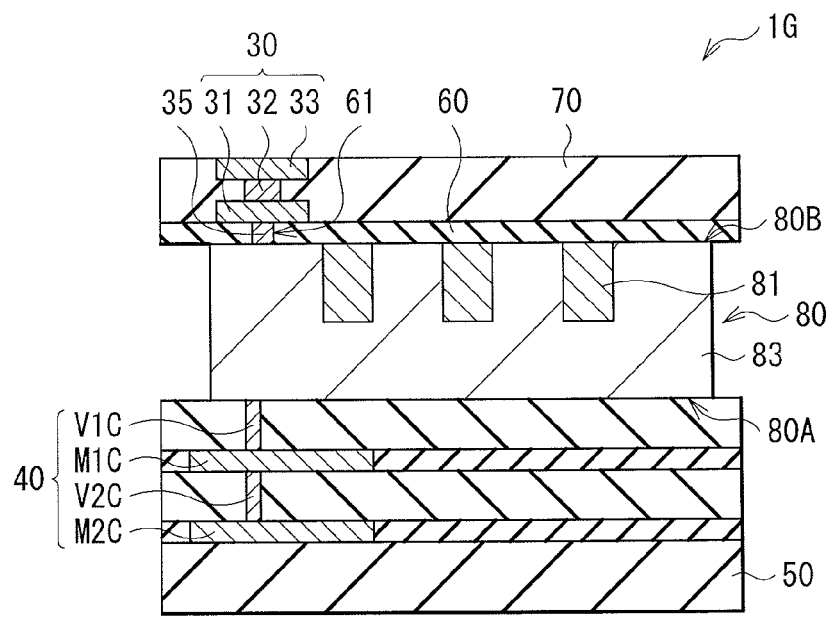
FIG. 71 is a cross-sectional diagram illustrating a configuration of a semiconductor device according to a seventh embodiment of the present disclosure.

FIG. 71 illustrates a cross-sectional configuration of a semiconductor device 1G according to a seventh embodiment of the present disclosure. The present embodiment is different from the fifth embodiment, in that the first electrode 31 of the resistance change element 30 is connected to the source wiring 83 by the conductive connection section 35 embedded in the opening 61 of the insulating film 60. Except this point, the semiconductor device 1G of the present embodiment has a configuration and functions similar to those of the fifth embodiment, and may be manufactured in a manner similar to that of the fifth embodiment.

In the present embodiment, the insulating film 60 may have, for example, a thickness of about a few nanometers, and may preferably have a thickness of, specifically, 2 nm or more and 10 nm or less. The thickness of the insulating film 60 is considerably reduced to lower the resistance of the conductive connection section 35 itself. Therefore, it is possible to reduce the connection resistance, like the fifth embodiment.

The conductive connection section 35 is configured in a manner similar to that of the second embodiment.

In the present embodiment, the first electrode 31 of the resistance change element 30 is connected to the source wiring 83 by the conductive connection section 35 embedded in the opening 61 of the insulating film 60. Therefore, it is possible to form the resistance change element 30, without influence of minute irregularities of the source wiring 83.

Eighth Embodiment

Figure 72:
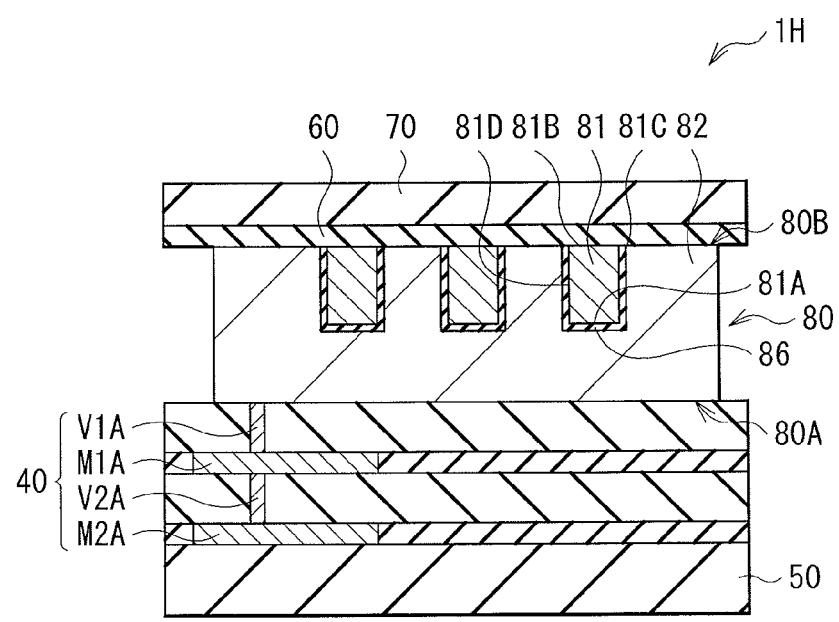
FIG. 72 is a cross-sectional diagram illustrating a configuration of a semiconductor device according to an eighth embodiment of the present disclosure, which is a diagram of a cross section taken along a gate wiring of a transistor.

FIG. 72 illustrates a cross-sectional configuration of a semiconductor device 1H according to an eighth embodiment of the present disclosure. The present embodiment is different from the fifth embodiment, in that the transistor 80 is a Tri-gate FET, and the gate insulating film 86 is provided between the gate wiring 82 and the surface 81A as well as and the two side faces 81C and 81D of the fin 81. It is to be noted that FIG. 72 illustrates a cross section taken along the gate wiring 82 of the transistor 80. Except this point, the semiconductor device 1H has a configuration and functions similar to those of the fifth embodiment. In addition, except that the gate insulating film 86 is formed on three surfaces of the fin 81 excluding the back surface 81B, the semiconductor device 1H may be manufactured in a manner similar to that of the fifth embodiment.

Ninth Embodiment

Figure 73:
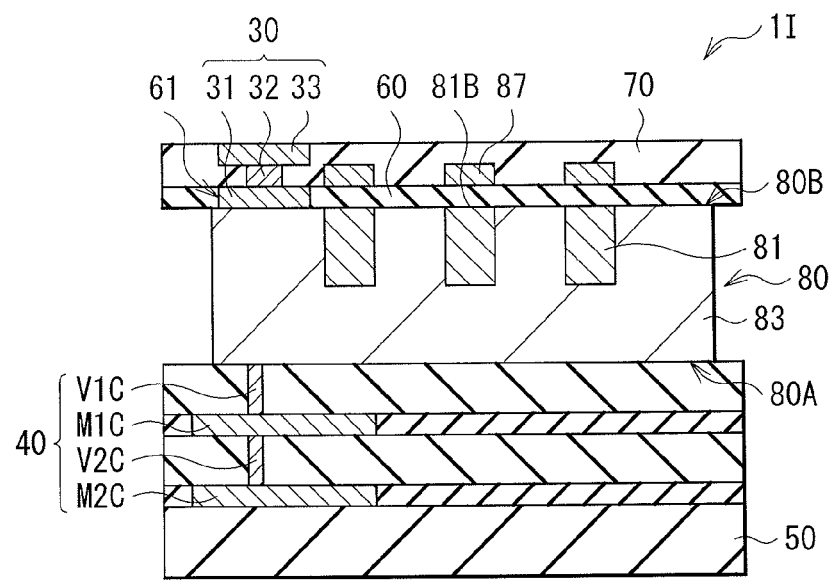
FIG. 73 is a cross-sectional diagram illustrating a configuration of a semiconductor device according to a ninth embodiment of the present disclosure, which is a diagram of a cross section taken along a source wiring of a transistor.
Figure 74:
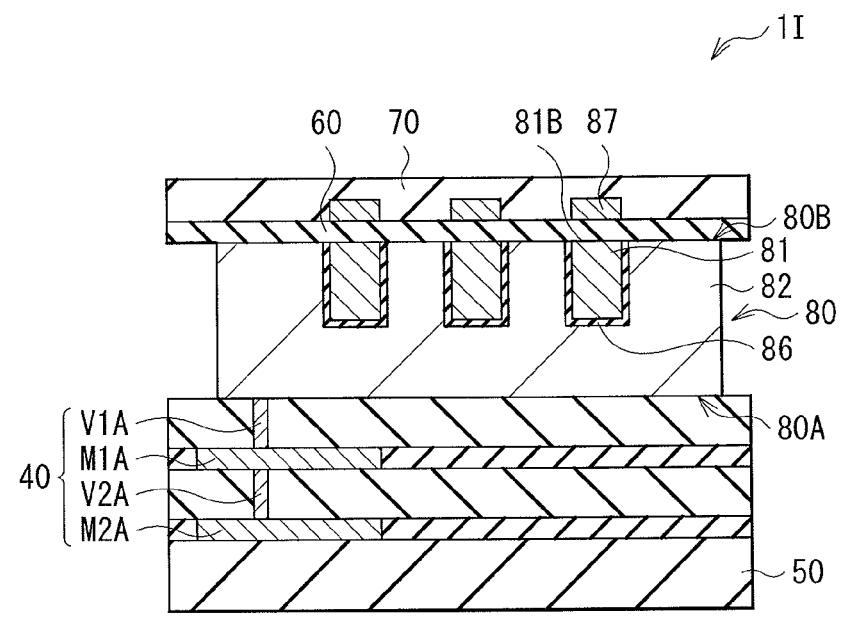
FIG. 74 is a cross-sectional diagram of another cross section of the semiconductor device illustrated in FIG. 73, which is a diagram of a cross section taken along a gate wiring of the transistor.

FIGS. 73 and 74 each illustrate a cross-sectional configuration of a semiconductor device 1I according to a ninth embodiment of the present disclosure. The present embodiment is different from the fifth embodiment, in that the transistor 80 is a Nano-wire FET, and a fourth gate electrode 87 is provide to face the back surface 81B of each of the fins 81. It is to be noted that FIG. 73 illustrates a cross section taken along the source wiring 83 of the transistor 80, and FIG. 74 illustrates a cross section taken along the gate wiring 82 of the transistor 80. Except this point, the semiconductor device 1I has a configuration and functions similar to those of the fifth embodiment.

The semiconductor device 1I may be manufactured as follows, for example.

FIGS. 75 to 84 illustrate a method of manufacturing the semiconductor device 1I, in process order. It is to be noted that FIGS. 75 to 84 each illustrate a cross section (a cross section taken along the source wiring 83) similar to that in FIG. 73.

Figure 75:
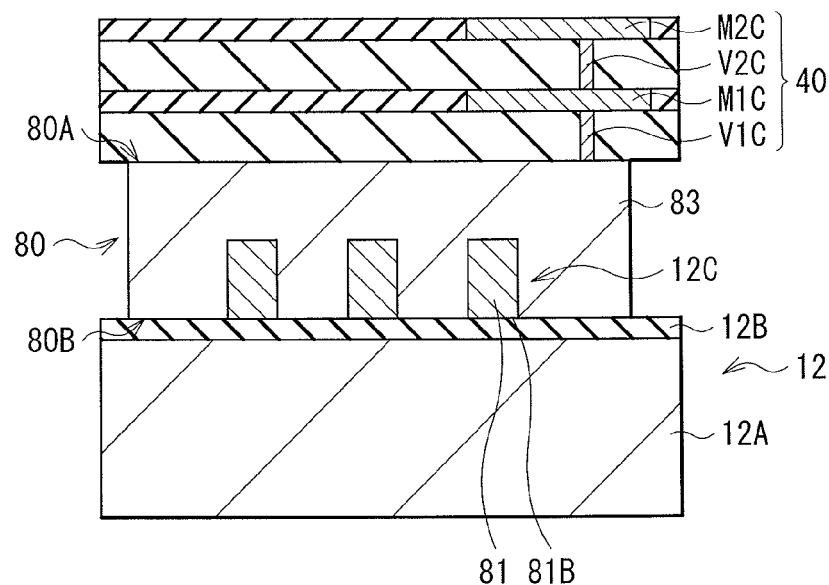
FIG. 75 is a cross-sectional diagram illustrating a process of a method of manufacturing the semiconductor device illustrated in FIG. 73.

First, as illustrated in FIG. 75, in a manner similar to that of the fifth embodiment, the transistor 80 including the fins 81, the gate wiring 82, the source wiring 83, and the drain wiring 84 is formed on the semiconductor substrate 12C of the SOI substrate 12, by the process illustrated in FIG. 48.

Subsequently, as illustrated in FIG. 75, in a manner similar to that of the fifth embodiment, the main-surface-side multilayer wiring section 40 to which the wirings M1C and M2C are connected to the main surface 80A side of the source wiring 83 by the vias V1C and V2C is formed by the process illustrated in FIG. 48. Further, the main-surface-side multilayer wiring section 40 to which the wirings M1A and M2A are connected by the vias V1A and V2A is formed on the main surface 80A side of the gate wiring 82, although this is not illustrated in FIG. 75. Also on the main surface 80A side of the drain wiring 84, the wirings are connected by the vias, although this is not illustrated in FIG. 75.

Figure 76:
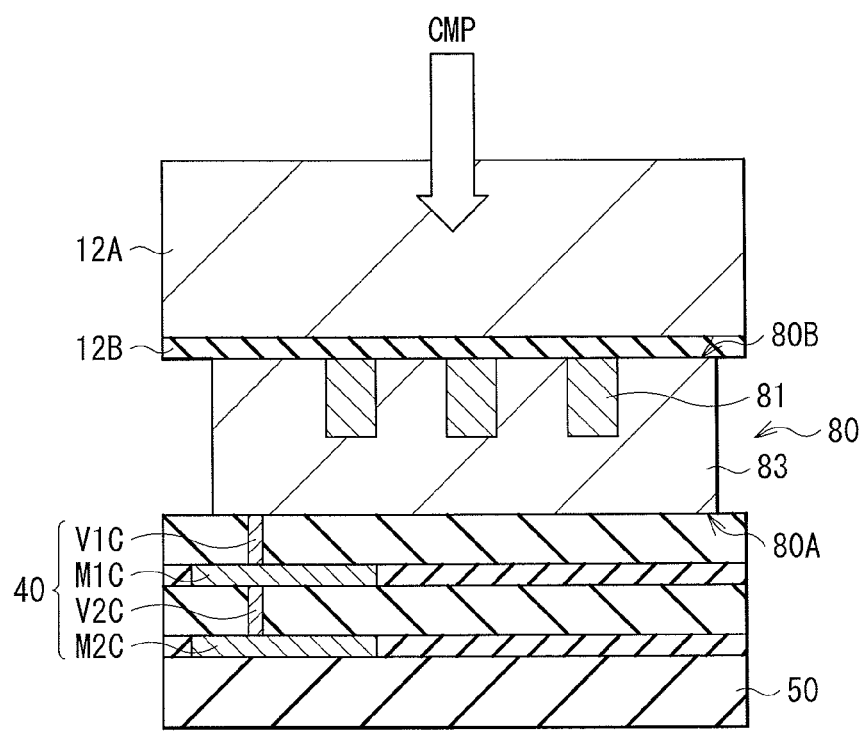
FIG. 76 is a cross-sectional diagram illustrating a process following the process in FIG. 75.

Subsequently, as illustrated in FIG. 76, in a manner similar to that of the fifth embodiment, the transistor 80 is reversed and the supporting substrate 50 is adhered on the main surface 80A side of the transistor 80 by the process illustrated in FIG. 49, in a manner similar to that of the first embodiment. At this moment, the transistor 80 and the wiring of the main surface 80A side are upside down.

Figure 77:
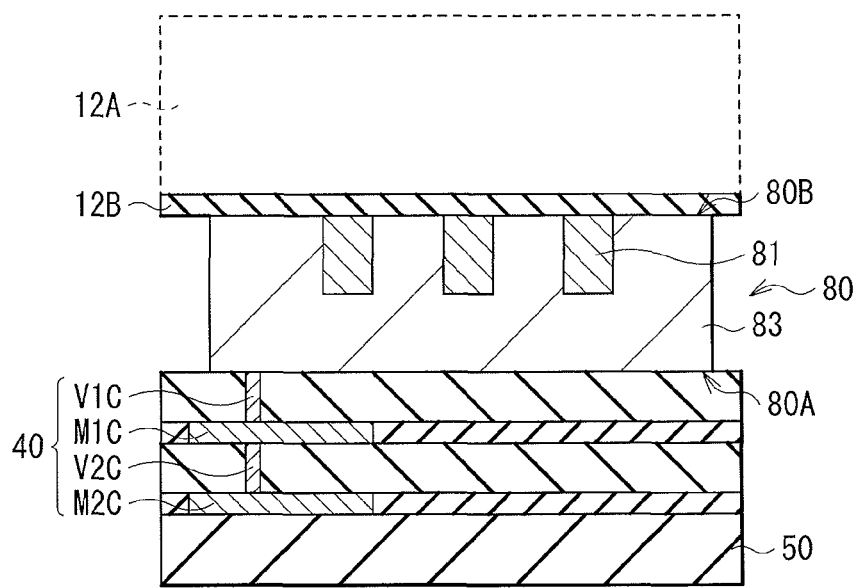
FIG. 77 is a cross-sectional diagram illustrating a process following the process in FIG. 76.
Figure 78:
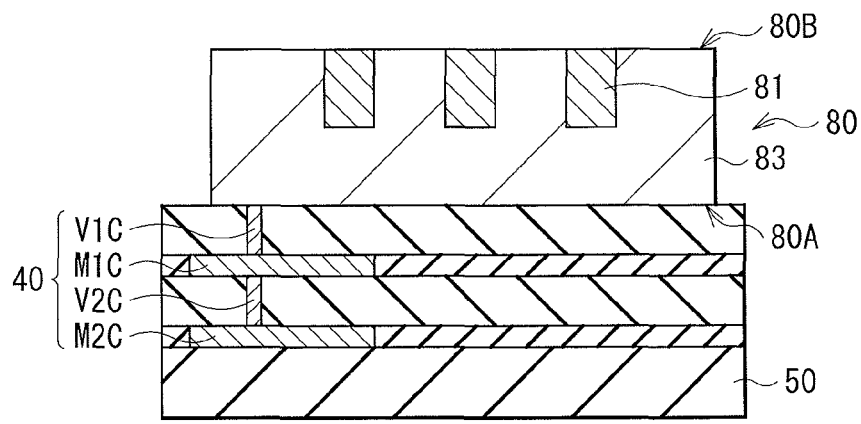
FIG. 78 is a cross-sectional diagram illustrating a process following the process in FIG. 77.

Subsequently, as illustrated in FIGS. 76 and 77, the carrier substrate 12A may be polished from the back surface 10B side by, for example, CMP, and this polishing is stopped upon reaching the embedded oxide film 12B. As illustrated in FIG. 78, the embedded oxide film 12B is then removed by the process illustrated in FIG. 51, in a manner similar to that of the fifth embodiment.

Figure 79:
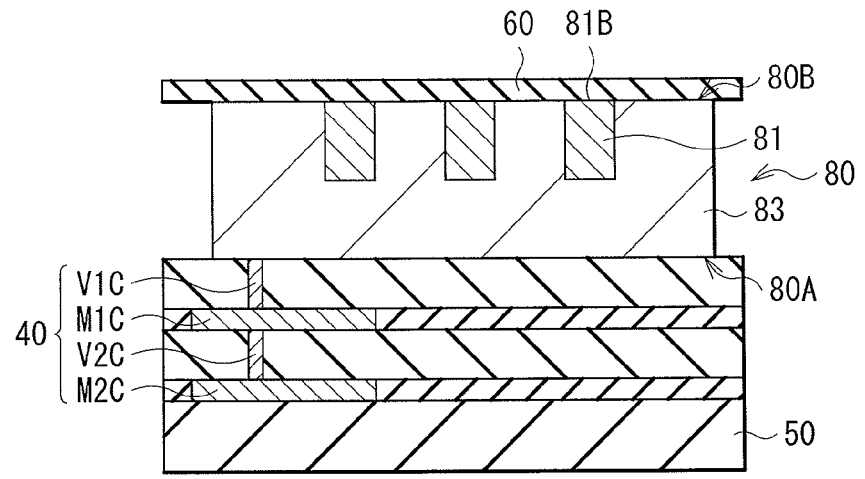
FIG. 79 is a cross-sectional diagram illustrating a process following the process in FIG. 78.

After the embedded oxide film 12B is removed, the insulating film 60 is formed to be in contact with the back surface 81B of each of the fins 81 and the back surface of each of the gate wiring 82, the source wiring 83, and the drain wiring 84 by the process illustrated in FIG. 52, as illustrated in FIG. 79. Thus forming the insulating film 60 after removing the embedded oxide film 12B reduces the thickness of the insulating film 60, thereby allowing a further reduction in the connection resistance.

Figure 80:
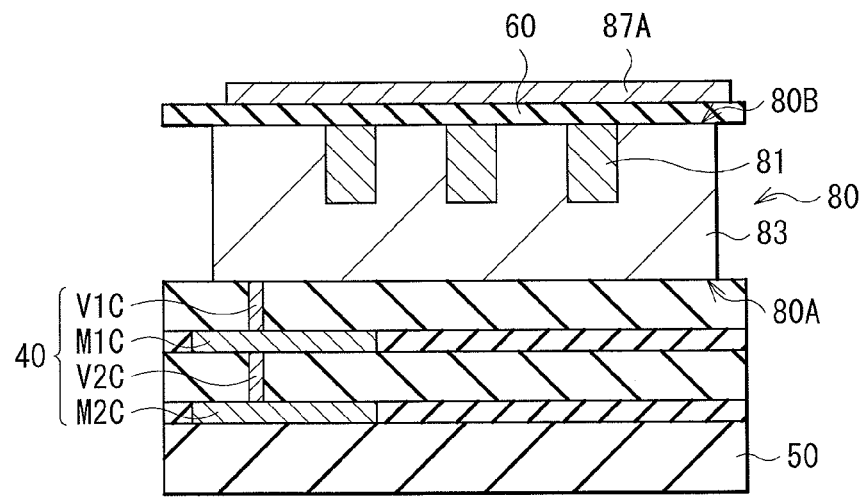
FIG. 80 is a cross-sectional diagram illustrating a process following the process in FIG. 79.
Figure 81:
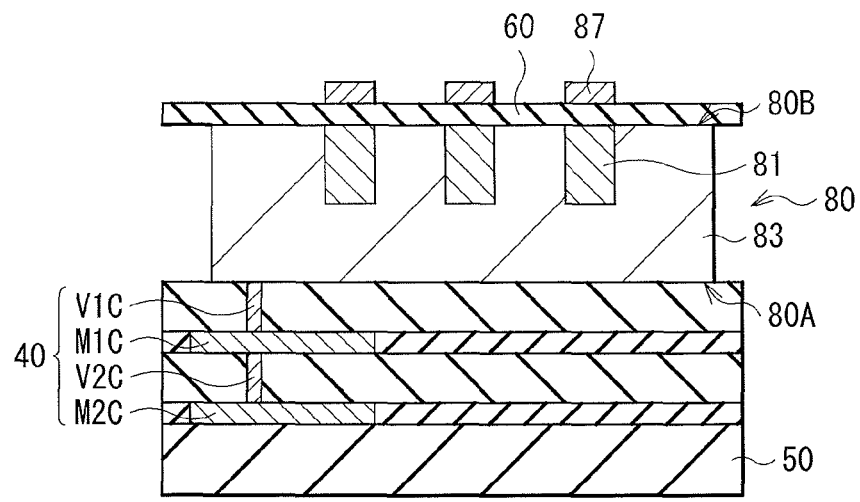
FIG. 81 is a cross-sectional diagram illustrating a process following the process in FIG. 80.

Next, as illustrated in FIG. 80, a metallic material film 87A is formed on the insulating film 60. Subsequently, as illustrated in FIG. 81, the fourth gate electrode 87 is formed at a position facing the back surface 81B of each of the fins 81 with the insulating film 60 interposed therebetween, by patterning the metallic material film 87A.

Figure 82:
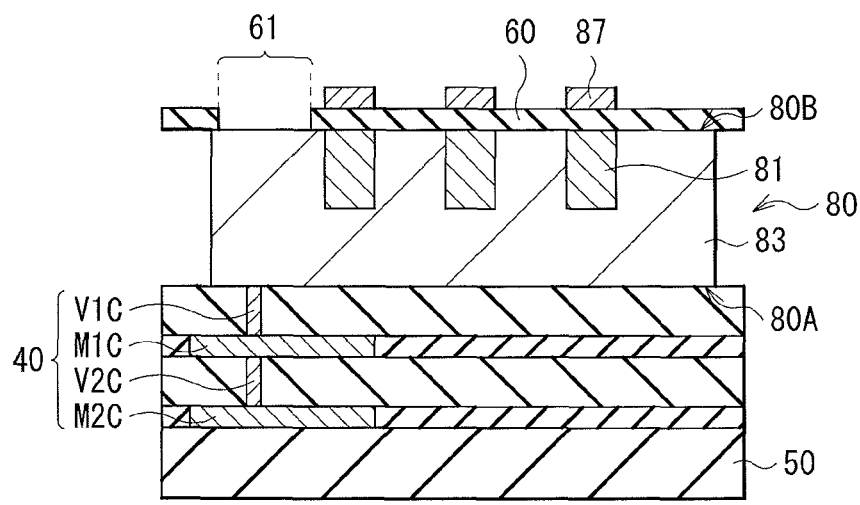
FIG. 82 is a cross-sectional diagram illustrating a process following the process in FIG. 81.

Subsequently, as illustrated in FIG. 82, in a manner similar to that of the fifth embodiment, the opening 61 is provided in the insulating film 60, to face the source wiring 83, by the process illustrated in FIG. 53.

Figure 83:
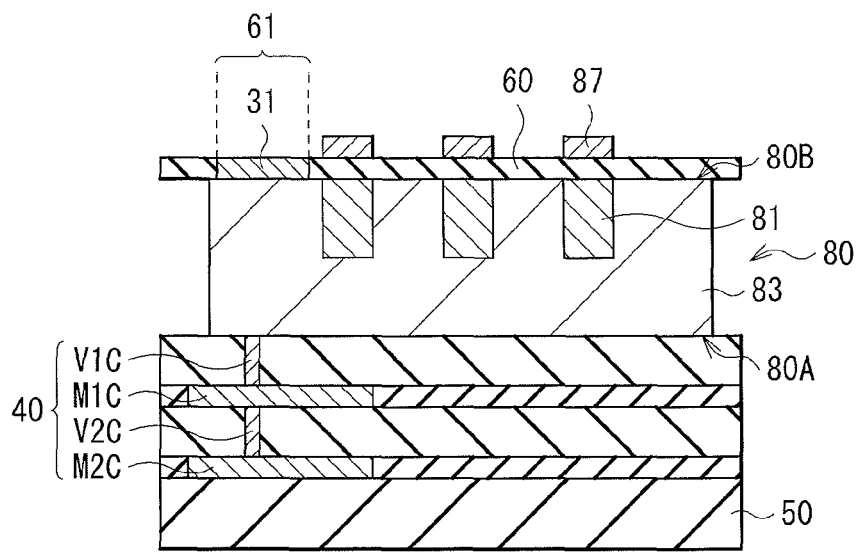
FIG. 83 is a cross-sectional diagram illustrating a process following the process in FIG. 82.
Figure 84:
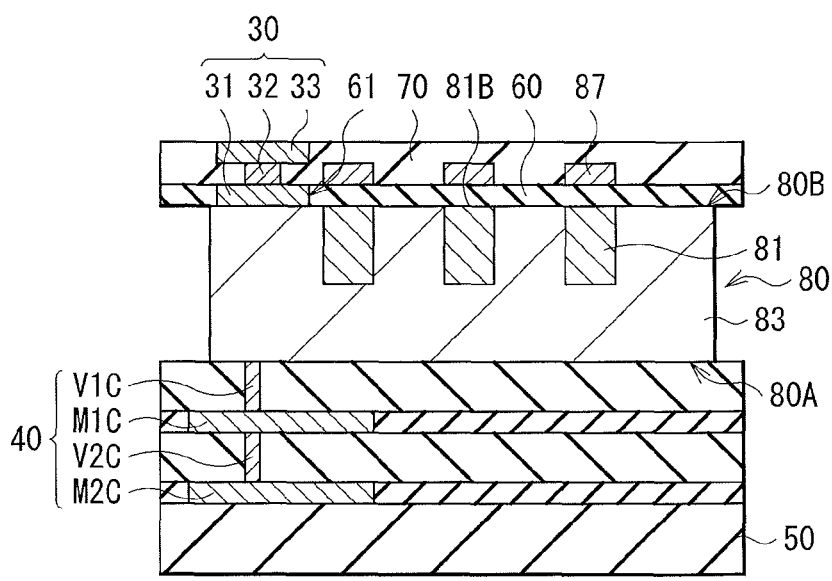
FIG. 84 is a cross-sectional diagram illustrating a process following the process in FIG. 83.

After the opening 61 is provided in the insulating film 60, the first electrode 31 is embedded in the opening 61 by the process illustrated in FIG. 54 in a manner similar to that of the fifth embodiment, as illustrated in FIG. 83. Subsequently, as illustrated in FIG. 84, in a manner similar to that of the fifth embodiment, the memory section 32 and the second electrode 33 are formed on the first electrode 31 in a manner similar to that of the first embodiment, by the process illustrated in FIG. 55. The resistance change element 30 connected to the source wiring 83 through the opening 61 is thus formed. Around the memory section 32 and the second electrode 33, the back-surface interlayer film 70 is formed. The semiconductor device 1I illustrated in FIGS. 73 and 74 is thus completed.

It is to be noted that the semiconductor device 1I of the present embodiment may also be formed using the semiconductor substrate 10 of a bulk type.

Tenth Embodiment

Figure 85:
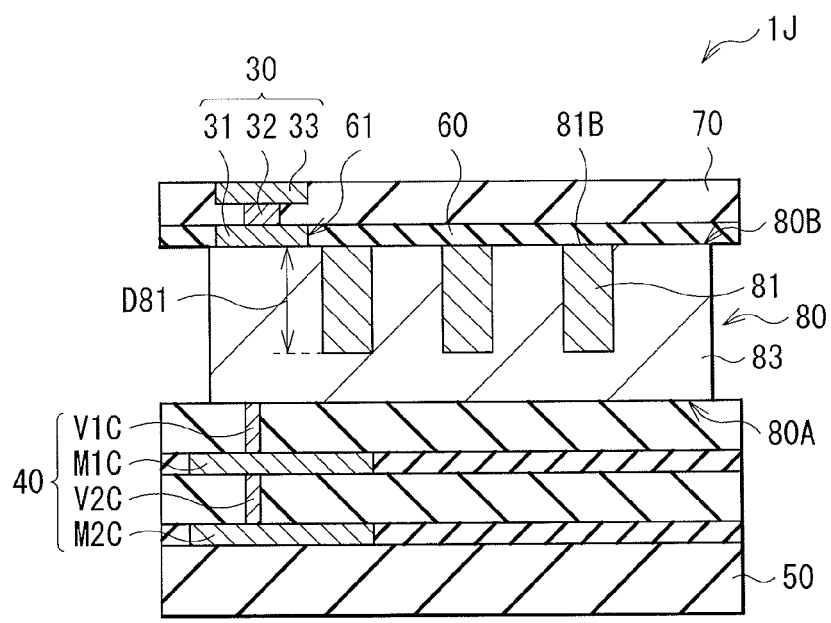
FIG. 85 is a cross-sectional diagram illustrating a configuration of a semiconductor device according to a tenth embodiment of the present disclosure.

FIG. 85 illustrates a cross-sectional configuration of a semiconductor device 1J according to a tenth embodiment of the present disclosure. In the present embodiment, a depth D81 of each of the fins 81 is made larger than that of the fifth embodiment, so that a W length is extended to increase a current supply amount. Therefore, it is possible to achieve high-speed writing and reading, without increasing the cell area. Except this point, the semiconductor device 1J of the present embodiment has a configuration and functions similar to those of the fifth embodiment, and may be manufactured in a manner similar to that of the fifth embodiment.

Eleventh Embodiment

Figure 86:
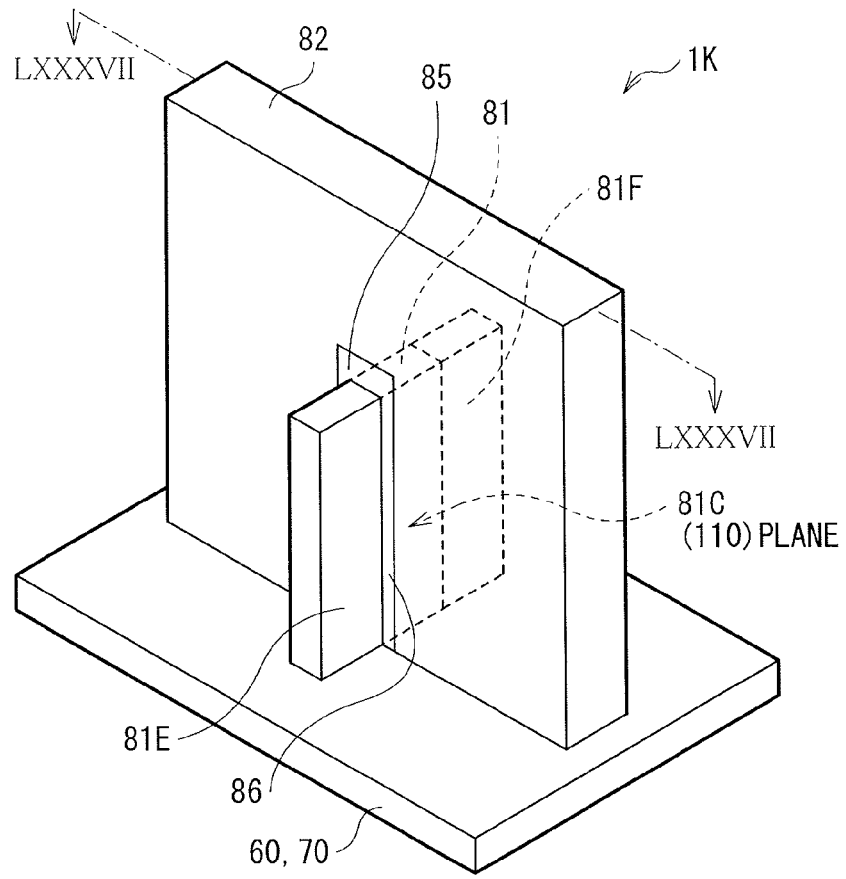
FIG. 86 is a perspective view illustrating a configuration of a semiconductor device according to an eleventh embodiment of the present disclosure.
Figure 87:
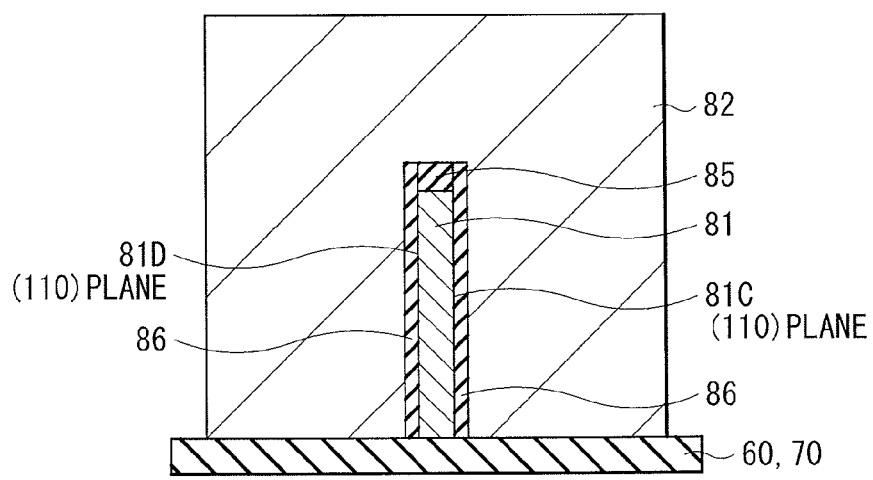
FIG. 87 is a cross-sectional diagram illustrating a configuration of the semiconductor device illustrated in FIG. 86, which is a diagram of a cross section taken along a gate wiring of a transistor.

FIG. 86 illustrates a configuration of a part of a semiconductor device 1K according to an eleventh embodiment of the present disclosure (an intersection part of each of the fins 81 and the gate wiring 82). FIG. 87 illustrates a cross-sectional configuration taken along an extending direction of the gate wiring 82 in FIG. 86. Except that the transistor 80 is configured using a p-type Fin FET, the semiconductor device 1K of the present embodiment has a configuration and functions similar to those of the fifth embodiment, and may be manufactured in a manner similar to that of the fifth embodiment.

Figure 88:
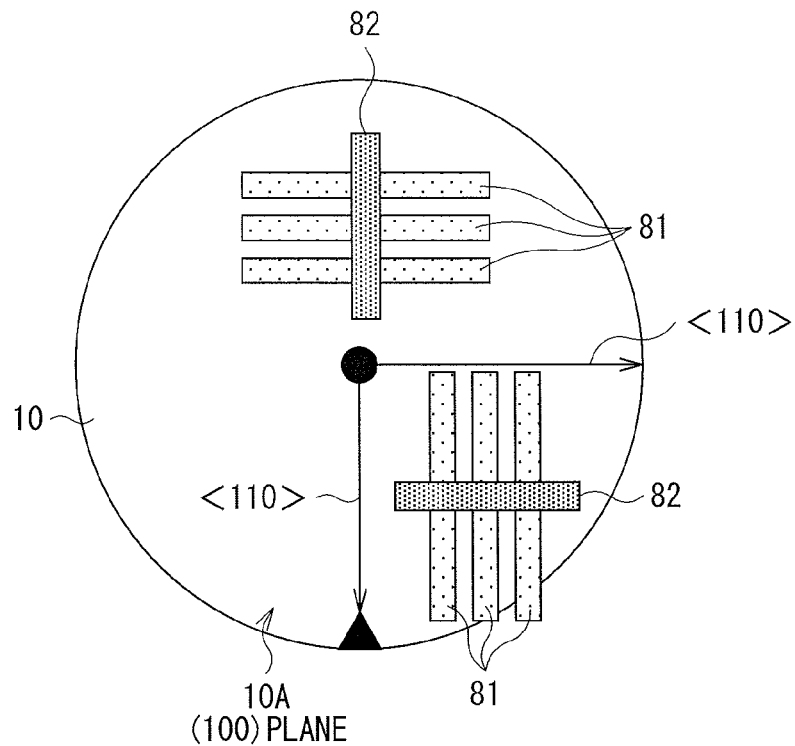
FIG. 88 is a plan view used to describe an orientation of a side face of a fin illustrated in FIG. 86.

As illustrated in FIG. 88, the p-type Fin FET is formed on the semiconductor substrate 10 made of a (100) orientation single crystal silicon wafer. The main surface 10A of the semiconductor substrate 10 is a (100) plane, and the side faces 81C and 81D of the fin 81 are (110) planes. A positive hole that is a majority carrier of a p-type Fin FET exhibits high mobility at a (110) plane. Therefore, the p-type Fin FET, which uses the (110) planes of the side faces 81C and 81D of the fin 81 as a channel, is allowed to achieve a high current drive ability. Parts exposed from the gate wiring 82 on both sides of the fin 81 are a source region 81E and a drain region 81F. The source region 81E and the drain region 81F are doped at high density, to be a p-type.

Figure 89:
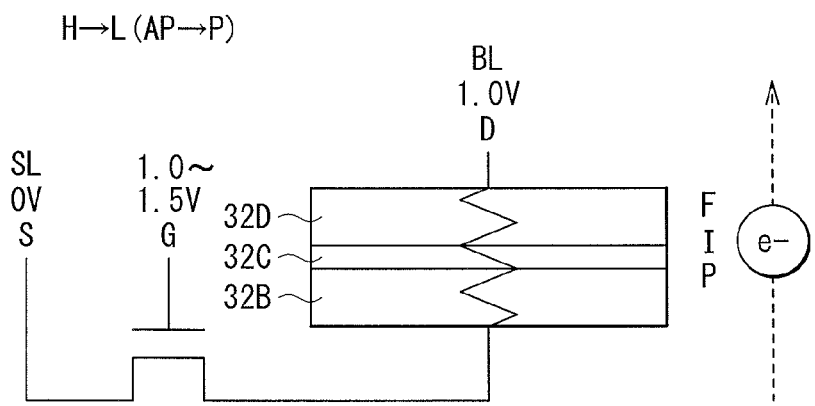
FIG. 89 is a diagram used to describe a case of a change from high resistance to low resistance.

Assume, in a case in which an n-type transistor is used as a select transistor, a gate voltage of the transistor is 1.0 V to 1.5 V, and a voltage is applied so that the electric potential of the source line SL becomes higher than the electric potential of the bit line BL. Then, as illustrated in FIG. 89, for example, a current "e-" may flow in a direction from the magnetization fixed layer 32B to the memory layer 32D, and antiparallel magnetization directions of the magnetization fixed layer 32B and the memory layer 32D may become parallel (AP→P). This may cause the resistance value of the memory section 32 of the resistance change element 30, to change from a high resistive state to a low resistive state (H→L).

Figure 90:
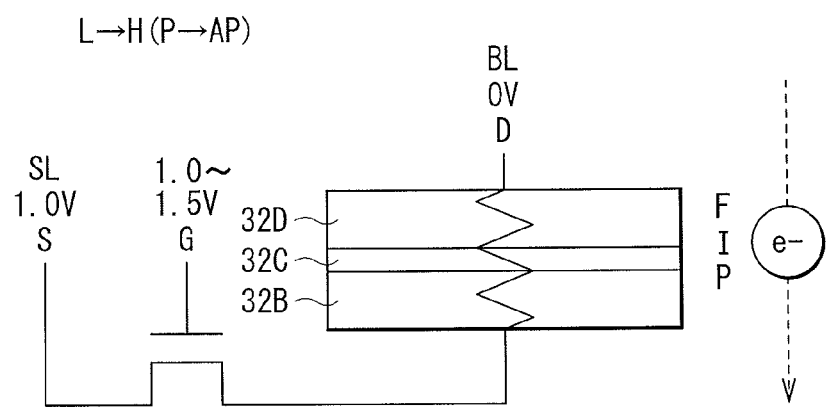
FIG. 90 is a diagram used to describe a case of a change from low resistance to high resistance.

On the other hand, assume a voltage is applied so that the electric potential of the source line SL becomes lower than the electric potential of the bit line BL. Then, as illustrated in FIG. 90, for example, a current "e-" may flow in a direction from the memory layer 32D to the magnetization fixed layer 32B, and the parallel magnetization directions of the magnetization fixed layer 32B and the memory layer 32D may become antiparallel (P→AP). This may cause the resistance value of the memory section 32 of the resistance change element 30, to change from the low resistive state to the high resistive state (L→H). A large amount of current is supplied to cause the change of L→H, but it has been difficult to feed a sufficient amount of current to the resistance change element 30 in a p-type MOSFET formed on a bulk substrate.

It is to be noted that it is also possible to ease current asymmetry between H→L and L→H, by driving the transistor 80 with a small current, by connecting the memory layer 32D (namely, the second electrode 33 (the bit line BL)) to the drain of the transistor 80 through routing of wiring. However, a wiring routing configuration becomes complicated, which may increase the cell area and thereby hinder an area reduction.

Figure 91:
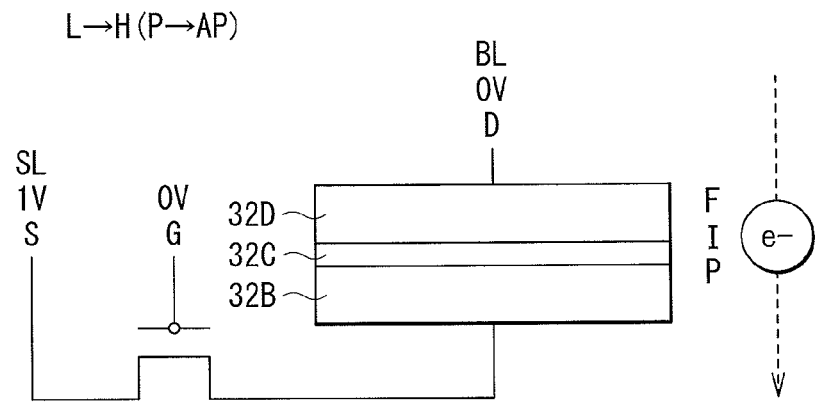
FIG. 91 is a diagram used to describe an advantage of using a PFET, and to describe a case of a change from low resistance to high resistance.

In the present embodiment, the transistor 80 is configured using the p-type Fin FET having a high current drive ability as illustrated in FIG. 91. Therefore, it is possible to supply the resistance change element 30 with a current sufficient to cause the change of L→H.

Twelfth Embodiment

Figure 92:
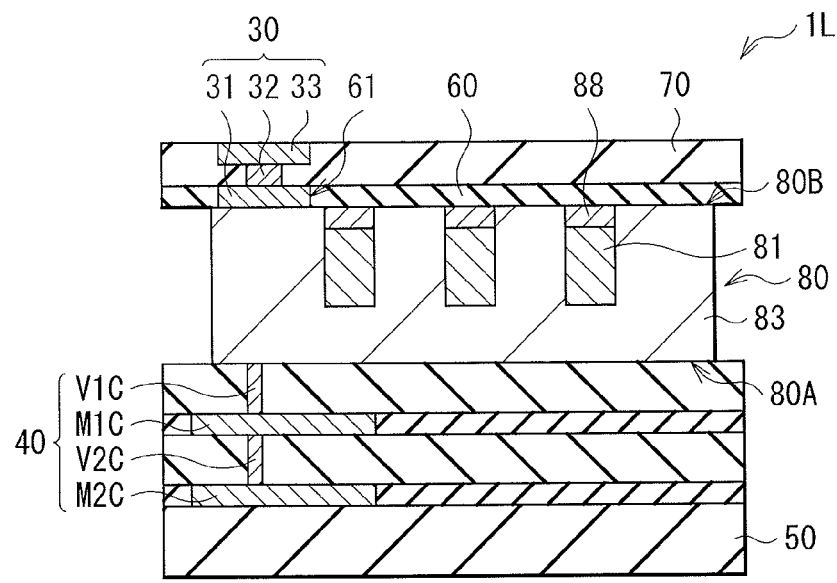
FIG. 92 is a cross-sectional diagram illustrating a configuration of a semiconductor device according to a twelfth embodiment of the present disclosure, which is a diagram of a cross section taken along a source wiring of a transistor.
Figure 93:
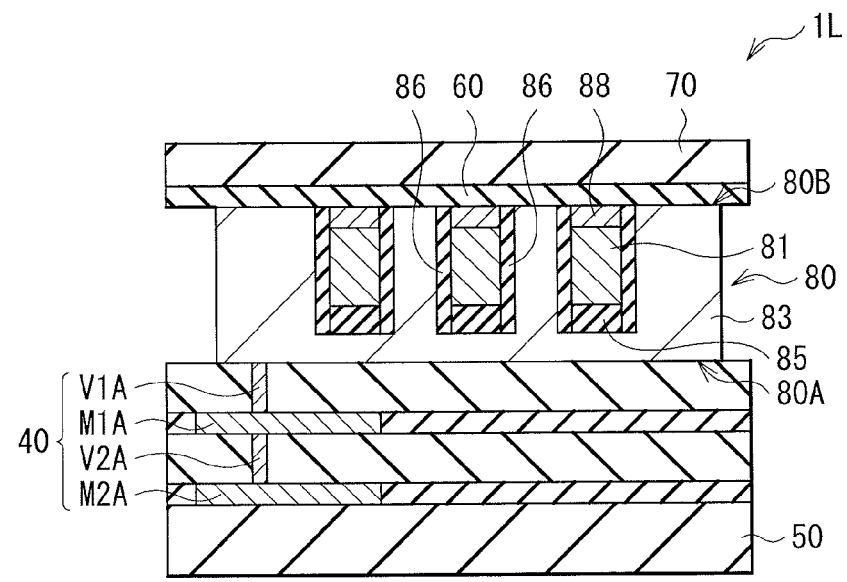
FIG. 93 is a cross-sectional diagram of another cross section of the semiconductor device illustrated in FIG. 92, which is a diagram of a cross section taken along a gate wiring of the transistor.

FIGS. 92 and 93 each illustrate a cross-sectional configuration of a semiconductor device 1L according to a twelfth embodiment of the present disclosure. FIG. 92 illustrates a cross section taken along the source wiring 83, and FIG. 93 illustrates a cross section taken along the gate wiring 82. Except that the transistor 80 is configured using a compound semiconductor Fin FET, the semiconductor device 1L of the present embodiment has a configuration and functions similar to those of the fifth embodiment, and may be manufactured in a manner similar to the fifth embodiment.

The fins 81 may be configured using, for example, a quantum well (QW) of InGaAs. A barrier layer 88 made of, for example, InAlAs, may be provided on the back surface 81B of each of the fins 81.

It is possible to obtain the transistor 80 having a high current drive ability, by configuring the transistor 80 by using the compound semiconductor Fin FET. Therefore, it is possible to obtain a current sufficient to cause the change of L→H.

Thirteenth Embodiment

Figure 94:
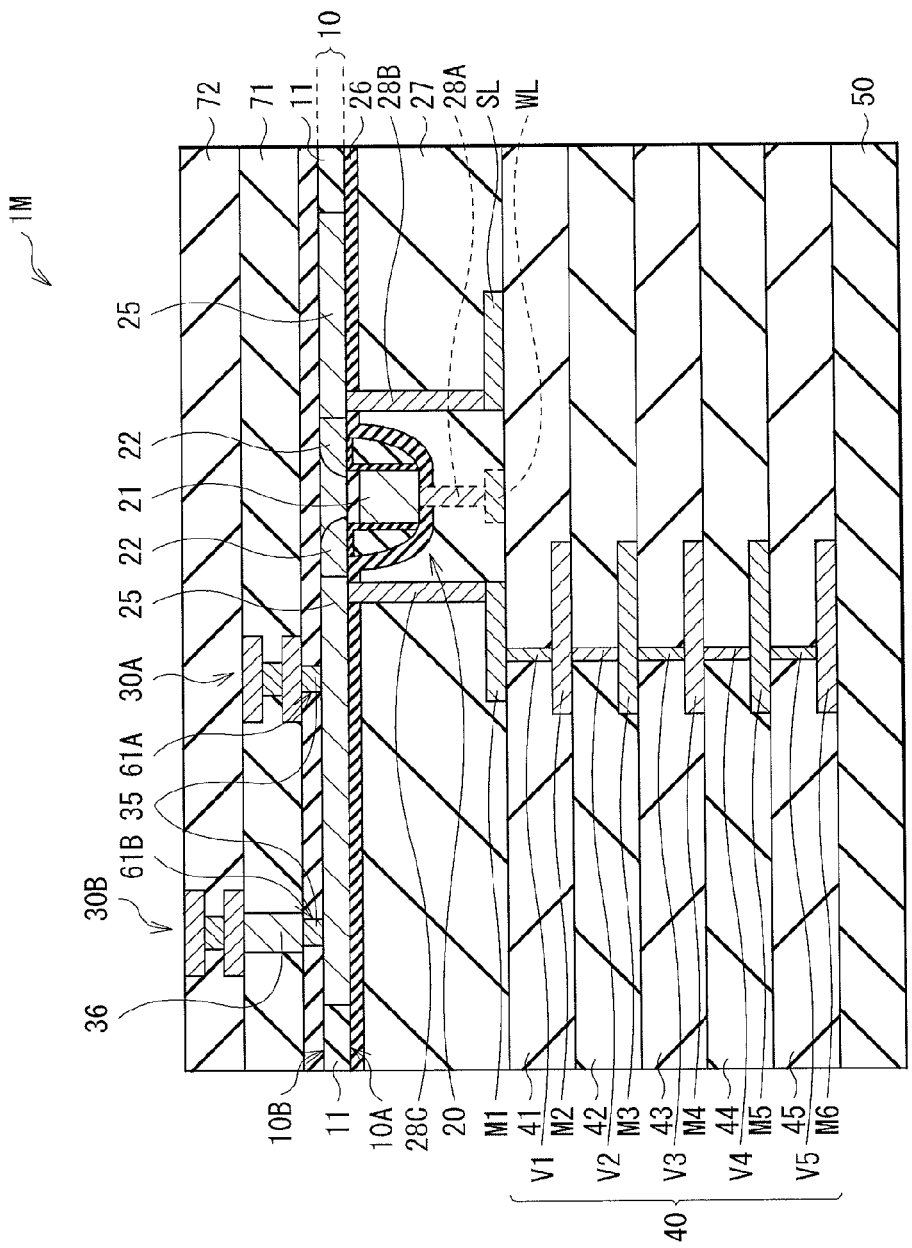
FIG. 94 is a cross-sectional diagram illustrating a configuration of a semiconductor device according to a thirteenth embodiment of the present disclosure.

FIG. 94 illustrates a cross-sectional configuration of a semiconductor device 1M according to a thirteenth embodiment of the present disclosure. The present embodiment is different from the third embodiment, in that a multilayer including two (first and second) resistance change elements 30A and 30B is disposed on the back surface 10B side of the semiconductor substrate 10. Except this point, the semiconductor device 1M has a configuration and functions similar to those of the first and third embodiments, and may be manufactured in a manner similar to those of the first and third embodiments.

On the back surface 10B side of the semiconductor substrate 10, the first resistance change element 30A, the second resistance change element 30B, and a conductive connection section 36 are provided. Around the first resistance change element 30A and the conductive connection section 36, a back-surface interlayer film 71 is provided. The second resistance change element 30B is provided on the back-surface interlayer film 71, and located in a layer further away from the semiconductor substrate 10, than the first resistance change element 30A and the conductive connection section 36. Around the second resistance change element 30B, a back-surface interlayer film 72 is provided.

The insulating film 60 has the opening 61 facing the silicide layer 25 of the transistor 20. The first resistance change element 30A is connected to the silicide layer 25 through the opening 61. A first end of the conductive connection section 36 is connected to the silicide layer 25 through the opening 61. A second end of the conductive connection section 36 is connected to the second resistance change element 30B.

In other words, as described in the first embodiment, by connecting the resistance change element 30 to the silicide layer 25 through the opening 61 of the insulating film 60, a thermal budget is suppressed, and the connection resistance between the resistance change element 30 and the transistor 20 is reduced. Therefore, high integration of a plurality of the resistance change elements 30 is allowed, by disposing the multiplayer of the first resistance change element 30A and the second resistance change element 30B, on the back surface 10B side of the semiconductor substrate 10, as described in the present embodiment.

The first resistance change element 30A and the conductive connection section 36 are each connected to the silicide layer 25 by the conductive connection section 35 embedded in the opening 61, in a manner similar to that of the third embodiment.

Further, the first resistance change element 30A and the conductive connection section 36 may each also be embedded in the opening 61 and connected to the silicide layer 25 in a manner similar to that of the first embodiment, without interposition of the conductive connection section 35 therebetween, although this is not illustrated in FIG. 94.

Preferably, the back-surface interlayer films 71 and 72 may be configured using, for example, a Low-K film. This is to allow a further reduction in RC.

Figure 95:
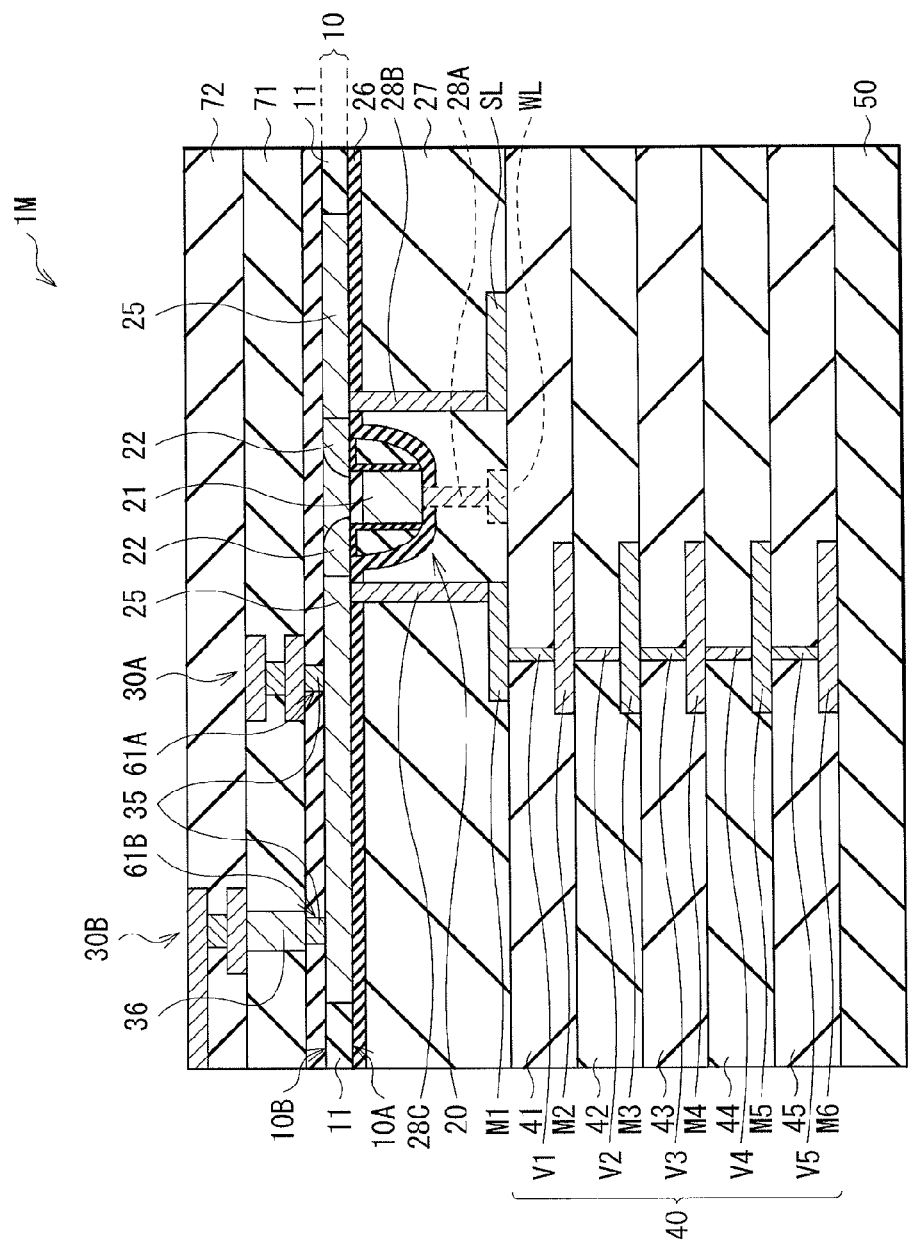
FIG. 95 is a cross-sectional diagram illustrating a modification of the semiconductor device illustrated in FIG. 94.

Further, flexibility of wiring is improved by providing the multilayer including the first resistance change element 30A and the second resistance change element 30B on the back surface 10B side of the semiconductor substrate 10. In other words, as illustrated in FIG. 95, for example, it is also possible to allow the two second electrodes 33 to intersect each other, by extending the second electrode 33 of the first resistance change element 30A in a direction orthogonal to a sheet surface of FIG. 95, and extending the second electrode 33 of the second resistance change element 30B in a direction orthogonal to the former direction. This makes it possible to provide the multilayer including the plurality of the resistance change elements 30, thereby implementing a multi-valued structure.

Fourteenth Embodiment

Figure 96:
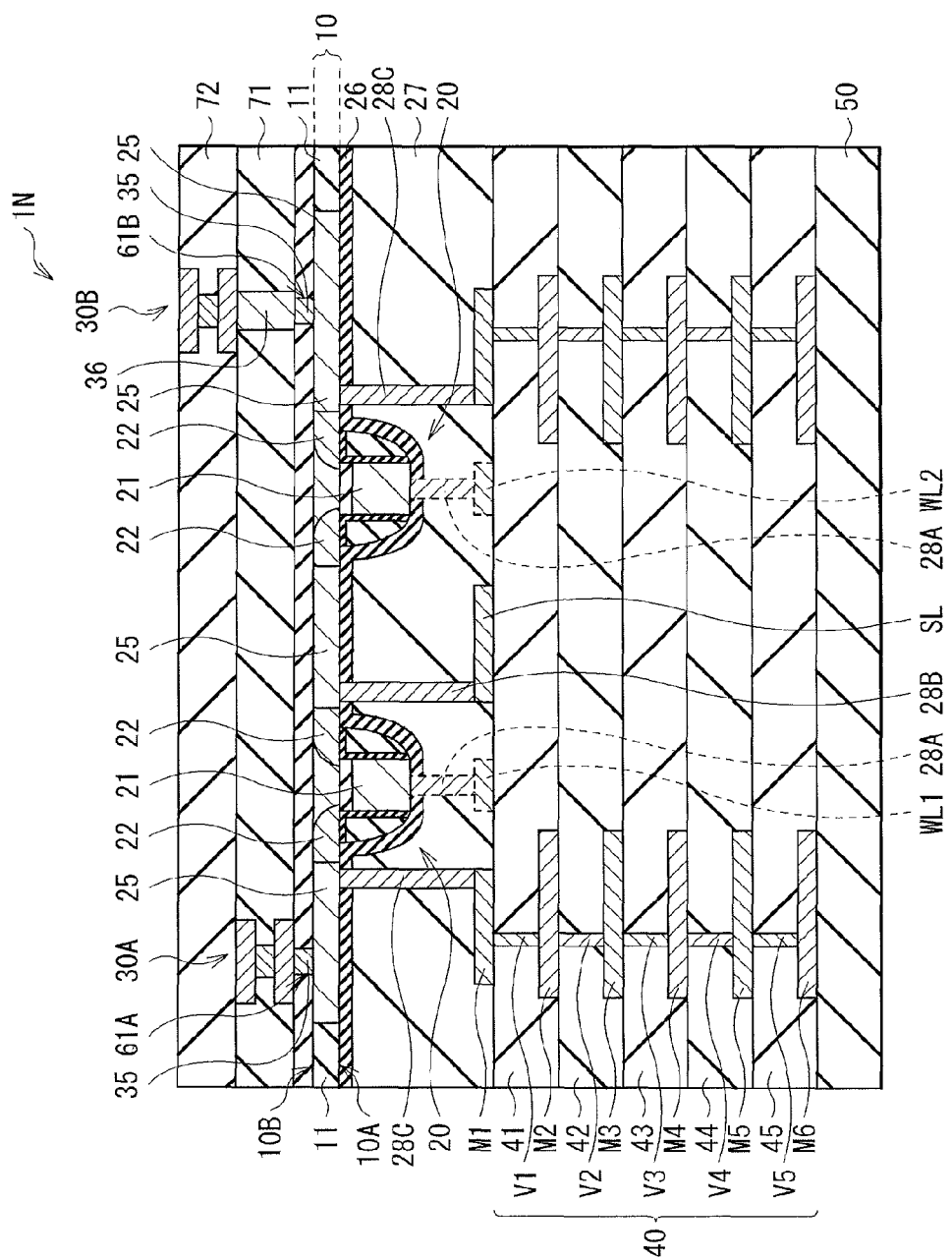
FIG. 96 is a cross-sectional diagram illustrating a configuration of a semiconductor device according to a fourteenth embodiment of the present disclosure.

FIG. 96 illustrates a cross-sectional configuration of a semiconductor device 1N according to a fourteenth embodiment of the present disclosure. The semiconductor device 1N of the present embodiment has a configuration and functions similar to those of the thirteenth embodiment, except that the first resistance change element 30A and the second resistance change element 30B are connected to the silicide layers 25 of the separate transistors 20. The semiconductor device 1N may be manufactured in a manner similar to that of the thirteenth embodiment.

Fifteenth Embodiment

Figure 97:
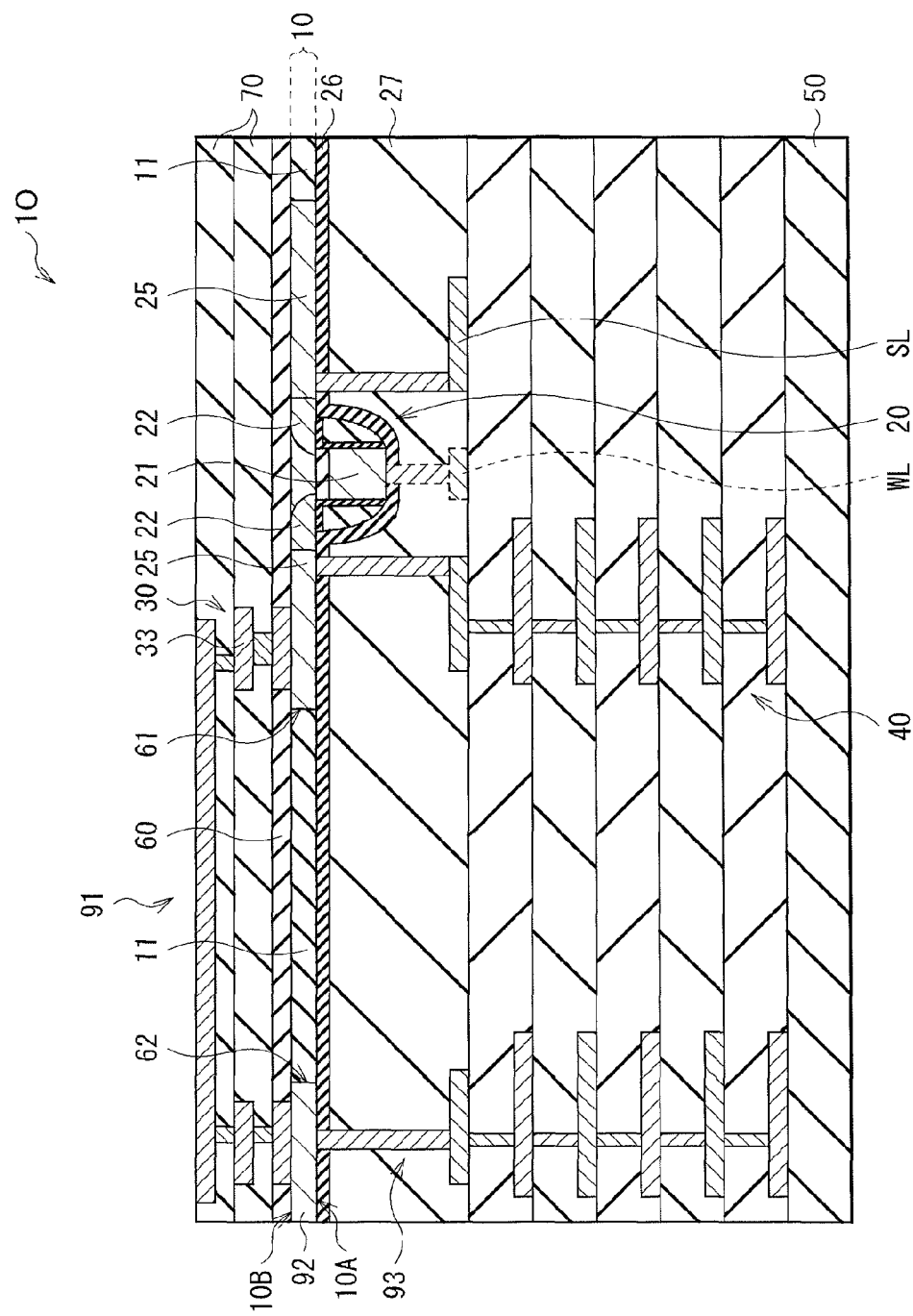
FIG. 97 is a cross-sectional diagram illustrating a configuration of a semiconductor device according to a fifteenth embodiment of the present disclosure.

FIG. 97 illustrates a cross-sectional configuration of a semiconductor device 1O according to a fifteenth embodiment of the present disclosure. The present embodiment is different from the first embodiment, in that the second electrode 33 of the resistance change element 30 is drawn to the main surface 10A side of the semiconductor substrate 10, through a second back-surface-side multilayer wiring section 91, a second silicide layer 92, and a main-surface-side multilayer wiring section 93. Except this point, the semiconductor device 1O of the present embodiment has a configuration and functions similar to those of the first embodiment, and may be manufactured in a manner similar to that of the first embodiment.

The second electrode 33 of the resistance change element 30 is connected to a first end of the second back-surface-side multilayer wiring section 91 provided on the back surface 10B side of the semiconductor substrate 10. Further, the second silicide layer 92 is provided in the semiconductor substrate 10. The second silicide layer 92 is electrically insulated from the first silicide layer 25 by the element separating layer 11, and extends to the back surface 10B of the semiconductor substrate 10. The insulating film 60 is provided in contact with a back surface of the second silicide layer 92, and has a second opening 62 facing the second silicide layer 92. A second end of the second back-surface-side multilayer wiring section 91 is embedded in the second opening 62, and directly connected to the second silicide layer 92.

It is to be noted that, in the present embodiment and a sixteenth embodiment to be described next, the silicide layer 25 is referred to as "the first silicide layer 25", to distinguish the silicide layer 25 from the second silicide layer 92. Further, the opening 61 is referred to as "the first opening 61" to distinguish the opening 61 from the second opening 62.

A first end of the main-surface-side multilayer wiring section 93 is connected to the second silicide layer 92. A second end of the main-surface-side multilayer wiring section 93 is drawn to the main surface 10A side of the semiconductor substrate 10.

The semiconductor device 1O may be manufactured as follows, for example. It is to be noted that processes overlapping those of the first embodiment will be described with reference to FIG. 4 to FIG. 11.

First, in a manner similar to that of the first embodiment, the transistor 20 including the gate electrode 21 and the pair of diffusion layers 22 are fabricated on the main surface 10A side of the semiconductor substrate 10, by the process illustrated in FIG. 4. In a part of each of the diffusion layers 22, the first silicide layer 25 is formed. In this process, the second silicide layer 92 electrically insulated from the first silicide layer 25 by the element separating layer 11 is formed in the semiconductor substrate 10.

Next, in a manner similar to that of the first embodiment, the interlayer insulating films 26 and 27 is formed to cover the transistor 20, the word line WL is connected to the gate electrode 21, and the select line SL as well as the first metal layer M1 are connected to the first silicide layer 25, by the process illustrated in FIG. 4. The main-surface-side multilayer wiring section 40 is formed on the interlayer insulating film 27, and the first metal layer M1 and the main-surface-side multilayer wiring section 40 are connected to each other. In this process, the main-surface-side multilayer wiring section 93 is formed on the main surface 10A side of the second silicide layer 92.

Next, in a manner similar to that of the first embodiment, the semiconductor substrate 10 is reversed, and the supporting substrate 50 is adhered on the main surface 10A side of the semiconductor substrate 10 at a low temperature, through use of a plasma technique or the like, by the process illustrated in FIG. 5. At this moment, the transistor 20 and the main-surface-side multilayer wiring section 40 are upside down.

Subsequently, in a manner similar to that of the first embodiment, the semiconductor substrate 10 may be polished from the back surface 10B side by, for example, CMP, and the polishing is stopped upon reaching the first silicide layer 25 and the second silicide layer 92, by the processes illustrated in FIGS. 6 and 7.

Next, in a manner similar to that of the first embodiment, the insulating film 60 made of a film such as the above-described High-K film may be formed by, for example, CVD, to be in contact with the back surface 10B of the semiconductor substrate 10, the back surface of the first silicide layer 25, and the back surface of the second silicide layer 92, by the process illustrated in FIG. 8.

Subsequently, in a manner similar to that of the first embodiment, the first opening 61 is provided in the insulating film 60, to face the first silicide layer 25, by the process illustrated in FIG. 9. In this process, the second opening 62 is provided in the insulating film 60, to face the second silicide layer 92.

After the first opening 61 and the second opening 62 are provided in the insulating film 60, the first electrode 31 made of the above-described material is embedded in the first opening 61, in a manner similar to that of the first embodiment, by the process illustrated in FIG. 10. Subsequently, in a manner similar to that of the first embodiment, the memory section 32 and the second electrode 33 are formed on the first electrode 31 by the process illustrated in FIG. 11. The resistance change element 30 directly connected to the first silicide layer 25 through the first opening 61 is thus formed.

Afterwards, the second back-surface-side multilayer wiring section 91 having the first end connected to the second electrode 33 is formed on the back surface 10B side of the semiconductor substrate 10. The second end of the second back-surface-side multilayer wiring section 91 is embedded in the second opening 62 and directly connected to the second silicide layer 92. Around the memory section 32, the second electrode 33, and the second back-surface-side multilayer wiring section 91, the back-surface interlayer film 70 is formed. The semiconductor device 1O illustrated in FIG. 97 is thus completed.

In this way, in the present embodiment, the second back-surface-side multilayer wiring section 91 is connected to the second electrode 33 of the resistance change element 30. Therefore, it is possible to route the second electrode 33 and the second back-surface-side multilayer wiring section 91 freely, by adjusting the number of laminated layers and a wiring layout of the second back-surface-side multilayer wiring section 91. Therefore, for example, intersection of wirings by formation of a multilayer may also become easy.

Sixteenth Embodiment

Figure 98:
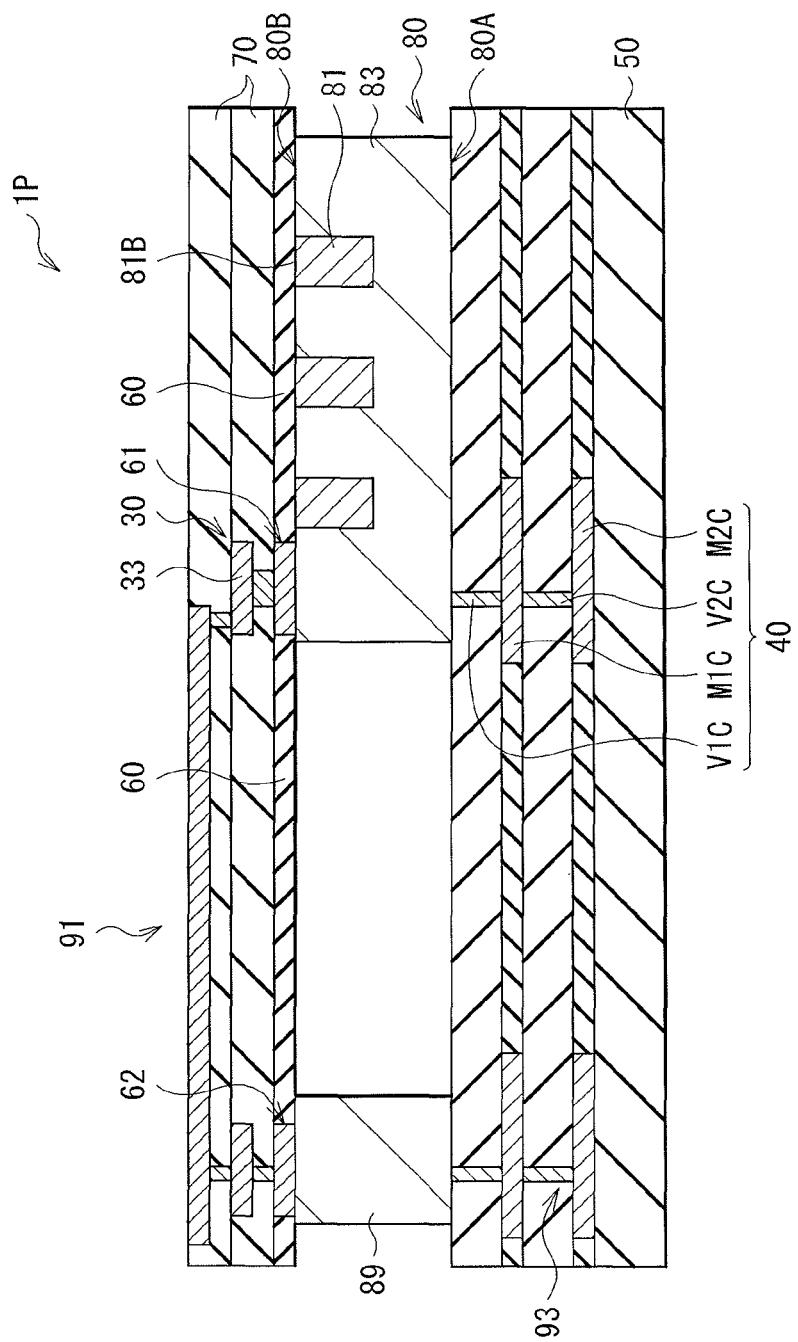
FIG. 98 is a cross-sectional diagram illustrating a configuration of a semiconductor device according to a sixteenth embodiment of the present disclosure.

FIG. 98 illustrates a cross-sectional configuration of a semiconductor device 1P according to the sixteenth embodiment of the present disclosure. Except that the transistor 80 made of a Fin FET similar to that of the fifth embodiment, the present embodiment has a configuration and functions similar to those of the fifteenth embodiment, and may be manufactured in a manner similar to that of the fifteenth embodiment.

In other words, the second electrode 33 of the resistance change element 30 is connected to a first end of the second back-surface-side multilayer wiring section 91 provided on the back-surface side of each of the fins 81. In the layer where the gate wiring 82, the source wiring 83, and the drain wiring 84 are provided, an auxiliary wiring 89 electrically insulated from these wirings is provided. The insulating film 60 is provided in contact with a back surface of the auxiliary wiring 89 and has the second opening 62 facing the auxiliary wiring 89. A second end of the second back-surface-side multilayer wiring section 91 is embedded in the second opening 62, and directly connected to the auxiliary wiring 89.

The semiconductor device 1M may be manufactured as follows, for example. It is to be noted that processes similar to those of the fifth embodiment will be described with reference to FIGS. 48 to 55.

First, in a manner similar to that of the fifth embodiment, the fins 81 extended in the first direction are formed by patterning the semiconductor substrate 12C of the SOI substrate 12, by the process illustrated in FIG. 48. Next, a not-illustrated metallic material film is formed on the fins 81 and the embedded oxide film 12B. Subsequently, the gate wiring 82, the source wiring 83, and the drain wiring 84 are formed to cover the surfaces of each of the fins 81 except the back surface 81B and to be extend in the second direction, by patterning this metallic material film. The transistor 80 is thus formed. In this process, in the layer where the gate wiring 82, the source wiring 83, and the drain wiring 84 are provided, the auxiliary wiring 89 electrically insulated from these wirings is provided.

Subsequently, in a manner similar to that of the fifth embodiment, the main-surface-side multilayer wiring section 40 to which the wirings M1C and M2C are connected by the vias V1C and V2C is formed on the main surface 80A side of the source wiring 83, by the process illustrated in FIG. 48. Further, the main-surface-side multilayer wiring section 40 to which the wirings M1A and M2A are connected by the vias V1A and V2A is formed on the main surface 80A side of the gate wiring 82, although this is not illustrated in FIG. 98. On the main surface 80A side of the drain wiring 84, the main-surface-side multilayer wiring section 40 to which wirings are connected by vias is also formed, although this is not illustrated in FIG. 98. In this process, the main-surface-side multilayer wiring section 93 is formed on the main surface 10A side of the auxiliary wiring 89.

Next, in a manner similar to that of the fifth embodiment, the transistor 80 is reversed, and the supporting substrate 50 is adhered on the main surface 80A side of the transistor 80 in a manner similar to that of the first embodiment, by the process illustrated in FIG. 49. At this moment, the transistor 80 and the wirings on the main surface 80A side are upside down.

Subsequently, in a manner similar to that of the fifth embodiment, the carrier substrate 12A is polished from the back-surface side by, for example, CMP, and this polishing is stopped upon reaching the embedded oxide film 12B, by the processes illustrated in FIGS. 49 and 50. The embedded oxide film 12B is then removed by the process illustrated in FIG. 51, in a manner similar to that of the fifth embodiment.

After the embedded oxide film 12B is removed, the insulating film 60 is formed, in a manner similar to that of the fifth embodiment, to be in contact with the back surface 81B of each of the fins 81, the back surface of each of the gate wiring 82, the source wiring 83, and the drain wiring 84, and the back surface of the auxiliary wiring 89, by the process illustrated in FIG. 52. Thus forming the insulating film 60 after removing the embedded oxide film 12B reduces the thickness of the insulating film 60, thereby allowing a further reduction in the connection resistance.

Subsequently, in a manner similar to that of the fifth embodiment, the first opening 61 is provided in the insulating film 60, to face the source wiring 83, by the process illustrated in FIG. 53. In this process, the second opening 62 is formed in the insulating film 60, to face the auxiliary wiring 89.

After the first opening 61 and the second opening 62 are provided in the insulating film 60, the first electrode 31 is embedded in the first opening 61, in a manner similar to that of the fifth embodiment, by the process illustrated in FIG. 54. Subsequently, in a manner similar to that of the fifth embodiment, the memory section 32 and the second electrode 33 are formed on the first electrode 31 by the process illustrated in FIG. 55, in a manner similar to that of the first embodiment. The resistance change element 30 directly connected to the source wiring 83 through the first opening 61 is thus formed.

Afterwards, the second back-surface-side multilayer wiring section 91 having the first end connected to the second electrode 33 is formed on the back surface 10B side of the semiconductor substrate 10, and the second end of the second back-surface-side multilayer wiring section 91 is embedded in the second opening 62 and directly connected to the auxiliary wiring 89. Around the memory section 32, the second electrode 33, and the second back-surface-side multilayer wiring section 91, the back-surface interlayer film 70 is formed. The semiconductor device 1P illustrated in FIG. 98 is thus completed.

Effects of the present embodiment are similar to those of the fifteenth embodiment.

Seventeenth Embodiment

Figure 99:
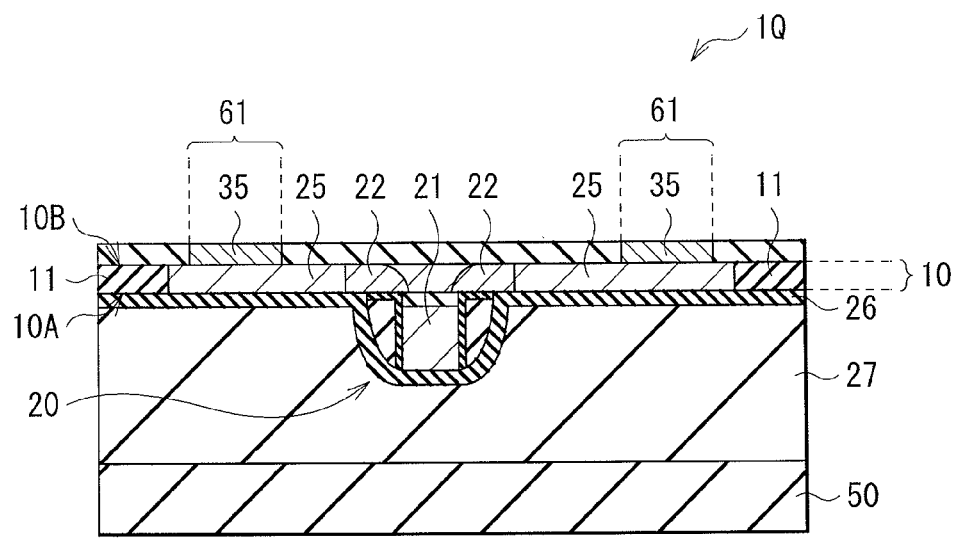
FIG. 99 is a cross-sectional diagram illustrating a configuration of a semiconductor device according to a seventeenth embodiment of the present disclosure.

FIG. 99 illustrates a cross-sectional configuration of a semiconductor device 1Q according to a seventeenth embodiment of the present disclosure. The semiconductor device 1Q includes the transistor 20 on the main surface 10A side of the semiconductor substrate 10, and the conductive connection section 35 on the back surface 10B side of the semiconductor substrate 10, without including the resistance change element 30. The conductive connection section 35 has a function as a back-surface contact electrode connected to the silicide layer 25 of the diffusion layer 22 becoming a source-drain region of the transistor 20. The conductive connection section 35 is connected to the silicide layer 25 through the opening 61 of the insulating film 60. Therefore, in the present embodiment, it is possible to obtain an effect of reducing connection resistance between the silicide layer 25 of the transistor 20 and the conductive connection section 35 (the back-surface contact electrode). Except this point, the semiconductor device 1Q of the present embodiment has a configuration and functions similar to those of the first embodiment, and may be manufactured in a manner similar to that of the first embodiment.

Eighteenth Embodiment

Figure 100:
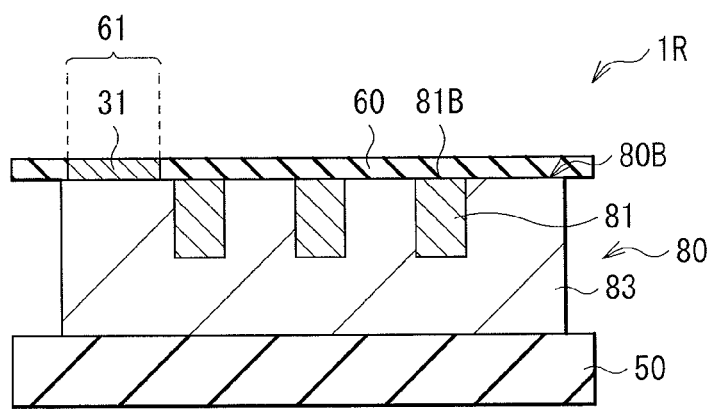
FIG. 100 is a cross-sectional diagram illustrating a configuration of a semiconductor device according to an eighteenth embodiment of the present disclosure.

FIG. 100 illustrates a cross-sectional configuration of a semiconductor device 1R according to an eighteenth embodiment of the present disclosure. The present embodiment is similar to the seventeenth embodiment, except that the transistor 80 made of a Fin FET is provided in place of the transistor 20. In other words, the semiconductor device 1R includes the transistor 80, and the conductive connection section 35 provided on the back surface 80B side of the transistor 80. The conductive connection section 35 is connected to the source wiring 83 (or the drain wiring 84) of the transistor 80 through the opening 61 of the insulating film 60. Therefore, in the present embodiment, it is possible to obtain an effect of reducing connection resistance between the source wiring 83 or the drain wiring 84 of the transistor 80 and the conductive connection section 35 (the back-surface contact electrode). Except this point, the semiconductor device 1R of the present embodiment has a configuration and functions similar to those of the first embodiment, and may be manufactured in a manner similar to that of the first embodiment.

Nineteenth Embodiment

Figure 101:
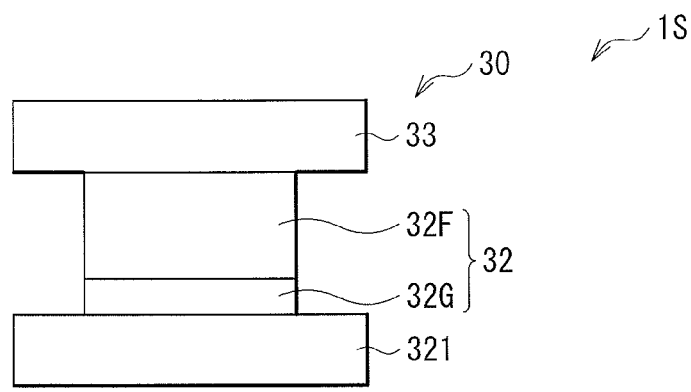
FIG. 101 is a cross-sectional diagram illustrating a configuration of a resistance change element, in a semiconductor device according to a nineteenth embodiment of the present disclosure.

FIG. 101 illustrates a cross-sectional configuration of a resistance change element 30 in a semiconductor device 1S according to a nineteenth embodiment of the present disclosure. In the present embodiment, the memory section 32 of the resistance change element 30 includes an ion source layer 32F and a resistance change layer 32G Except this point, the semiconductor device 1S of the present embodiment has a configuration and functions similar to those of the first embodiment, and may be manufactured in a manner similar to that of the first embodiment.

The ion source layer 32F and the resistance change layer 32G are included in the memory section 32 of the resistance change element 30. The ion source layer 32F includes, as an ion-conducting material to be converted into anions, one or more kinds of chalcogen elements among tellurium (Te), sulfur (S), and selenium (Se). The ion source layer 32F further includes zirconium (Zr) and/or copper (Cu) as a metallic element capable of being converted into cations, and includes aluminum (Al) and/or germanium (Ge) as an element forming an oxide at the time of erasing. Specifically, the ion source layer 32F may be configured using, for example, an ion-source-layer material of a composition such as ZrTeAl, ZrTeAlGe, CuZrTeAl, CuTeGe, and CuSiGe. It is to be noted that the ion source layer 32F may include other element exemplified by silicon (Si).

The resistance change layer 32G has a function of stabilizing information retention properties by serving as a barrier in electric conduction, and is configured using a material having a resistance value higher than that of the ion source layer 32F. Examples of the material of the resistance change layer 32G may preferably include oxides and nitrides including one or more kinds of Al, Mg (magnesium), Ta, Si (silicon), Cu, and a rare earth element such as Gd (gadolinium).

In the semiconductor device 1S, an electrical characteristic (a resistance value) of the memory section 32 changes by application of a voltage pulse or a current pulse from a not-illustrated power circuit (a pulse application means) through the first electrode 31 and the second electrode 33, so that information writing, erasing, and reading are performed. An ionic conduction mechanism and an oxygen deficiency conduction mechanism have been proposed as an operation principle of such a resistance-changing-type memory. This operation will be specifically described below.

First, a positive voltage may be applied to the resistance change element 30 having a high-resistance initial state, so that, for example, the second electrode 33 is at a positive potential, and the first electrode 31 side is at a negative potential. In response, a reduction occurs in the resistance change layer 32G formed at an interface of the first electrode 31, due to a cathode reaction on the first electrode 31 side. The cathode reaction is caused by migration of an ionized transition metal element in the ion source layer 32F to the first electrode 31 side, or migration of oxygen ions from the first electrode 31 side. As a result, a part in which an oxygen defect density is increased is generated. When these parts each having a high oxygen defect density or parts each having a low oxygen defect density are connected to each other, a conduction path is formed in the resistance change layer 32G, and the resistance change layer 32G has a lower resistance value (a low resistive state) than the resistance value in the initial state (a high resistive state).

Afterwards, the low resistive state is maintained even if the voltage applied to the resistance change element 30 is eliminated by removing the positive voltage. Information is thus written. When this is used in a memory device capable of writing only once, so-called programmable read only memory (PROM), recording is completed only by the above-described recording process.

On the other hand, in an application to a memory device capable of erasing, such as random access memory (RAM), and electronically erasable and programmable read only memory (EEPROM), an erasing process is necessary. In the erasing process, a negative voltage may be applied to the resistance change element 30, so that, for example, the second electrode 33 is at a negative potential and the first electrode 31 side is at a positive potential. In response, transition metal ions are oxidized and move to the ion source layer 32F side, due to an anordic reaction in a part having a high oxygen defect density or a part having a low oxygen defect density of a conduction path formed in the resistance change layer 32G. Alternatively, of a conduction path, an oxygen defect density is reduced or an oxidation state is increased, by migration of oxygen ions from the ion source layer 32F to a position in proximity to a conduction path of the resistance change layer 32G. As a result, the conduction path is broken, and the resistance value of the resistance change layer 32G changes from the low resistive state to the high resistive state.

Afterwards, the high resistance value is maintained even if the voltage applied to the resistance change element 30 is eliminated by removing the negative voltage. Written information is thus erased. Repeating such a process allows writing of information to the resistance change element 30 and erasing of written information to be repeated.

Assume that, in the resistance change element 30 as described above, a state in which the resistance value is high corresponds to information of "0", and a state in which the resistance value is low corresponds to information of "1". Then, it is possible to cause a change from "0" to "1" in the process of recording information by application of a positive voltage, and to cause a change from "1" to "0" in the process of erasing information by application of a negative voltage. It is to be noted that, here, the operation of causing the resistance change element 30 to have low resistance and the operation of causing the resistance change element 30 to have high resistance correspond to the writing operation and the erasing operation, respectively, but they may be reversed.

Figure 102:
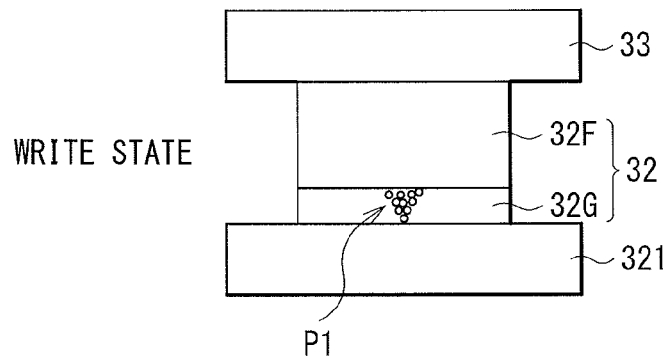
FIG. 102 is a diagram used to describe an example of a write state of the resistance change element illustrated in FIG. 101.
Figure 103:
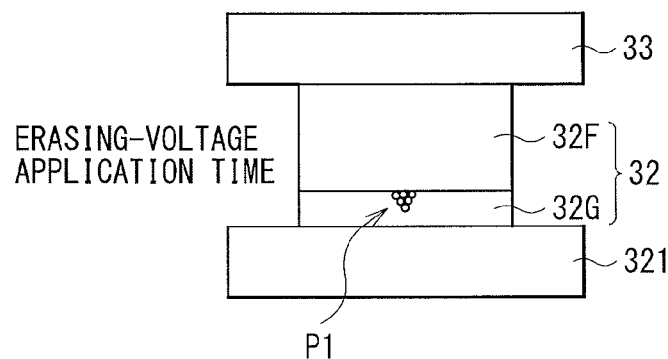
FIG. 103 is a diagram used to describe an example of an erasing-voltage application time of the resistance change element illustrated in FIG. 101.
Figure 104:
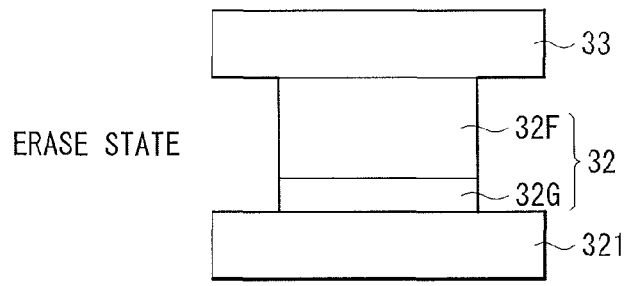
FIG. 104 is a diagram used to describe an example of an erase state of the resistance change element illustrated in FIG. 101.

FIGS. 102 to 104 schematically illustrate an example of a write state, an example of an erasing-voltage application time, and an example of an erase state, of the resistance change element 30, respectively. In the write state, the ion source layer 32F and the first electrode 31 are connected by a conduction path P1 formed in the resistance change layer 32G, and the resistance change layer 32G is in the low resistive state. In these examples, the conduction path P1 has a shape protruding from the ion source layer 32F towards the resistance change layer 32G. In the erasing-voltage application time, atoms included in the conduction path P1 ionize and return to the ion source layer 32F. As a result, the conduction path P1 dissipates towards the ion source layer 32F. In the erase state, the conduction path P1 disappears and the resistance change layer 32G is in the high resistive state.

Figure 105:
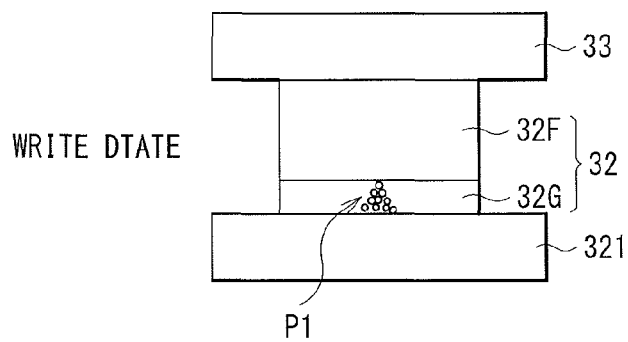
FIG. 105 is a diagram used to describe another example of the write state of the resistance change element illustrated in FIG. 101.
Figure 106:
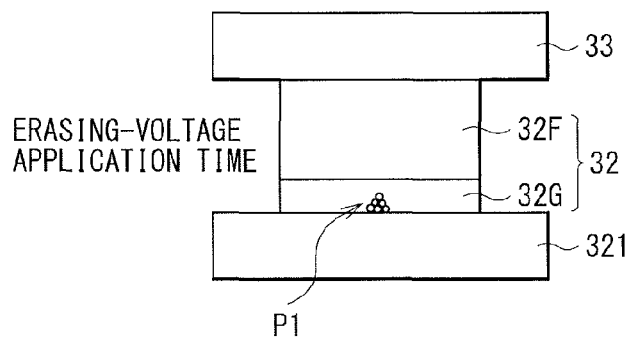
FIG. 106 is a diagram used to describe another example of the erasing-voltage application time of the resistance change element illustrated in FIG. 101.
Figure 107:
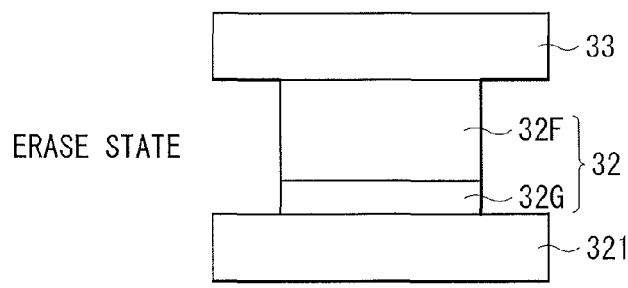
FIG. 107 is a diagram used to describe another example of the erase state of the resistance change element illustrated in FIG. 101.

FIGS. 105 to 107 schematically illustrate another example of the write state, another example of the erasing-voltage application time, and another example of the erase state, of the resistance change element 30, respectively. These examples are similar to the above-described examples, except that a conduction path P2 has a shape protruding from the resistance change layer 32G towards the ion source layer 32F.

The present disclosure has been described above with reference to some embodiments, but is not limited thereto and may be variously modified.

For example, the embodiments have been each described using of the configurations of the transistors 20 and 80 as well as the resistance change element 30 as specific examples. However, it is not necessary to provide all components, and other component may be further provided In addition, for example, each component of the above-described embodiments is not limited to the material, thickness, and formation method described above, and other material, thickness, and formation method may be adopted.

It is possible to achieve at least the following configurations from the above-described example embodiments of the disclosure.

(1) A semiconductor device including:
  a transistor on a main surface side of a semiconductor substrate; and
  a resistance change element on a back-surface side of the semiconductor substrate,
  wherein the transistor includes a low-resistance section in the semiconductor substrate, the low-resistance section extending to the back surface of the semiconductor substrate,
  an insulating film is provided in contact with a back surface of the low-resistance section,
  the insulating film has an opening facing the low-resistance section, and
  the resistance change element is connected to the low-resistance section through the opening.
(2) The semiconductor device according to (1), wherein
  the resistance change element includes a first electrode, a memory section, and a second electrode in this order from a side close to the back surface of the semiconductor substrate, and
  the first electrode is embedded in the opening, and connected to the low-resistance section.
(3) The semiconductor device according to (1), wherein
  the resistance change element includes a memory section and a second electrode in this order from a side close to the back surface of the semiconductor substrate, and
  the memory section is embedded in the opening, and connected to the low-resistance section.
(4) The semiconductor device according to (1), wherein
  the resistance change element includes a first electrode, a memory section, and a second electrode in this order from a side close to the back surface of the semiconductor substrate, and
  the first electrode is connected to the low-resistance section by a conductive connection section embedded in the opening.
(5) The semiconductor device according to any one of (1) to (4), wherein
  the transistor includes a pair of diffusion layers,
  one of the pair of diffusion layers is connected to a first wiring,
  the other of the pair of diffusion layers is connected to a second wiring through the resistance change element,
  the first wiring is provided on the main surface side of the semiconductor substrate, and
  the second wiring is provided on the back-surface side of the semiconductor substrate.
(6) The semiconductor device according to (5), wherein the first wiring and the second wiring are laid to overlap each other, with the semiconductor substrate interposed therebetween, in a direction in which the first wiring and the second wiring are laminated.
(7) The semiconductor device according to any one of (1) to (6), wherein
  the resistance change element includes a first electrode, a memory section, and a second electrode in this order from a side close to the back surface of the semiconductor substrate,
  the second electrode is connected to a first end of a back-surface-side multilayer wiring section provided on the back-surface side of the semiconductor substrate,
  another low-resistance section is provided in the semiconductor substrate, the another low-resistance section being electrically insulated from the low-resistance section and extended to the back surface of the semiconductor substrate,
  the insulating film is provided in contact with a back surface of the another low-resistance section, and has another opening facing the another low-resistance section, and
  a second end of the back-surface-side multilayer wiring section is embedded in the another opening, and connected to the another low-resistance section.
(8) The semiconductor device according to any one of (1) to (7), wherein the resistance change element is a spin transfer torque-magnetic tunnel junction.
(9) The semiconductor device according to any one of (1) to (7), wherein
  the resistance change element includes an ion source layer and a resistance change layer, as a memory section,
  the ion source layer includes an ionizable metallic element, and one or more chalcogen elements among tellurium (Te), sulfur (S), and selenium (Se), and
  the resistance change layer is configured using a material having a resistance value higher than a resistance value of the ion source layer.
(10) A semiconductor device including:
  a transistor; and
  a resistance change element provided on a back-surface side of the transistor,
  wherein the transistor includes a fin and a metal wiring, the fin being extended in a first direction, and the metal wiring covering a surface except a back surface of the fin and being extended in a second direction different from the first direction,
  an insulating film is provided in contact with a back surface of the metal wiring,
  the insulating film has an opening facing the metal wiring, and
  the resistance change element is connected to the metal wiring through the opening.
(11) A semiconductor device including:
  a transistor on a main surface side of a semiconductor substrate; and
  a conductive connection section on a back-surface side of the semiconductor substrate, wherein the transistor includes a low-resistance section in the semiconductor substrate, the low-resistance section extending to the back surface of the semiconductor substrate, an insulating film is provided in contact with a back surface of the low-resistance section, the insulating film has an opening facing the low-resistance section, and the conductive connection section is connected to the low-resistance section through the opening.

(12) A semiconductor device including:

a transistor; and a conductive connection section provided on a back-surface side of the transistor, wherein the transistor includes a fin extended in a first direction, and a metal wiring extended in a second direction different from the first direction, the metal wiring covering a surface except a back surface of the fin, an insulating film is provided in contact with a back surface of the metal wiring, the insulating film has an opening facing the metal wiring, and the conductive connection section is connected to the metal wiring through the opening.

(13) A method of manufacturing a semiconductor device, the method including:

forming a transistor on a main surface side of a semiconductor substrate, and forming, in the semiconductor substrate, a low-resistance section of the transistor;

polishing the semiconductor substrate from a back-surface side, and stopping the polishing at the low-resistance section;

forming an insulating film to be in contact with a back surface of the low-resistance section;

providing an opening in the insulating film, to face the low-resistance section; and forming a resistance change element to be connected to the low-resistance section through the opening.

(14) The method of manufacturing the semiconductor device according (13), wherein in the forming the transistor, an SOI substrate including an embedded oxide film and the semiconductor substrate on one surface side of a carrier substrate is used, the transistor is formed on the main surface side of the semiconductor substrate, and the low-resistance section of the transistor is formed in the semiconductor substrate, and in the polishing, the carrier substrate is polished from a back-surface side, and the polishing is stopped at the embedded oxide film.

(15) The method of manufacturing the semiconductor device according to (14), wherein in the forming the insulating film, the embedded oxide film is used as the insulating film, or the insulating film is formed to be in contact with the back surface of the low-resistance section after the embedded oxide film is removed.

(16) The method of manufacturing the semiconductor device according to any one of (13) to (15), wherein in the forming the low-resistance section, another low-resistance section electrically insulated from the low-resistance section is formed in the semiconductor substrate, in the polishing of the semiconductor substrate from the back-surface side, the polishing is stopped at the low-resistance section and the another low-resistance section, in the forming the insulating film, the insulating film is formed to be in contact with the back surface of the low-resistance section and a back surface of the another low-resistance section, in the providing the opening in the insulating film, another opening is provided in the insulating film, to face the another low-resistance section, and in the forming the resistance change element, after a first electrode, a memory section, and a second electrode are formed in this order from a side close to the back face of the semiconductor substrate, a back-surface-side multilayer wiring section having a first end connected to the second electrode is formed on the back surface of the semiconductor substrate, and a second end of the back-surface-side multilayer wiring section is embedded in the another opening and connected to the another low-resistance section.

(17) A method of manufacturing a semiconductor device, the method including:

forming a transistor on a main surface side of a semiconductor substrate, the transistor including a fin and a metal wiring, the fin being extended in a first direction, the metal wiring covering a surface except a back surface of the fin and being extended in a second direction different from the first direction;

polishing the semiconductor substrate from a back-surface side;

forming an insulating film to be in contact with a back surface of the metal wiring;

providing an opening in the insulating film, to face the metal wiring; and forming a resistance change element to be connected to the metal wiring through the opening.

(18) The method of manufacturing the semiconductor device according to (17), further including, between the forming the insulating film and the providing the opening, forming a fourth gate electrode at a position facing the fin, with the insulating film interposed therebetween.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device comprising:
a substrate;
a resistance change element;
a wiring section between the substrate and the resistance change element;
an insulating layer between the resistance change element and the wiring section; and
a fin field effect transistor (finFET) with at least one fin, the finFET being between the insulating layer and the wiring section,
wherein,
the finFET is electrically connected to the resistance change element and the wiring layer.

2. The semiconductor device of claim 1, wherein the finFET has a plurality of fins.

3. The semiconductor device of claim 2, wherein the finFET is a compound semiconductor finFET.

4. The semiconductor device of claim 1, wherein the resistance change element includes a resistance change layer electrically between a first electrode and source wiring or drain wiring of the finFET.

5. The semiconductor device of claim 4, wherein the resistance change layer is between the first electrode and a second electrode, with the second electrode electrically between the resistance change layer and the source wiring or drain wiring of the finFET.

6. The semiconductor device of claim 4, wherein the resistance change element is in contact with the source wiring or the drain wiring.

7. The semiconductor device of claim 5, wherein the second electrode is in contact with the source wiring or drain wiring.

8. The semiconductor device of claim 5, wherein the second electrode extends through the insulating layer.

9. The semiconductor device of claim 5, wherein the second electrode extends to a surface of the insulating layer adjacent the source wiring or drain wiring.

10. The semiconductor device of claim 1, wherein the wiring section includes plural wiring layers.

11. The semiconductor device of claim 1, wherein the finFET has source wiring, drain wiring, and gate wiring between a channel region and the wiring section.

12. The semiconductor device of claim 5, wherein the second electrode is electrically connected to the finFET.

13. The semiconductor device of claim 1, wherein the resistance change element is a spin transfer torque-magnetic tunnel junction.

14. The semiconductor device of claim 4, wherein the finFET is a p-type finFET and the resistance change element is electrically connected to the source wiring of the finFET.

15. The semiconductor device of claim 1, wherein:
the resistance change element includes an ion source layer and a resistance change layer forming a memory section,
the ion source layer of the resistance change element includes an ionizable metallic element and one or more chalcogen elements selected from the group consisting of (Te), sulfur (S), and selenium (Se), and
the resistance change layer comprises a material having a resistance value higher than a resistance value of the ion source layer.

16. The semiconductor device of claim 4, wherein the finFET is an n-type finFET and the resistance change element is electrically connected to the drain wiring of the finFET.

* * * * *